US009905756B2

(12) United States Patent
Sasago et al.

(10) Patent No.: US 9,905,756 B2
(45) Date of Patent: Feb. 27, 2018

(54) SEMICONDUCTOR STORAGE DEVICE

(71) Applicant: HITACHI, LTD., Chiyoda-ku, Tokyo (JP)

(72) Inventors: Yoshitaka Sasago, Tokyo (JP); Kenzo Kurotsuchi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/115,966

(22) PCT Filed: Feb. 3, 2014

(86) PCT No.: PCT/JP2014/052393
§ 371 (c)(1),
(2) Date: Aug. 2, 2016

(87) PCT Pub. No.: WO2015/114825
PCT Pub. Date: Aug. 6, 2015

(65) Prior Publication Data
US 2017/0054074 A1  Feb. 23, 2017

(51) Int. Cl.
*H01L 27/24* (2006.01)
*H01L 45/00* (2006.01)
*H01L 21/02* (2006.01)
*G11C 13/00* (2006.01)

(52) U.S. Cl.
CPC .......... *H01L 45/06* (2013.01); *G11C 13/003* (2013.01); *H01L 27/249* (2013.01);
(Continued)

(58) Field of Classification Search
CPC ....... H01L 45/06; H01L 45/16; H01L 45/122; H01L 45/1226; H01L 45/1233;
(Continued)

(56) References Cited

U.S. PATENT DOCUMENTS 8,634,257 B2 * 1/2014 Hanzawa ........... G11C 13/0004
365/148
8,830,740 B2 * 9/2014 Sasago ............... G11C 13/0004
257/2
(Continued)

FOREIGN PATENT DOCUMENTS

JP   2005-166210 A   6/2005
JP   2005-260014 A   9/2005
(Continued)

OTHER PUBLICATIONS

Office Action dated Feb. 28, 2017 for related Japanese Application No. 2015-559712.

*Primary Examiner* — Dao H Nguyen
(74) *Attorney, Agent, or Firm* — Miles & Stockbridge P.C.

(57) ABSTRACT

In a semiconductor storage device that is formed on a semiconductor substrate, flows a current to a recording material formed between electrodes to change a resistance value of the recording material and store information, and flows currents of different magnitudes in a high resistance change operation and a low resistance change operation, electrodes of a plurality of memory cells are electrically connected directly or via transistors to form large electrodes, the large electrodes are connected to a feeding terminal from a power source circuit, and the large electrodes are connected to large electrodes connected to a feeding terminal from a power source connected between a plurality of memory cells different from the plurality of memory cells via inter-large electrode connection transistors. By using the semiconductor storage device, a connection pattern of a feeding electrode for the memory cells can be configured according to the magnitude of a consumption current, power consumption by a voltage drop by a parasitic resistance of the feeding electrode and power consumption by charge/
(Continued)

discharge of a parasitic capacitance around the feeding electrode can be suppressed, and performance per consumption power in read/set/reset operations can be improved.

15 Claims, 37 Drawing Sheets

(52) U.S. Cl.
CPC ...... *H01L 27/2409* (2013.01); *H01L 27/2454* (2013.01); *H01L 27/2481* (2013.01); *H01L 45/1226* (2013.01); *H01L 45/1233* (2013.01); *H01L 45/16* (2013.01); *G11C 13/0004* (2013.01); *G11C 2213/71* (2013.01); *G11C 2213/75* (2013.01); *G11C 2213/79* (2013.01)

(58) Field of Classification Search
CPC ............. H01L 27/2454; H01L 27/2409; H01L 27/2481; H01L 27/249; G11C 13/0004; G11C 13/003
USPC .......... 257/2, 3, 4, 5, 95, 97, 421, 530, 536, 257/E27.004, E27.081, E45.001, E45.002, 257/E21.002, E21.294, E21.645; 365/149, 163, 189.14; 438/128, 129, 192, 438/266, 382
See application file for complete search history.

(56) References Cited

U.S. PATENT DOCUMENTS

| | | | |
|---|---|---|---|
| 8,866,123 B2* | 10/2014 | Sasago | ........... H01L 27/2481 257/2 |
| 8,883,569 B2* | 11/2014 | Scheuerlein | ....... G11C 13/0002 438/128 |
| 2005/0128799 A1 | 6/2005 | Kurotsuchi et al. | |
| 2005/0201182 A1 | 9/2005 | Osada et al. | |
| 2008/0149913 A1 | 6/2008 | Tanaka et al. | |
| 2010/0182828 A1 | 7/2010 | Shima et al. | |
| 2011/0013458 A1 | 1/2011 | Seol | |
| 2011/0235393 A1 | 9/2011 | Yoshihara et al. | |
| 2011/0284817 A1* | 11/2011 | Sasago | ................ H01L 27/1021 257/5 |
| 2012/0087178 A1 | 4/2012 | Watanabe et al. | |
| 2012/0211721 A1 | 8/2012 | Kawai | |
| 2012/0248399 A1* | 10/2012 | Sasago | ................ H01L 27/2409 257/4 |
| 2012/0287697 A1 | 11/2012 | Hanzawa et al. | |
| 2013/0141968 A1 | 6/2013 | Sasago et al. | |
| 2013/0234101 A1 | 9/2013 | Sasago et al. | |
| 2014/0003149 A1 | 1/2014 | Maejima | |
| 2014/0218999 A1 | 8/2014 | Sasago et al. | |
| 2015/0155479 A1 | 6/2015 | Sasago | |

FOREIGN PATENT DOCUMENTS

| | | |
|---|---|---|
| JP | 2008-160004 A | 7/2008 |
| JP | 2010-165982 A | 7/2010 |
| JP | 2011-023103 A | 2/2011 |
| JP | 2011-204340 A | 10/2011 |
| JP | 2012-084676 A | 4/2012 |
| JP | 2012-174953 A | 9/2012 |
| JP | 2012-238348 A | 12/2012 |
| JP | 2014-011192 A | 1/2014 |
| WO | WO 2012/032730 A1 | 3/2012 |
| WO | 2012/070096 A1 | 5/2012 |
| WO | WO 2012/168981 A1 | 12/2012 |
| WO | 2013/183101 A1 | 1/2016 |

\* cited by examiner

Reading operation

Reset operation

Reading operation

FORMATION OF GATE ELECTRODE

BEPLATE (floating/VSET/VRESET)    READ/SET/RESET operations

READ/SET/RESET operations

FIG. 37
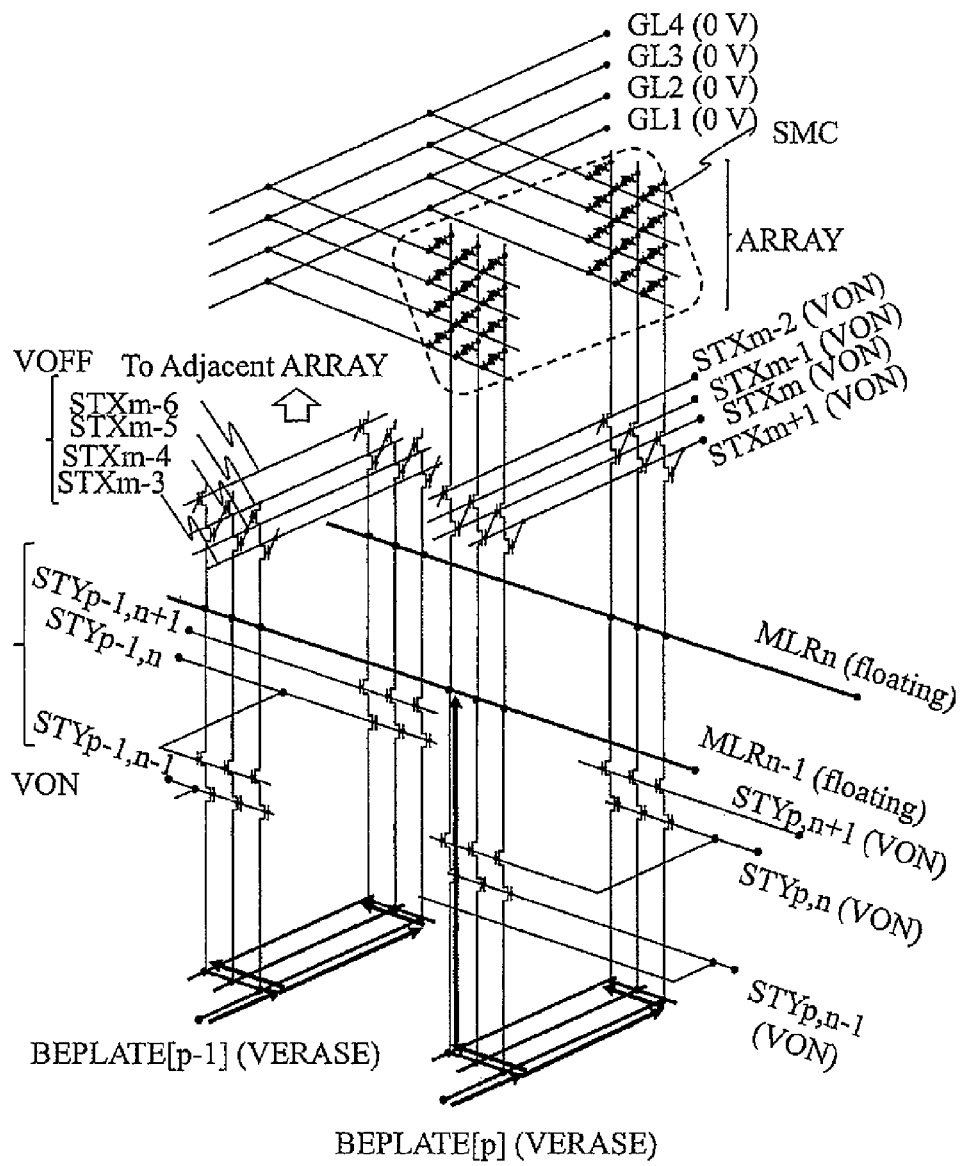
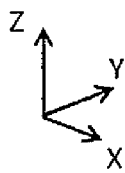
Bundle erase operations

SEMICONDUCTOR STORAGE DEVICE

TECHNICAL FIELD

The present invention relates to a semiconductor storage device.

BACKGROUND ART

Recently, a phase change memory using chalcogenide materials as recording materials is studied actively. The phase change memory is a type of resistance change memory that stores information using that recording materials between electrodes have different resistance states.

The phase change memory stores information using that a resistance value of a phase change material such as $Ge_2Sb_2Te_5$ is different in an amorphous state and a crystalline state. In the amorphous state, a resistance is high and in the crystalline state, the resistance is low. Therefore, information read from a memory cell is executed by applying a potential difference to both ends of an element, measuring a current flowing through the element, and determining a high resistance state/low resistance state of the element.

In the phase change memory, data is rewritten by changing an electrical resistance of a phase change film to a different state by a Joule heat generated by the current. A reset operation, that is, an operation for changing a state to the amorphous state of the high resistance is executed by flowing a large current for a short time, melting a phase change material, and decreasing the current rapidly for rapid cooling. Meanwhile, a set operation, that is, an operation for changing a state to the crystalline state of the low resistance is executed by flowing a current sufficient for maintaining the phase change material at a crystallization temperature for a long time. In the phase change memory, if miniaturization advances, a current necessary for changing a state of the phase change film decreases. For this reason, the phase change memory is miniaturized in principle. Therefore, a study is performed actively.

In PTL 1 described below, a configuration in which a plurality of through-holes penetrating entire layers are formed by collective processing in a lamination structure where a plurality of gate electrode materials and a plurality of insulating films are alternately laminated and a gate insulating film, a channel layer, and a phase change film are formed in the through-holes and are processed is disclosed as a method of highly integrating a phase change memory. Each memory cell includes a cell transistor and a phase change element that are connected in parallel and a plurality of memory cells are connected in series in a longitudinal direction, that is, a normal direction to a semiconductor substrate and form phase change memory chains. In a memory array configuration of PTL 1, each phase change memory chain is selected by a vertical selection transistor.

The phase change memory executes the reset/set/read operations by flowing a current to the memory cell. However, the magnitude of the flown current and an operation time are different in the three operations. A current necessary for the set operation is smaller than a current necessary for the reset operation. However, because the operation time of the set operation is long, an erasable cell number per unit time in the set operation is smaller than an erasable cell number per unit time in the reset operation. As a result, the throughput per consumption power decreases. To resolve such a problem, technology for flowing the current to adjacent memory cells at the same time, exchanging a Joule heat, and enabling the set operation for a large amount of memory cells unit per consumption power and per unit time is disclosed in PTL 2.

In the phase change memory, when the reset operation and the set operation are executed, it is necessary to flow a large current to the memory cells as compared with the read operation. Suppression of a voltage drop in an electrode wiring line for feeding the memory cells and securing of a drive current of a transistor or a selection transistor of a driver circuit may become a problem. With regard to an electrode for feeding, an electrode wiring line extending over the plurality of memory cells in a longitudinal direction, with a width almost equal to the magnitude of the memory cell, is used in PTL 1. Meanwhile, technology for providing the electrode wiring line for the feeding in a plate shape is disclosed in PTL 3.

In PTL 4, a configuration in which wiring lines (bit lines) for feeding the memory cells are connected to two power sources via separate transistors is disclosed. At the time of the set operation in which the operation is enabled with a small current as compared with the reset operation, only one power source is connected to a bit line by turning on the transistor and a sufficient current necessary for the set operation is flown to the memory cells. At the time of the reset operation, both the two transistors connecting the power sources and the bit lines are turned on and a large current necessary for the reset operation is flown to the memory cells.

In addition, technology for forming a selection transistor on a phase change memory chain is disclosed in PTL 5.

CITATION LIST

Patent Literature

PTL 1: JP-2008-160004-A
PTL 2: WO2012/032730
PTL 3: WO2012/168981
PTL 4: JP-2005-166210-A
PTL 5: JP-2010-165982-A

SUMMARY OF INVENTION

Technical Problem

However, in the phase change memory according to the related art, the electrode wiring line for feeding the memory is not configured ideally with respect to all operations of the reset/set/read operations in which the current values are different. For example, the configuration of PTL 1 in which, in the read operation in which each memory cell can be operated with a small current, the electrode wiring line is divided at about the pitch of the memory cells to independently operate the memory cells as many as possible and a high-density electrode wiring line is formed is appropriate. However, in the case of the reset operation, because it is necessary to flow a large current to one memory cell, the electrode wiring line having the large width disclosed in PTL 3, particularly, a plate-like electrode is appropriate to suppress the voltage drop in the electrode wiring line. As disclosed in PTL 2, when a current is simultaneously flown to the plurality of memory cells and the set operation is executed, a consumption current per memory cell is small. However, because the current is simultaneously flown to the large amount of memory cells, the current flowing to the electrode wiring line is larger than a current in the case of the reset operation and the voltage drop in the electrode wiring line increases.

The present invention has been made in view of the above problems. That is, a first object of the present invention is to realize a high-density electrode wiring line necessary for improving read throughput performance, an electrode wiring line necessary for a reset operation and having a low resistance and a large width, and an electrode wiring line necessary for a collective set operation in which a large current flows as compared with the reset operation and having an extremely low resistance, reduce power consumption by a voltage drop, and improve performances of all of the read/reset/set operations. Particularly, the first object is to improve performance per consumption power.

Meanwhile, the resistance of the electrode wiring line is decreased by using the electrode wiring line having the large width. However, because the electrode wiring line faces a gate and a metal wiring line around the electrode wiring line with an area proportional to the large width, a parasitic capacitance increases. When a voltage pulse is applied to the electrode wiring line to flow the current to the memory cell, the parasitic capacitance is charged/discharged and energy is consumed. If the parasitic capacitance excessively increases, the energy is consumed by the charge/discharge of the parasitic capacitance and the energy supplied to the memory cell when the reset operation and the set operation are executed decreases. For this reason, performance is deteriorated. Therefore, a second object of the present invention is to reduce a parasitic capacitance charged at the time of a reset operation and a set operation, reduce consumption energy, and improve performances of the reset operation and the set operation per consumption power.

Solution to Problem

To achieve the above objects, the present invention adopts configurations described in claims.

The present invention includes a plurality of means to solve the above issue, and an example thereof is a semiconductor storage device that is formed on a semiconductor substrate, flows a current to a recording material formed between electrodes to change a resistance value of the recording material and store information, and flows currents of different magnitudes in a high resistance change operation and a low resistance change operation, wherein electrodes of a plurality of memory cells are electrically connected directly or via transistors to form large electrodes, the large electrodes are connected to a feeding terminal from a power source circuit, and the large electrodes are connected to large electrodes connected to a feeding terminal of a power source connected between a plurality of memory cells different from the plurality of memory cells via inter-large electrode connection transistors.

In the semiconductor storage device according to the present invention, a plurality of memory cells arranged in first and second directions are connected by a plurality of electrode wiring lines via selection devices such as transistors or diodes and the plurality of electrode wiring lines are connected to the plurality of memory cells via the selection devices in at least one direction of the first and second directions. The plurality of electrode wiring lines are connected via the transistors or the transistors and metal electrodes. The connected electrode wiring lines can be regarded as one electrode and the electrode wiring lines can be further connected. By using such an electrode wiring line structure, at the time of an operation (for example, a read operation) in which a current is small, electrodes are separated by the transistors and are used independently, so that access is enabled in parallel to multiple memory cells, that is, the access is simultaneously and independently enabled on the multiple memory cells. In an operation (for example, a reset operation) in which a current is large, the electrode wiring lines are connected and a resistance of the electrode wiring lines is decreased, so that a voltage drop in the electrode wiring lines, that is, energy consumption can be reduced, and high performance can be realized. In addition, in an operation (for example, a collective set operation) in which a current is large, the connected electrode wiring lines are further connected and the resistance of the electrode wiring lines is further decreased, so that consumption energy by the voltage drop is reduced, and high performance can be realized.

Reduction of consumption energy by charge/discharge of a parasitic capacitance at the time of the reset operation and the set operation can be realized by separating a portion not becoming a path of the reset current and the set current, that is, a portion not contributing to reduction of the resistance of the electrode wiring lines by the transistors and preventing the charge/discharge.

Advantageous Effects of Invention

According to a semiconductor storage device according to the present invention, an appropriate memory cell array can be manufactured by increasing a density and speeding up write/erasure/read operations. In addition, the semiconductor storage device is applied to an information processing device such as a storage and a server, so that the information processing device can use a storage device having a low cost and high performance, and cost reduction and performance improvement can be realized.

BRIEF DESCRIPTION OF DRAWINGS

FIG. 34 ($b$) is a partial cross-sectional view of the memory array according to the third embodiment of the present invention.

FIG. 37 is an equivalent circuit diagram illustrating a bundle erasure operation of the memory cell array according to the third embodiment of the present invention.

DESCRIPTION OF EMBODIMENTS

Figure 1:
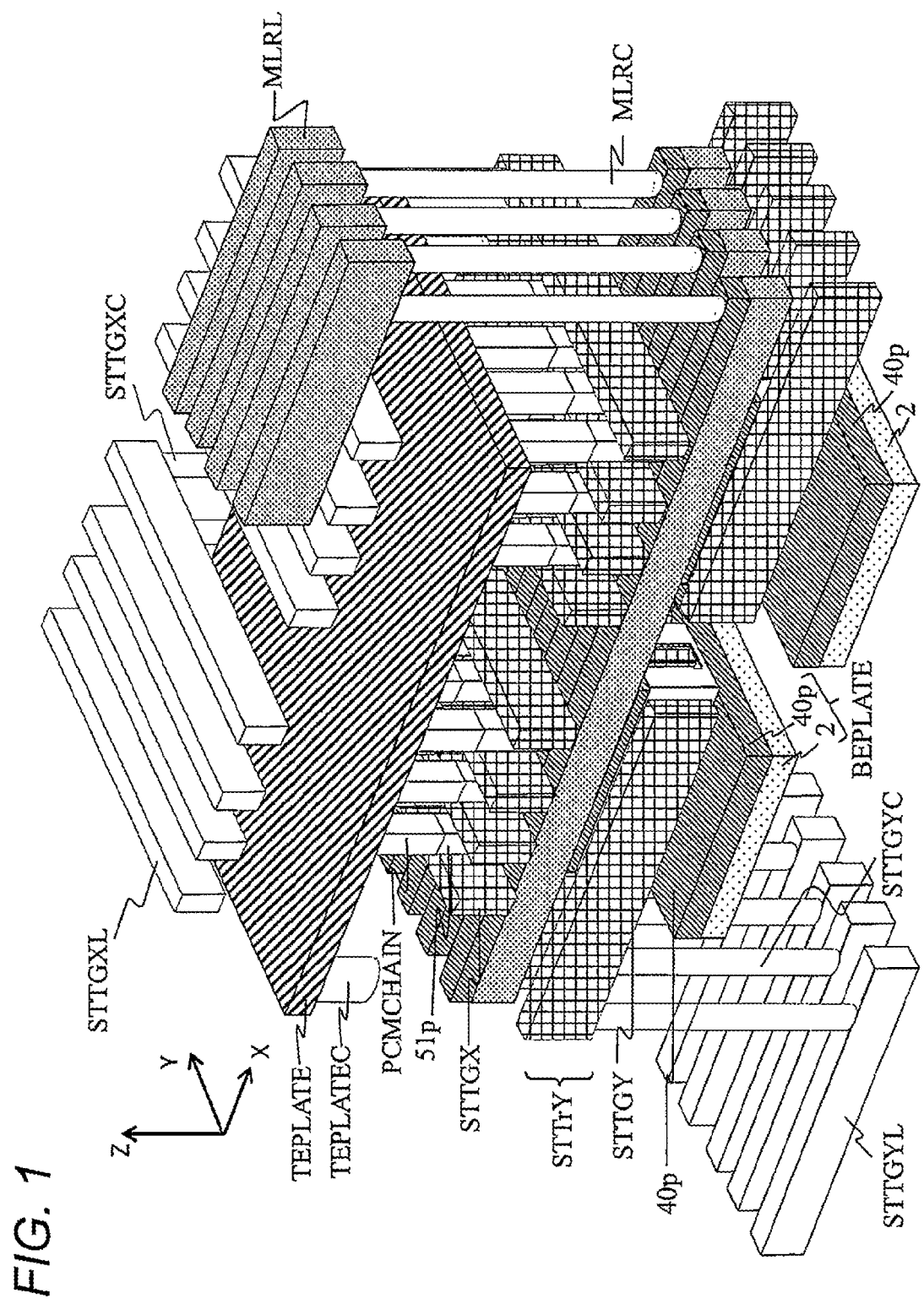
FIG. 1 is a partial three-dimensional schematic diagram of a semiconductor storage device according to a first embodiment of the present invention.

Hereinafter, embodiments of the present invention will be described in detail on the basis of the drawings. Throughout all diagrams to describe the embodiments, members having the same functions are denoted with the same reference numerals and repetitive description thereof is omitted. In addition, it is previously said that places describing characteristic configurations are not limited to the individual embodiments and the same effect is obtained when a common configuration is taken.

First Embodiment

FIG. 1 is a three-dimensional schematic diagram illustrating a configuration of a portion including a memory cell array (ARRAY) unit of a semiconductor storage device according to a first embodiment of the present invention. Plate-like electrodes TEPLATE and BEPLATE, electrodes 3 extending in an X direction, phase change memory chain cells PCMCHAIN, X selection transistors STTrX extending in a Y direction and realizing selection of PCMCHAIN of the X direction, and X selection transistors STTrY extending in the X direction and realizing selection of PCMCHAIN of the Y direction in a set operation and a reset operation are illustrated. In addition, gates of STTrX and STTrY are STTGX and STTGY, respectively. In FIG. 1, TEPLATEC to connect TEPLATE and a circuit on a semiconductor substrate, contacts STTGXC reaching STTGX, wiring lines STTGXL to feed STTGX via STTGXC, contacts STTGYC reaching STTGY, and wiring lines STTGYL to feed STTGY via STTGYC are further illustrated. In FIG. 1, a place where BEPLATE is separated in the X direction is illustrated. BEPLATE extends in the Y direction and is connected to the circuit on the semiconductor substrate by BEPLATEC at a leading end of an extension direction, although not illustrated in FIG. 1. Although not illustrated in FIG. 1, STTGYL is connected to the circuit on the semiconductor substrate by STTYC and STTGXL is connected to the circuit on the semiconductor substrate by STTXC, so that appropriate potentials can be fed. If attention is paid to elevations of STTGXL and STTGXY, the contact STTGYC is formed from a lower side with respect to STTGY extending in parallel below MLR and is connected to STTGYL. Meanwhile, the contact STTGXC is formed with respect to STTGX formed to be orthogonal to MLR on MLR and is connected to STTGXL. MLR is connected to MLRL via MLRC and MLRL is connected to a sense amplifier (Sense amp.) via a transistor.

Figure 2A:
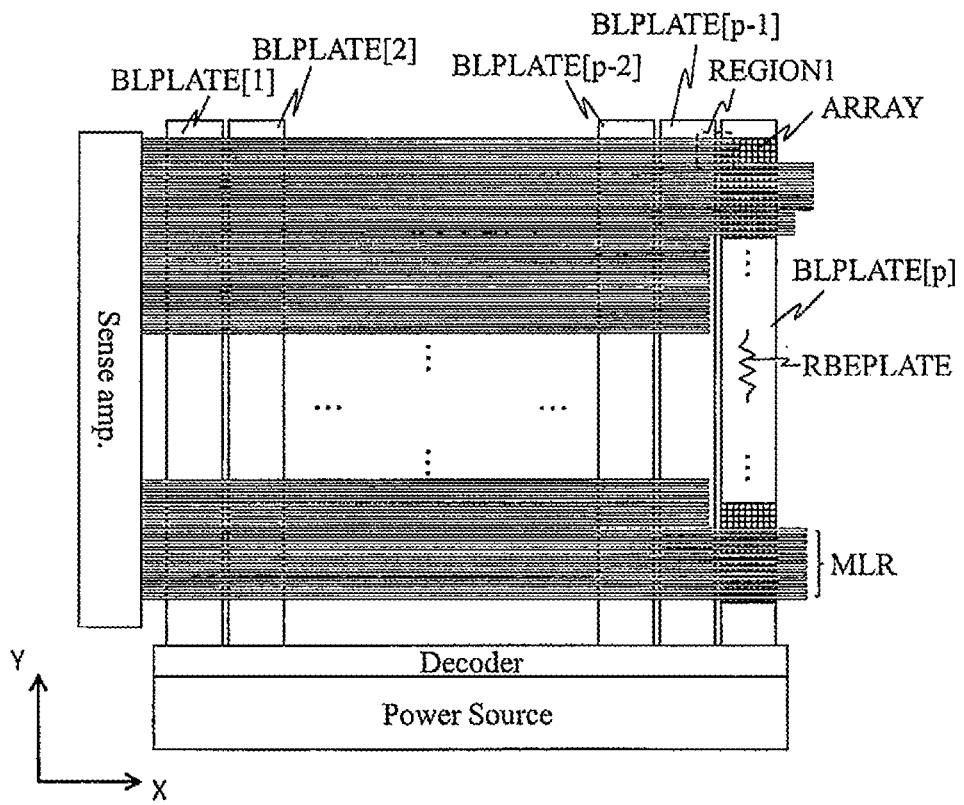
FIG. 2(a) is a partial plan view of the semiconductor storage device according to the first embodiment of the present invention.
Figure 2B:
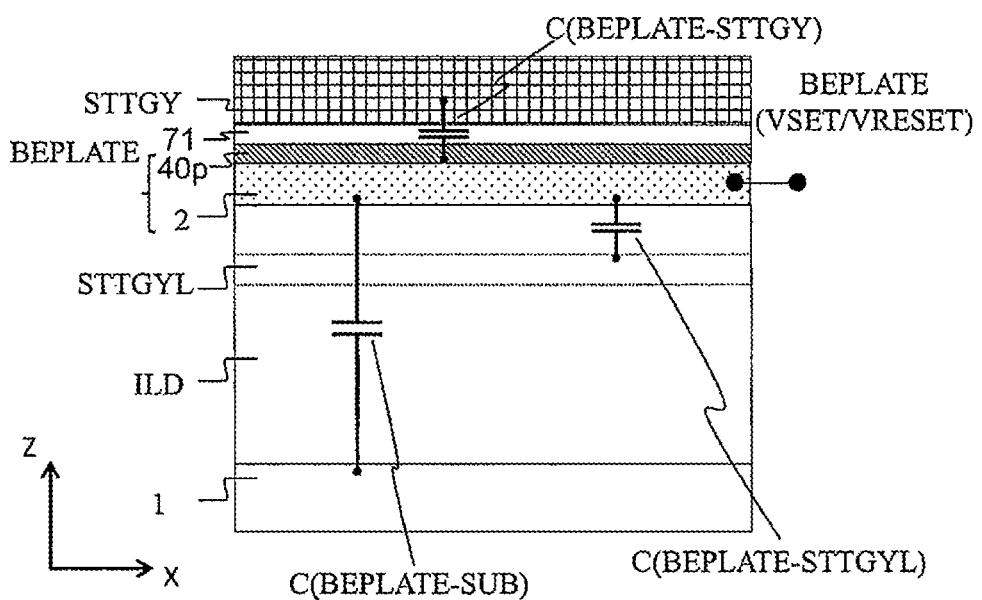
FIG. 2(b) is a partial cross-sectional view of the semiconductor storage device according to the first embodiment of the present invention.

FIG. 2(a) is a partial plan view of the semiconductor storage device according to the first embodiment and FIG. 2(b) is a partial cross-sectional view thereof. As described above, the lower electrode pattern BEPLATE is connected to a power source via a decoder at an end extending in the Y direction. In FIG. 2 (a), p BEPLATEs from BEPLATE [1] to BEPLATE [p] are illustrated. PCMCHAIN is formed on BEPLATE with STTrY and STTrX therebetween and is connected to TEPLATE at an upper side. A plurality of BEPLATEs are arranged in the X direction. The read bit line MLR extends in the X direction and is connected to Sense amp. at an end. FIG. 1 is a three-dimensional schematic diagram illustrating extraction of a portion of REGION1 of FIG. 2 (a).

BEPLATE has a width over a plurality of PCMCHAINs in the X direction. In this way, it is possible to suppress a voltage drop by a resistance RBEPLATE of BEPLATE when a memory cell is operated by flowing a current in the Y direction from a power source circuit. However, if the width of the X direction of BEPLATE is increased, parasitic capacitances such as a capacitance C(BEPLATE-SUB) between BEPLATE and the semiconductor substrate, a capacitance C(BEPLATE-STTGYL) between BEPLATE and STTGYL, and a capacitance C(BEPLATE-STTGY) between BEPLATE and STTGY illustrated in FIG. 2 (b) increase in proportion to the width of BEPLATE. As described below, when a voltage pulse is applied to BEPLATE to operate the memory cell, the parasitic capacitances are charged/discharged and energy is consumed. That is, if the width of BEPLATE is increased, the parasitic resistance RBEPLATE can be reduced. However, the parasitic capacitance increases.

Figure 3:
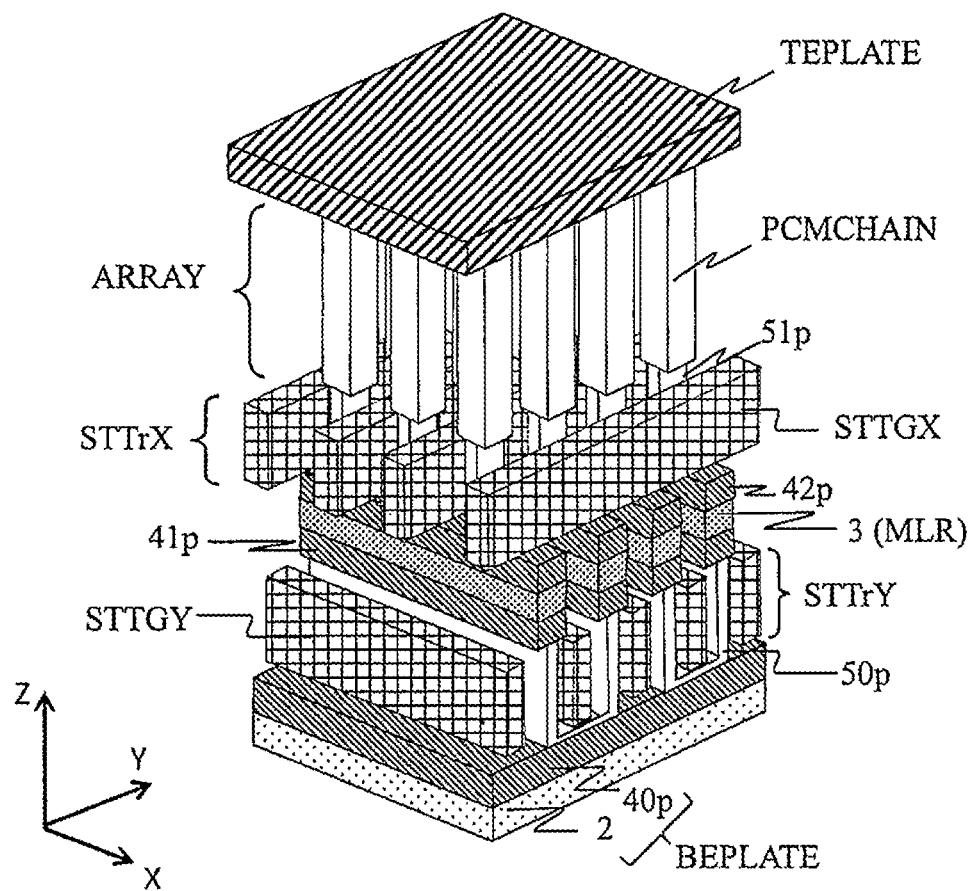
FIG. 3 is a partial three-dimensional schematic diagram of a memory cell array according to the first embodiment of the present invention.

FIG. 3 illustrates extraction of ARRAY configured using PCMCHAINs and portions on and below ARRAY, in FIG. 1. The electrode 3 extends in the X direction and operates as the wiring line MLR to select the phase change memory chain PCMCHAIN in the Y direction in the read operation. The X selection transistor STTrX to select PCMCHAIN in the X direction is formed on the electrode 3. The gate STTGX of STTrX extends in the Y direction orthogonal to the electrode 3 and a channel semiconductor layer 51p is formed in a space between the gates with a gate insulating film therebetween. The channel semiconductor layer 51p is connected to the electrode 3 via an N-type semiconductor layer 42p at a lower end. An upper end of the channel semiconductor layer 51p is connected to a channel semiconductor layer 8p forming PCMCHAIN. The channel semiconductor layer 51p is separated in the X direction and the Y direction for every PCMCHAIN. The phase change memory chain PCMCHAIN is formed on STTrX. As described in FIG. 4, a diffusion layer including an N-type semiconductor layer 25p is formed on the channel semiconductor layer 8p and is connected to the plate-like electrode TEPLATE becoming an upper electrode. Although not illustrated in FIG. 3 to facilitate viewing, PCMCHAIN is formed in a hole of a Z direction formed in a laminate in which gate polysilicon layers 21p, 22p, 23p, and 24p becoming cell gate electrodes and insulating films 11, 12, 13, 14, and 15 are alternately laminated.

The Y selection transistor STTrY that extends in the X direction like the electrode 3 and selects PCMCHAIN in the Y direction when the set operation and the reset operation to be described below are executed is formed below the electrode 3. The gate STTGY of STTrY extends in the X direction parallel to the electrode 3 and the channel semiconductor layer 50p is formed in a space between the gates with a gate insulating film therebetween. An upper end of the channel semiconductor layer 50p is connected to the electrode 3 via the N-type semiconductor layer 41p. A lower end of the channel semiconductor layer 50p is connected to the plate-like electrode BEPLATE via the N-type semiconductor layer 40p. Because source/drain diffusion layers of the channel semiconductor layer 50p are the N-type semiconductor layers 40p and 41p, a length of the channel semiconductor layer 50p extending in the X direction becomes a channel width of STTrY. When the channel width is large, STTrY can drive a large on current. The channel semiconductor layer 50p may be separated in the X direction at an appropriate interval below the electrode 3, according to a necessary on current.

In FIG. 3, the electrode wiring lines 3 extending in the X direction, the gate electrodes STTGY of STTrY extending in the X direction, and the gate electrodes STTGX of STTrX extending in the Y direction can be formed at a pitch of 2F with the minimum processing dimension as F. That is, memory cells of a projected area 4F2 in an XY plane can be formed. Here, structures of the selection transistors STTrX and STTrY will be described. If attention is paid to STTrY, the channel semiconductor layers 50p are formed on the sidewalls of the gates STTGY extending in the X direction and arranged in the Y direction at the pitch of 2F, with the gate insulating film therebetween. If attention is paid to one channel semiconductor layer 50p, both surfaces of the Y direction thereof contact STTGY with the gate insulating film therebetween. In addition, if attention is paid to one STTGY, both surfaces of the Y direction thereof contact the channel semiconductor layer 50p with the gate insulating film therebetween. When the thickness of the Y direction of the channel semiconductor layer 50p of the Y selection transistor STTrY is large (about 10 nm or more in the case of silicon), an independent inversion layer is formed in each of two STTGYs contacting the channel semiconductor layer with the gate insulating film therebetween. As a result, when an on voltage is applied to any one of the two gates or both the two gates, the channel semiconductor layer 50p is turned on and the plate-like electrode BEPLATE and the electrode 3 (MLR) are electrically connected. When an off voltage is applied to both the two gates, the channel semiconductor layer 50p is turned off and the plate-like electrode BEPLATE and the electrode 3 (MLR) are insulated. In this case, if an on voltage is applied to one STTGY, the two channel semiconductor layers 50p at both sides thereof are certainly turned on. For this reason, a selection operation for causing only one of the channel semiconductor layers 50p to be turned on is disabled.

However, in the case in which the channel semiconductor layer 50p is sufficiently thin (the thickness is preferably 5 nm or less, in the case of silicon), even though an on voltage is applied to one of STTGYs at both sides, a strong off voltage (negative voltage with a source potential as a reference, in the case of an NMOS) is applied to the other, so that channel semiconductor layer can be turned off. This is because a depletion layer spreads completely in a film thickness direction of the channel semiconductor $50p$ and a carrier density of the inversion layer of the back surface side of the channel semiconductor $50p$ is controlled by an electric field from one STTGY. Therefore, even if an on voltage is applied to one STTGY, the channel semiconductor layers $50p$ of both sides are not necessarily turned on and the channel semiconductor layer can be turned off by applying a strong off voltage to the other STTGY contacting the channel semiconductor layer with the gate insulating film therebetween. By using this phenomenon, it is possible to select only one channel semiconductor layer and cause the channel semiconductor layer to be turned on. The plurality of channel semiconductor layers $50p$ to be continuous in the Y direction can be turned on at the same time. However, a specific selection state such as turning on the channel semiconductor layer for every other channel semiconductor layer is difficult. This is applicable to STTGX. In the semiconductor storage device of FIG. 3, the channel semiconductor layers $50p$ and $51p$ are formed of silicon and the film thickness of the Y direction of the channel semiconductor layer $50p$ and the film thickness of the X direction of the channel semiconductor layer $51p$ are set to about 5 nm or less.

Figure 4:
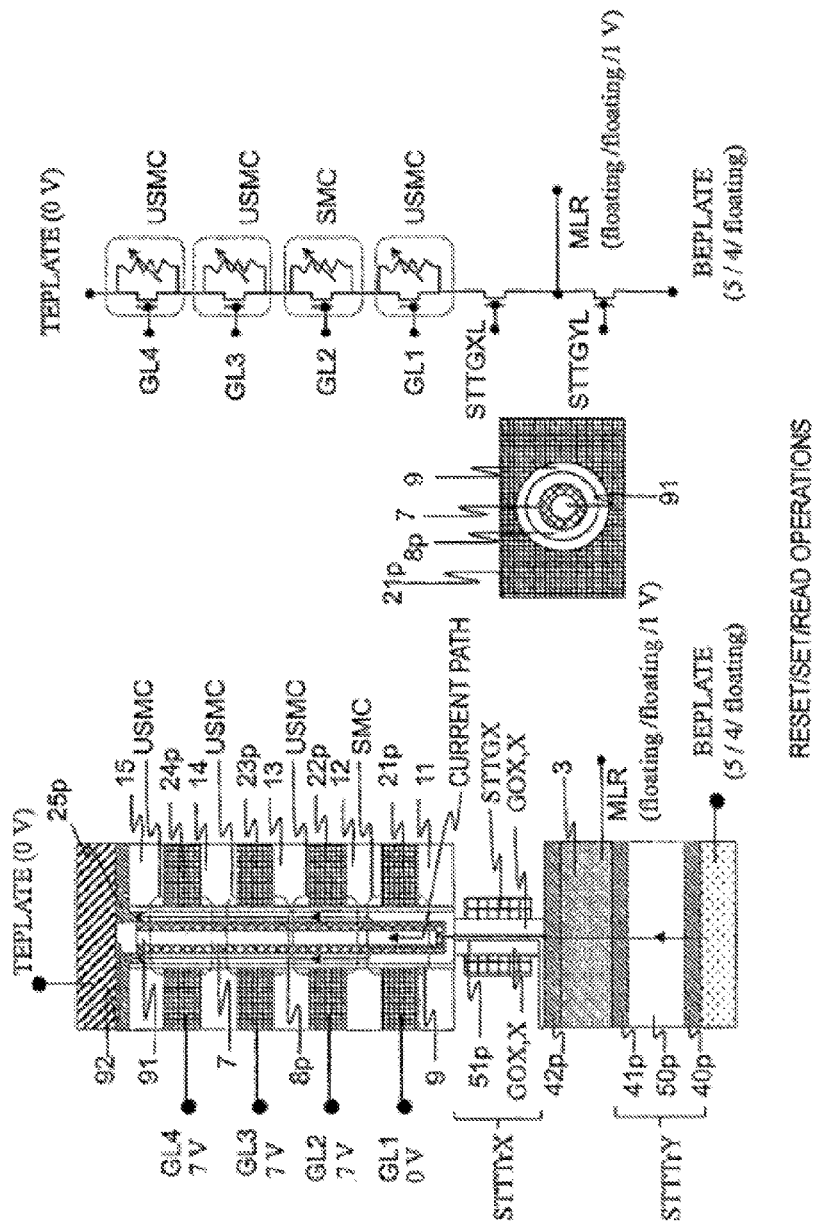
FIG. 4 is a diagram illustrating a reset operation, a set operation, and a read operation of the memory cell array according to the first embodiment of the present invention.

FIG. 4 is a diagram illustrating extraction of a part of ARRAY according to the first embodiment. Components of PCMCNAIN omitted to facilitate understanding in FIGS. 2(a) to 3, that is, the gate polysilicon layers $21p$ to $24p$, the insulating films 11 to 15, a gate insulating film 9, the channel polysilicon layer $8p$, an N-type polysilicon layer $25p$, a phase change material 7, and insulating films 91 and 92 are also illustrated. In addition, gate insulating films GOX,X of STTrX are also illustrated. In addition, a top view in one gate polysilicon layer $21p$ and an equivalent circuit diagram corresponding to a part of ARRAY are illustrated in parallel.

An operation of the memory cell can be executed as follows, for example. 0 V is applied to a gate line GL1 to which a selection cell SMC is connected and a transistor using the channel polysilicon layer $8p$ as a channel is turned off. 7 V is applied to gate lines GL2, GL3, and GL4 to which unselection cells USMCs are connected and transistors are turned on. 0 V is applied to TEPLATE. When the reset operation and the set operation are executed, STTrX and STTrY are turned on and a reset voltage VRESET (for example, 5V) and a set voltage (for example, 4 V) are applied to BEPLATE. MLR enters a floating state. In the unselection cell USMC, resistance of the channel becomes low in a state in which the transistor is turned on. For this reason, a current flows through the channel polysilicon layer $8p$. Almost the same current can flow without depending on a state of the phase change material 7 in an USMC portion. In SMC, because the transistor is turned off, the current flows through the phase change material 7. When the reset operation and the set operation are executed, a resistance value of the phase change material 7 is changed by the current flowing through the phase change material 7 in SMC and the operation is executed.

When the read operation is executed, STTrX is turned on, STTrY is turned off, and VREAD (for example, 1 V) is applied to MLR. In the unselection cell USMC, the resistance of the change becomes low in a state in which the transistor is turned on. For this reason, the current flows through the channel polysilicon layer $8p$. Almost the same current can flow without depending on the state of the phase change material 7 in the USMC portion. In SMC, because the transistor is turned off, the current flows through the phase change material 7. A value of the current flowing through the phase change material 7 in SMC is detected using Sense amp. connected to MLR and the read operation is executed.

As the phase change material layer 7, a material such as $Ge_2Sb_2Te_5$ storing information using that a resistance value in an amorphous state and a resistance value in a crystalline state are different can be used. An operation for changing a state from the amorphous state to be a high resistance state to the crystalline state to be a low resistance state, that is, the set operation is executed by heating the phase change material of the amorphous state to a crystalline temperature or more, maintaining this state for about 10-6 seconds or more, and causing the phase change material to enter the crystalline state. The phase change material of the crystalline state can enter the amorphous state by heating the phase change material to a temperate of a melting point or more, changing the state of the phase change material to a liquid state, and cooling the phase change material rapidly.

Figure 5:
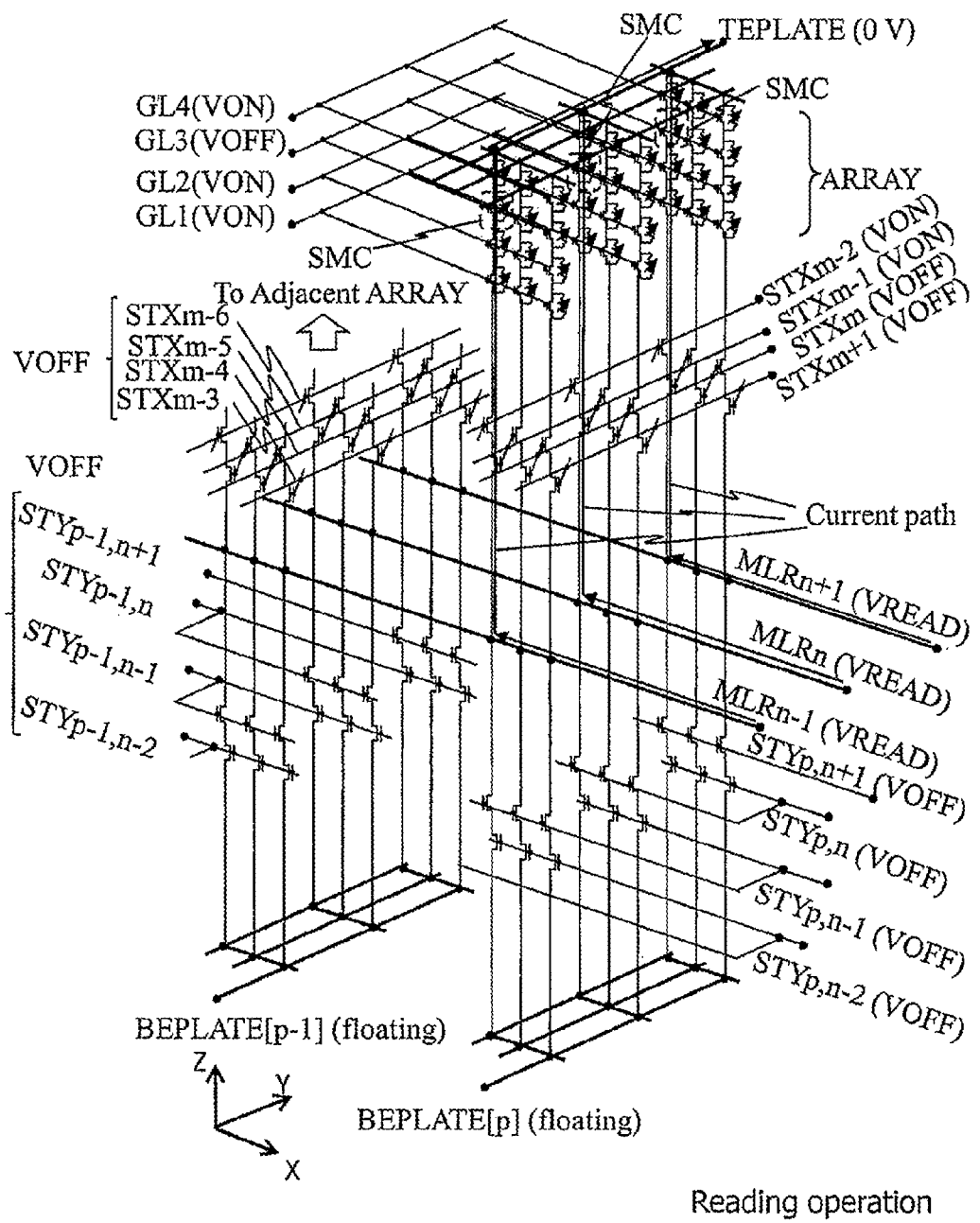
FIG. 5 is a diagram illustrating the read operation of the memory cell array according to the first embodiment of the present invention.
Figure 6:
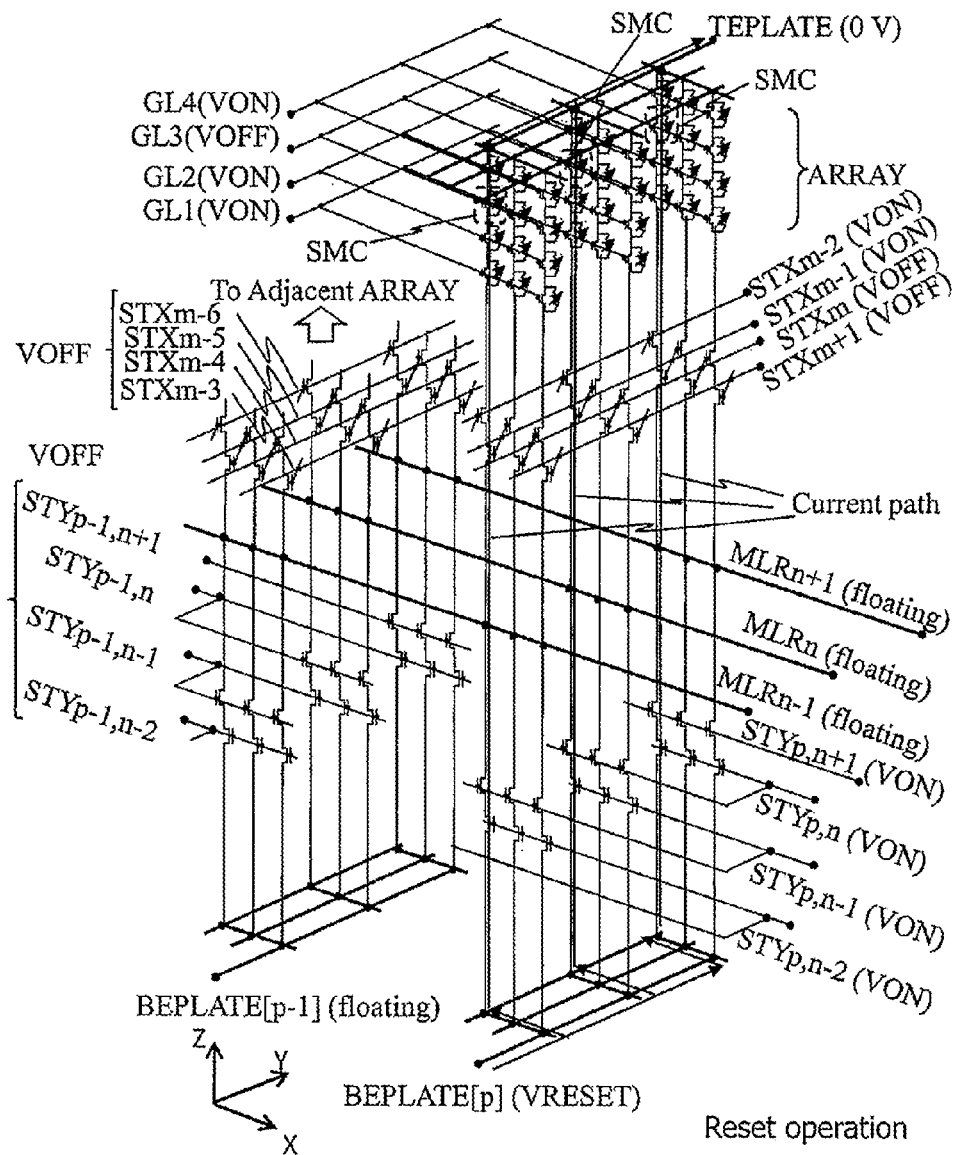
FIG. 6 is a diagram illustrating the reset operation of the memory cell array according to the first embodiment of the present invention.
Figure 7:
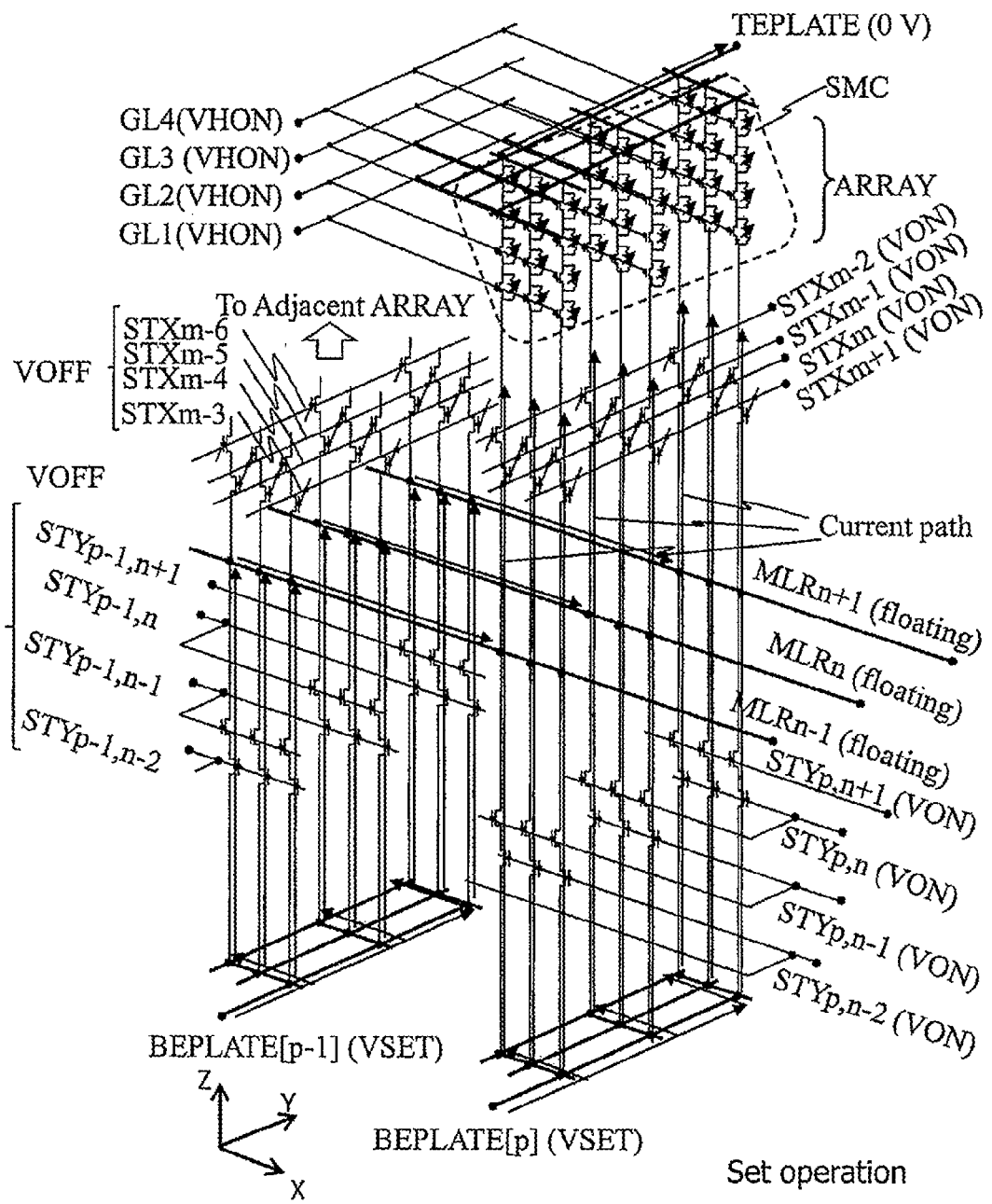
FIG. 7 is a diagram illustrating the set operation of the memory cell array according to the first embodiment of the present invention.

FIGS. 5 to 7 are equivalent circuit diagrams of the semiconductor storage device of FIG. 1 and illustrate the read operation/reset operation/set operation, respectively. In the X selection transistor STTrX and the Y selection transistor STTrY, the channel semiconductor layers $50p$ and $51p$ are thin films of about 5 nm. For this reason, the X selection transistor STTrX and the Y selection transistor STTrY are turned on when an on voltage is applied to the gates of both sides and are turned off when a strong off voltage is applied to the other gate even though an on voltage is applied to one gate. To illustrate these as equivalent circuits, in FIGS. 5 to 7, each of the Y selection transistor STTrY and the X selection transistor STTrX is shown by two transistors connected in series and facing transistors are described to be connected in series. In the equivalent circuit, a structure where separated BEPLATE[p-1] and BEPLATE[p] are connected via the transistor (STTrY) and the electrode, which is a characteristic of the first embodiment, is also illustrated.

FIG. 5 illustrates the read operation using the equivalent circuit diagram. In the read operation, all of the Y selection transistors STTrYs are turned off and electrically insulate BEPLATE[p-1] and the electrode 3 (MLR) and BEPLATE [p] and MLR, respectively. The read voltage VREAD is applied to MLR and 0 V is applied to TEPLATE and a current between MLR and TEPLATE at both sides of PCMCHAIN is detected, so that it is determined whether the selection memory cell SMC is in the set state of the low resistance or the reset state of the high resistance. The current flowing at that time is set to a small current of a degree where the resistance state of the phase change memory does not change, that is, a current sufficiently smaller than the set current and the reset current, so that non-destructive read is enabled. MLRs are arranged at the same pitch as PCMCHAIN in the Y direction and are connected to Sens. amp. on the semiconductor substrate. For example, each MLR is connected to independent Sense amp., so that one cell can be selected from each of the plurality of PCMCHAINs arranged in the Y direction as illustrated in FIG. 5, and parallel read is enabled. At the time of the read operation, the Y selection transistors STTGYp-1,n-2, STTGYp-1,n-1, STTGYp-1,n, and STTGYp-1, n+1 and the X selection transistors STTGXm-3, STTGXm-4, STTGXm-5, and STTGXm-6 of the adjacent ARRAY unit are turned off. BEPLATE[p] of the selection ARRAY unit and BEPLATE[p-1] of the unselection ARRAY unit enter a floating state. As such, MLR and BEPLATE and MLR and the unselection ARRAY are electrically insulated from each other, respectively, so that the current flowing from MLR to BEPLATE and the current flowing from MLR to the unselection ARRAY can be suppressed, the current detected by Sense amp. via MLR can be set equally to the current flowing through the selection cell, and the read operation is enabled.

FIG. 6 illustrates the reset operation using the equivalent circuit diagram. In the reset operation, MLR and Sense amp. are insulated by a peripheral circuit. The reset operation is executed by flowing the current between BEPLATE [p] and TEPLATE via PCMCHAIN. Because the reset operation is a write operation of data, the reset operation is selectively executed on each memory cell, according to data. The X selection transistor STTrX connected to the selected PCM-CHAIN and the Y selection transistor STTrY connected via MLR are turned on, an off voltage is applied to the gate of the cell transistor of the selection cell of PCMCHAIN, and an on voltage is applied to the gate of the cell transistor of the unselection cell of PCMCHAIN. In this state, if VRESET is applied to BEPLATE and a potential difference is applied between BEPLATE and TEPLATE (0 V), the current flows through the phase change material layer of the selection cell SMC. A voltage between BEPLATE[p] and TEPLATE is configured as a pulse shape of about 10 ns and a fall is configured steeply in particular, so that a state of the phase change material layer of SMC can be changed from the crystalline state (set state) of the low resistance to the amorphous state (reset state) of the high resistance, similar to the normal phase change memory. Only one PCMCHAIN can be selected between the plate electrodes BEPLATE and TEPLATE and can be operated. However, a plurality of PCMCHAINs can be selected. This is because it is not necessary to detect a current flowing through each PCMCHAIN, different from the read operation.

At the time of the reset operation, the Y selection transistors STTGYp-1,n-2, STTGYp-1,n-1, STTGYp-1,n, and STTGYp-1, n+1 and the X selection transistors STTGXm-3, STTGXm-4, STTGXm-5, and STTGXm-6 of the ARRAY unit on adjacent BEPLATE are turned off. As such, MLR and BEPLATE[p-1] and MLR and the unselection ARRAY are electrically insulated from each other, respectively, so that the current flowing from BEPLATE[p] to BEPLATE[p-1] of the unselection ARRAY unit via MLR and the current flowing to the unselection ARRAY via MLR can be suppressed, and energy consumption by a leak current can be suppressed.

FIG. 7 illustrates the set operation using the equivalent circuit diagram. Similar to the reset operation, in the set operation, MLR and Sense amp. are insulated by a peripheral circuit. That is, MLR is insulated from elements other than STTrX and STTrY contacting MLR on and below MLR. The set operation is executed by applying a set voltage VSET to BEPLATE[p], applying 0 V to TEPLATE, flowing a current between BEPLATE[p] and TEPLATE via PCMCHAIN, and generating a Joule heat in PCMCHAIN. If the set operation is executed by flowing a current in parallel to the plurality of PCMCHAINs adjacent to each other, simultaneously selecting all cells in each PCMCHAIN, and generating a heat (bundle erasure), the heat is exchanged between PCMCHAINs. For this reason, multiple cells per unit consumption power can be set as compared with a method in which each memory cell is selected and the set operation is executed or a method in which the current flows through each PCMCHAIN and the set operation is executed. That is, a transfer speed of the erasure can be improved. However, in a resistance change type memory including the phase change memory, when the set operation is executed, it is necessary to flow the current to the resistance change element. For this reason, when the resistance of the memory cell increases excessively at the time of the reset operation described above, the current may not be flown sufficiently thereafter and the set operation may not be executed or it may be necessary to apply a high voltage as compared with a normal set operation to flow the current. In PCMCHAIN, each memory cell has a configuration in which the phase change material layer and the cell transistor are connected in parallel and the individual memory cells are connected in series. For this reason, when the set operation is executed, a current flowing through PCMCHAIN has a component flowing through the phase change material layer and a component flowing through the cell transistor. Because the set operation is executed in about one microsecond, the Joule heat generated in the channel of the cell transistor is transmitted to the phase change material layer contacting the channel. If an appropriate on voltage (half-on gate voltage: VHON) is applied to the gate of the cell transistor, the channel is controlled in an appropriate on resistance state, and a potential difference is applied between TEPLATE/BEPLATE, the Joule heat generated in the channel portion is transmitted to the phase change material layer and the set operation can be executed. For this reason, even if the resistance of the phase change material layer is increased excessively by the reset operation or a large voltage is applied to the memory cell and the current is not flown, the set operation can be executed. VHON illustrated in FIG. 7 exemplifies this operation.

FIG. 7 illustrates the case in which the set operation is executed by flowing the current to three continuous PCMCHAINs in each of the X and Y directions, that is, a total of nine PCMCHAINs. To execute the set operation at a high speed, a method in which the set operation is collectively executed, a collective erasure operation is executed, and write is performed on each cell by the reset operation described above is used.

In the collective erasure operation, a consumption current per cell is small. However, because a plurality of chains are simultaneously operated, a current flowing to BEPLATE[p] is larger than a current in the case of the reset operation. For this reason, in the width of BEPLATE [p] in which the voltage drop is suppressed in the reset operation, the voltage drop cannot be suppressed at the time of the set operation. Therefore, as illustrated in FIG. 7, VSET is applied to BEPLATE[p-1] separated from BEPLATE[p] of selection ARRAY. Different from the case of the read operation or the reset operation, the Y selection transistors STTrYp-1,n-2, STTrYp-1,n-1, STTrYp-1,n, and STTrYp-1,n+1 of the unselection ARRAY unit are turned on, are connected to selection ARRAY via the electrode wiring line 3, and supply a current. The X selection transistors STTrXm-3, STTrXm-4, STTrXm-5, and STTrXm-6 of the unselection ARRAY unit are turned off. In addition to the current from BEPLATE [p] of the selection ARRAY unit, the set current is flown to the selection cell SMC via the plurality of BEPLATEs such as BEPLATE[p-1] of the unselection ARRAY unit. For this reason, it is possible to suppress the voltage drop in BEPLATE by the large set current.

As described in FIG. 2(b), the plate-like electrode wiring line having the large width with respect to a current path may be used to suppress the voltage drop in the electrode wiring line at the time of the reset operation. However, the parasitic capacitance around the electrode wiring line increases in proportion to the magnitude of the width, which results in increasing energy consumption by the charge/discharge of the parasitic capacitance occurring when the pulse voltage is applied at the time of the reset operation. Because energy used for the reset operation of the memory cell is consumed by the charge/discharge of the parasitic capacitance, performance is deteriorated. For this reason, the width of the electrode wiring line cannot be increased infinitely.

Meanwhile, in the collective set operation, the multiple memory cells are simultaneously operated, so that set energy per cell is reduced. However, the current flowing at that time is larger than the current at the time of the reset operation. For this reason, the electrode wiring line preferably has a resistance lower than a resistance at the time of the reset operation. The consumption energy by the charge/discharge of the parasitic capacitance is increased by increasing the width of the electrode wiring line. However, an influence is small as compared with the case of the reset operation, due to the following reason. First, because an operation voltage in the set operation is lower than an operation voltage in the reset operation, energy consumed by one charge/discharge is small in the case of the same parasitic capacitance. In addition, because the set operation is used as the collective erasure operation, the set operation can be executed on a larger number of memory cells as compared with the case of the reset operation, during one charge/discharge, and performance deterioration by the charge/discharge of the parasitic capacitance is small as compared with the case of the reset operation. For this reason, when the collective set operation is executed, it is preferable to increase the width of the electrode wiring line and decrease the resistance as compared with when the reset operation is executed, for high performance.

Figure 8:
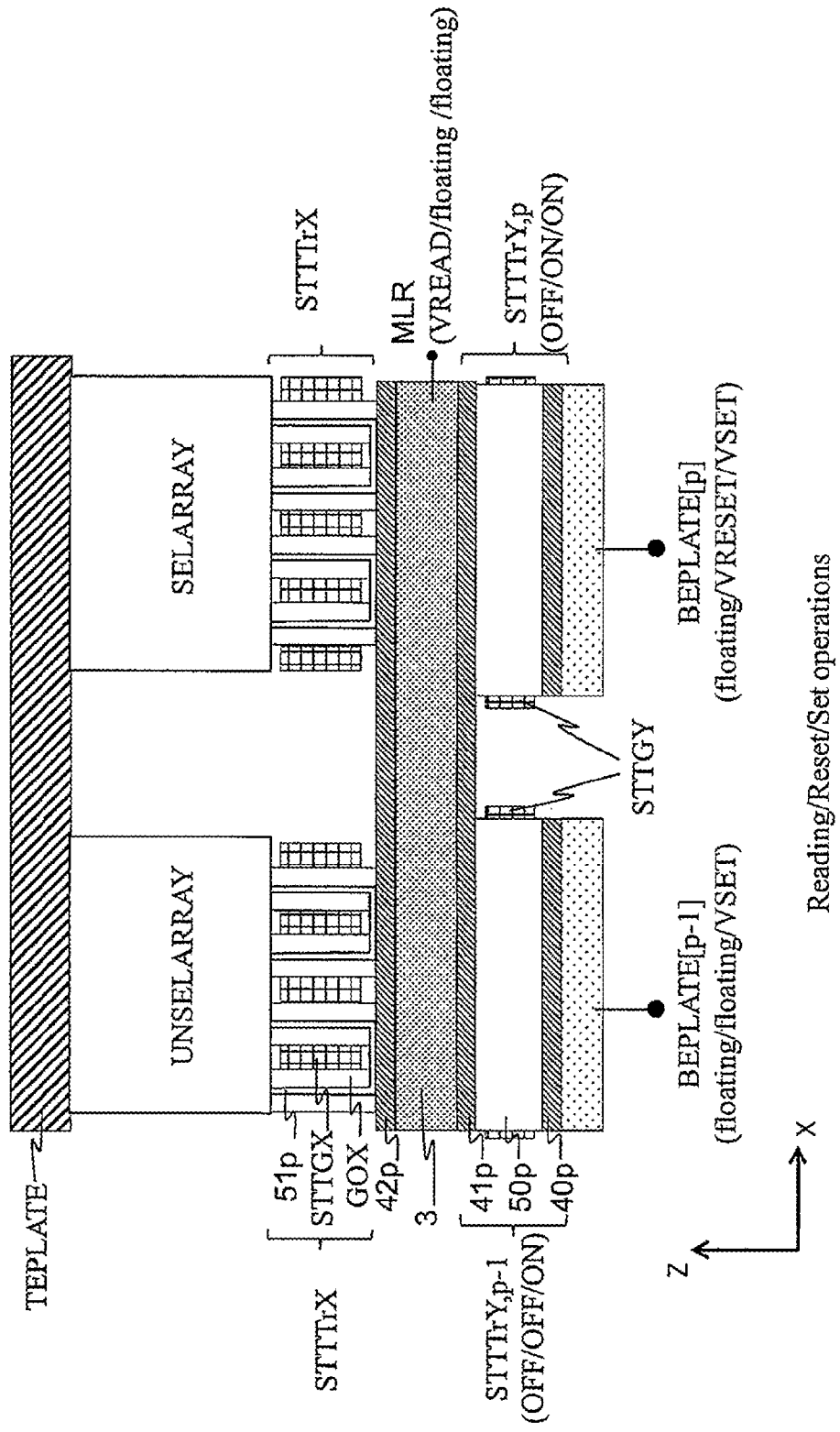
FIG. 8 is a partial cross-sectional view of the semiconductor storage device according to the first embodiment of the present invention.

The states of BEPLATE and STTrY at the time of the read/reset/set operations described in FIGS. 5 to 7 are arranged using a cross-sectional view of FIG. 8. STTrX is turned off in all the read/reset/set operations in the unselection array (UNSELARRAY) and is turned on with respect to a selection chain SPCMCHAIN and turned off with respect to an unselection chain USPCMCHAIN in the selection array (SELARRAY).

Figure 9:
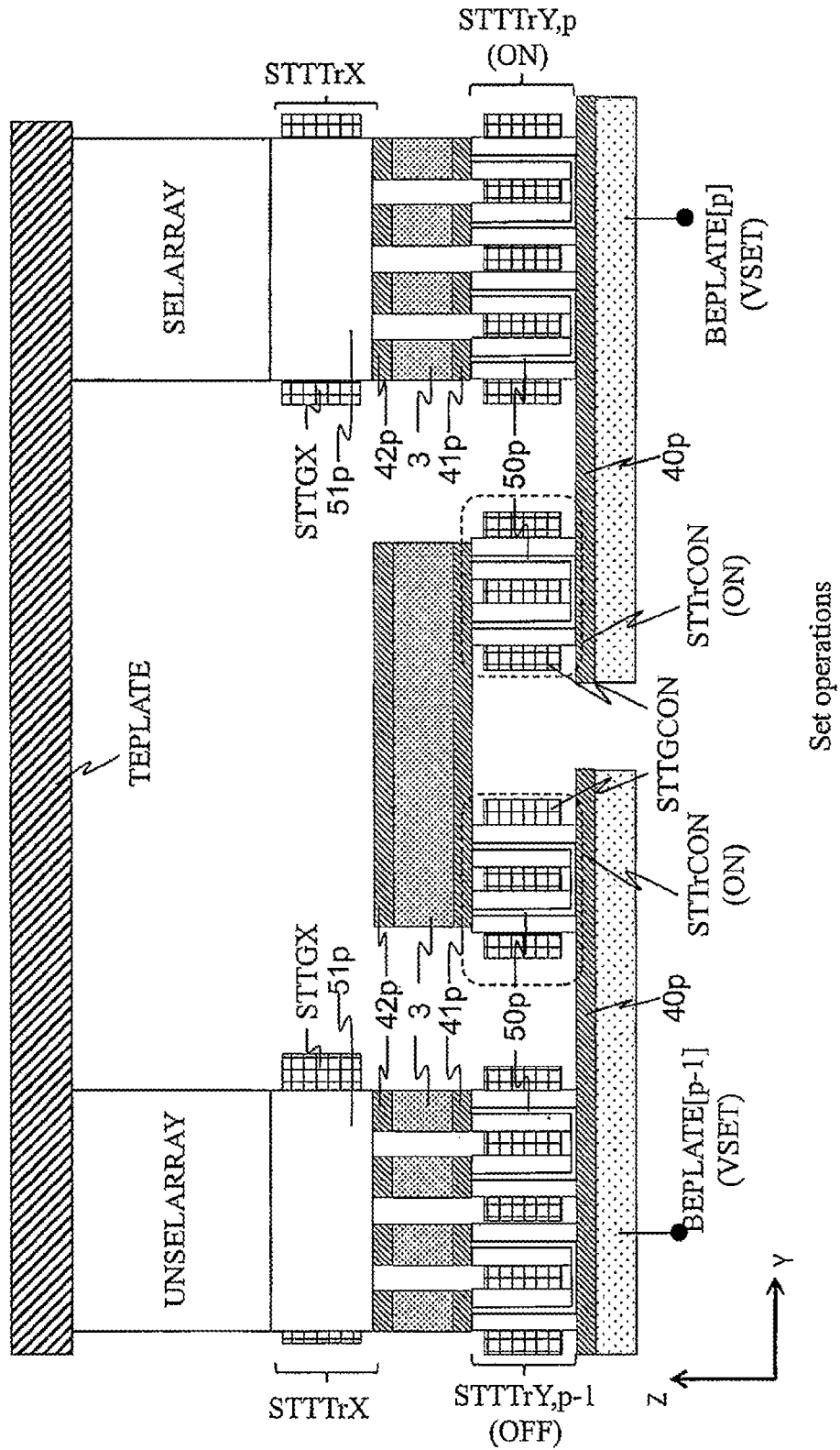
FIG. 9 is a partial cross-sectional view of a semiconductor storage device according to a modification of the first embodiment of the present invention.

In FIGS. 1 to 8, BEPLATE extends in a direction orthogonal to MLR. However, BEPLATE can extend in the same direction. FIG. 9 illustrates a method of connecting BEPLATEs using the transistor when an extension direction of BEPLATE is the X direction equal to an extension direction of MLR. In FIG. 9, transistors STTrCON are formed in an end of the Y direction of BEPLATE and the transistors STTrCON on BEPLATE are connected using the metal film layer 3 of the same layer as a read bit line. States of BEPLATE, STTrY, and STTrCON at the time of the set operation are arranged in FIG. 9. At the time of the set operation in which it is necessary to flow the large current, STTrCON is turned on, BEPLATEs are connected, and a current is flown to SPCMCHAIN of the SELARRAY unit. Even in the method of FIG. 9, in addition to the current from BEPLATE[p] of the SELARRAY unit, the set current is flown to SMC via the plurality of BEPLATEs such as BEPLATE[p−1] of the UNSELARRAY unit. For this reason, it is possible to suppress the voltage drop in BEPLATE by the set current. At the time of the read/reset operations, STTrCON is turned off and each BEPLATE is operated independently.

Figure 10:
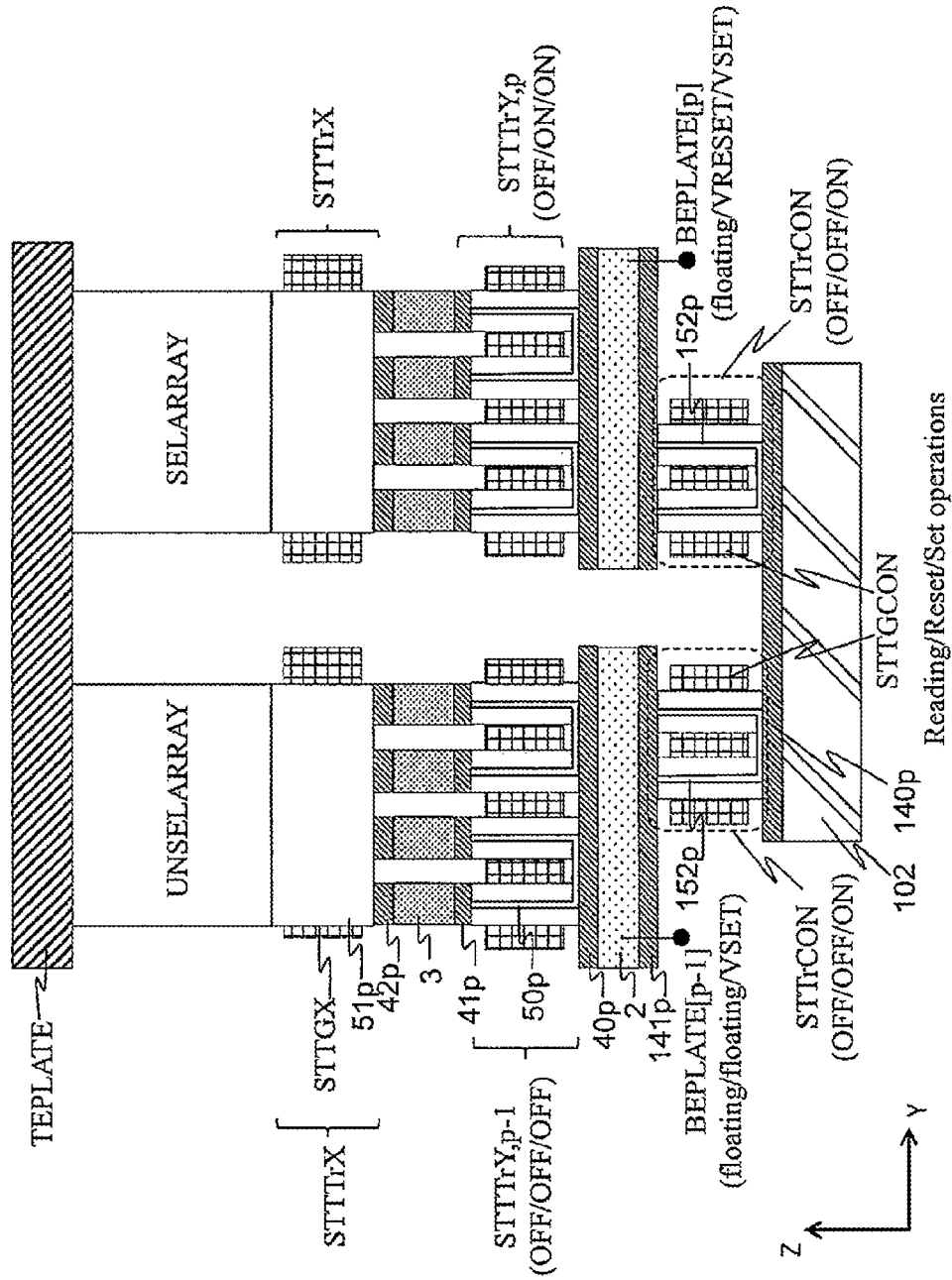
FIG. 10 is a partial cross-sectional view of the semiconductor storage device according to the modification of the first embodiment of the present invention.

In FIGS. 1 to 9, BEPLATEs are connected to each other at the side opposite to the semiconductor substrate, that is, the side of the top surface (side of a +Z direction). However, BEPLATEs may be connected to each other at the side of the semiconductor substrate, that is, the side of the bottom surface (side of a −Z direction). In FIG. 10, an electrode layer including an electrode 102 and an N-type silicon layer 140p is provided below BEPLATE and is connected to BEPLATE using the transistor STTrCON with STTGCON as a gate and 152p as a channel. The adjacent BEPLATEs are connected to each other via STTrCON, the lamination electrode of 140p/102, and STTrCON. States of BEPLATE, STTrY, and STTrCON at the time of the set operation are arranged in FIG. 10. At the time of the set operation in which it is necessary to flow the large current, STTrCON is turned on, BEPLATEs are connected, and a current is flown to a selection chain of the SELARRAY unit. Even in the method of FIG. 10, in addition to the current from BEPLATEn of the SELARRAY unit, the set current is flown to the selection cell via the plurality of BEPLATEs such as BEPLATE[p−1] of the UNSELARRAY unit. For this reason, it is possible to suppress the voltage drop in BEPLATE by the set current. At the time of the read/reset operations, STTrCON is turned off and each BEPLATE is operated independently.

The semiconductor storage device according to the first embodiment can improve read performance by the parallel read operation by the read bit lines provided at a high density and Sense amp. connected to the read bit lines. The voltage drop by the electrode wiring line at the time of the reset operation in which the current is large is suppressed by using the plate-like electrode wiring lines and the plate-like electrodes are connected via the transistors to suppress the voltage drop by the large current at the time of the collective set operation. In this way, performances of all operations of the read operation, the reset operation, and the set operation can be improved. Particularly, performance per consumption power in the set operation and the reset operation can be improved.

Second Embodiment

In the first embodiment, the plurality of electrode wiring lines BEPLATEs to supply the reset current and the set current are connected via the transistors and BEPLATEs are electrically connected at the time of the collective set operation in which the current is large, so that both reduction of the parasitic resistance RBEPLATE illustrated in FIG. 2(a) and reduction of the parasitic capacitances C(BEPLATE-SUB), C(BEPLATE-STTGY), and C(BEPLATE-STTGYL) illustrated in FIG. 2(b) are realized.

In a second embodiment, energy consumption by charge/discharge of parasitic capacitances around an electrode wiring line is suppressed. The parasitic capacitances suppressed in the second embodiment are arranged in FIG. 11.

A method of reducing capacitances C(MLR-MLR) between adjacent MLRs and capacitances C(Gate1-CHAN), C(Gate2-CHAN), C(Gate3-CHAN), and C(Gate4-CHAN) between Gate1 to Gate4 and a channel semiconductor layer in addition to the capacitances C(BEPLATE-SUB), C(BEPLATE-STTGY), and C(BEPLATE-STTGYL) described in the first embodiment will be described.

To prevent the charge/discharge, portions not contributing to resistance reduction of an electrode wiring line are previously connected via transistors and when unnecessary, the transistors are turned off for separation, so that the charge/discharge does not occur. In the second embodiment, (1) a method of dividing the read bit lines in an extension direction and connecting the read bit lines via the transistors, (2) a method of connecting the read bit lines to write bit lines and memory cells via the transistors, (3) a method of feeding individual portions of the divided write bit lines via the transistors, and (4) a method of arranging selection transistors on both sides of a memory chain will be described.

<Method of Dividing Read Bit Lines in Extension Direction and Connecting Read Bit Lines Via Transistors>

Figure 11:
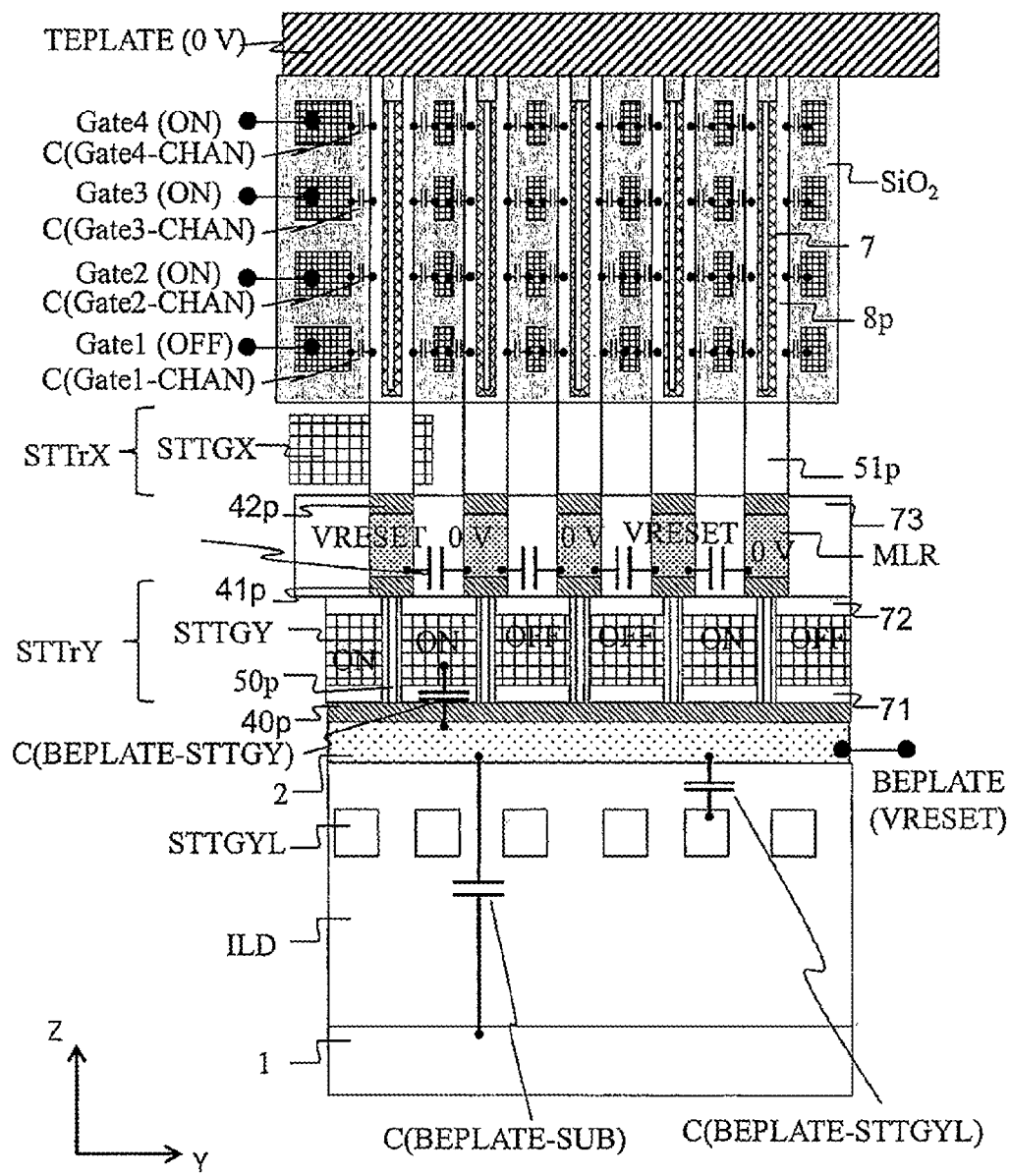
FIG. 11 is a partial cross-sectional view of a semiconductor storage device according to the present invention and a diagram illustrating a capacitance between electrodes.

As illustrated in FIG. 11, at the time of reset/set operations, the read bit line MLR enters a floating state. This is the same as the method illustrated in the first embodiment. MLR extends in an X direction. However, the capacitance C(MLR-MLR) between the adjacent MLRs increases in proportion to an extension distance. To suppress C(MLR-MLR), MLR may be shortened. However, if MLR is simply shortened, Sense amp. illustrated in FIG. 2(a) needs to be arranged in the X direction whenever MLR is broken. For this reason, a chip area, that is, a bit cost increases. The charge/discharge of C(MLR-MLR) occurs in the reset/set operations as well as the read operation. The case of the reset operation is illustrated in FIG. 11. If selection of a Y direction is performed in the reset operation and a reset voltage VRESET and 0 V are applied to BEPLATE and TEPLATE, respectively, VRESET is supplied from the side of BEPLATE to MLR to which a selection chain SPCMCHAIN is connected, because STTrY is turned on. Meanwhile, because STTrY is turned off, a voltage is not supplied from BEPLATE to MLR to which SPCMCHAIN is not connected and 0 V is supplied from TEPLATE via a channel semiconductor layer 8p and a phase change material layer 7. As illustrated in FIG. 11, places where VRESET and 0 V are supplied to adjacent MLRs are generated at both sides of a selection MLR whenever STTrY of one place is selected. A length of one side of a general semiconductor storage chip is about 1 cm. However, energy consumed by the charge/discharge of C(MLR-MLR) when MLR is extended by 1 cm increases when the energy is more than reset energy of a memory cell. That is, energy of the charge/discharge of a parasitic capacitance is more than operation energy of the memory cell. In the case of a collective set operation, because MLRs adjacent to each other in the Y direction are simultaneously charged with VSET, an influence of the charge/discharge energy is small as compared with the case of the reset operation. However, similar to the reset operation, energy is consumed by the charge/discharge of C(MLR-MLR) and performance is deteriorated. It is important to sufficiently increase an extension distance of MLR such that Sense amp. may not be arranged at a high density and suppress the charge/discharge of C(MLR-MLR) at the time of the reset/set operations.

Figure 12:
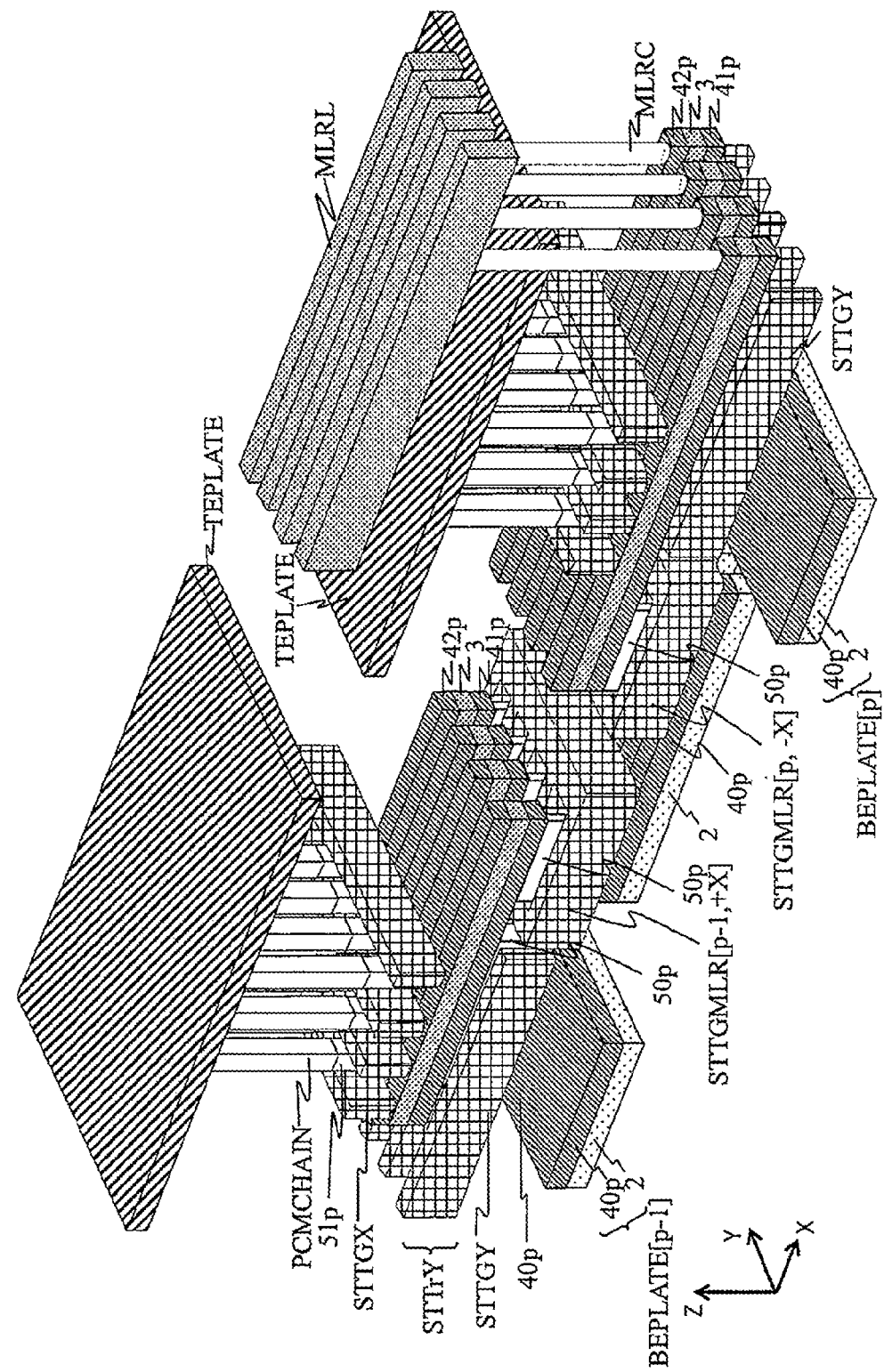
FIG. 12 is a partial three-dimensional schematic diagram of a semiconductor storage device according to a second embodiment of the present invention.

FIG. 12 illustrates a partial three-dimensional schematic diagram of a semiconductor storage device according to the second embodiment. A read bit line MLR is cut in an end of the X direction of BEPLATE[p] and is connected to a lamination electrode of 40p and 2 separated from BEPLATE[p] via a transistor STTrMLR[p, −X] with STTGMLR[p, −X] as a gate at a lower side. The cut MLRs are connected to each other via two transistors STTrMLR[p−1, +X] and STTrMLR[p, −X]. In FIG. 12, the lamination electrodes of 40p and 2 arranged below the two transistors STTrMLR[p−1, +X] and STTrMLR[p, −X] are separated and formed at the same pitch as MLR in the Y direction and are respectively connected to MLRs at both sides of the X direction via STTrMLR[p−1, +X] and STTrMLR[p, −X]. That is, MLRs on BEPLATE[p−1] and BEPLATE[p] adjacent to each other in the X direction are cut at ends of the X direction of BEPLATE[p−1] and BEPLATE[p], but are connected via two STTrMLR[p−1, +X] and STTrMLR[p, −X]. Both the two transistors STTrMLR[p−1, +X] and STTrMLR[p, −X] are turned on, so that MLRs configuring a pair are electrically connected.

Figure 13:
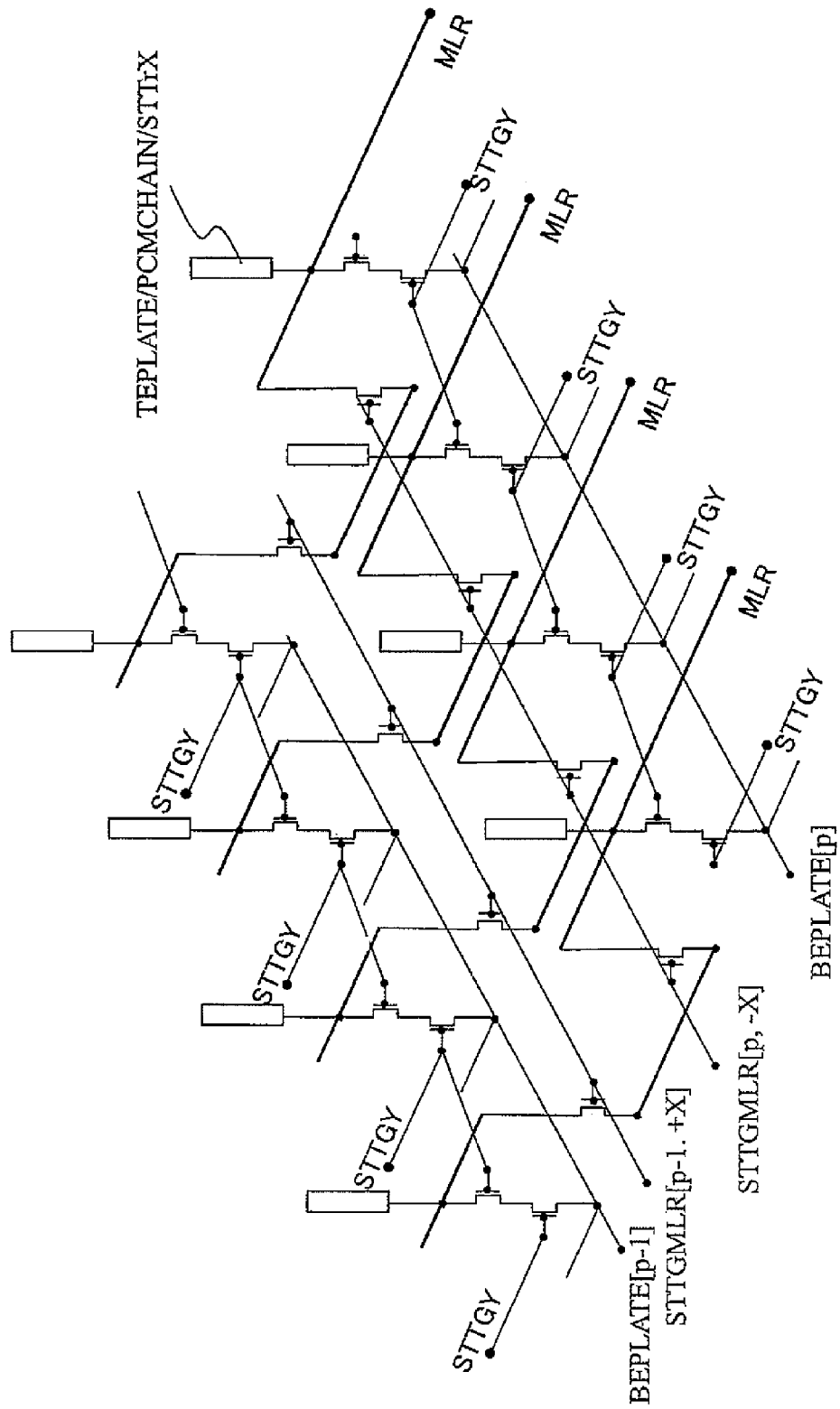
FIG. 13 is an equivalent circuit diagram of the semiconductor storage device according to the second embodiment of the present invention.

At the time of the read operation, STTrMLR[p−1, +X] and STTrMLR[p, −X] are turned on and MLRs are electrically connected in an extension direction. Meanwhile, at the time of the reset operation, STTrMLR[p−1, +X] and STTrMLR[p, −X] are turned off, MLR is separated short for each BEPLATE, and charged/discharged C(MLR-MLR) is reduced. A structure of MLR using STTrMLR[p−1, +X] and STTrMLR[p, −X] illustrated in FIG. 12 can be repetitively formed in the X direction. Because MLR can be separated more short by increasing the number of connection places using STTrMLR, C (MLR-MLR) charged/discharged at the time of the reset operation can be reduced. At the time of a collective set operation, a part or all of STTrMLRs are turned on, MLRs are connected in the X direction, STTrY is turned on, BEPLATEs are electrically connected, and a large current necessary for the collective set operation is flown through a plurality of BEPLATEs. As a result, a voltage drop by a parasitic resistance RBEPLATE of BEPLATE can be suppressed, similar to the first embodiment. In FIG. 12, TEPLATE is shown to be divided into two parts, but may be connected. FIG. 13 illustrates structures of MLR and STTrMLR of FIG. 12 by an equivalent circuit. FIG. 13 illustrates the case in which MLRs are respectively connected via the two transistors STTrMLR[p−1, +X] and STTrMLR[p, −X] in the X direction at a connection portion.

Figure 14:
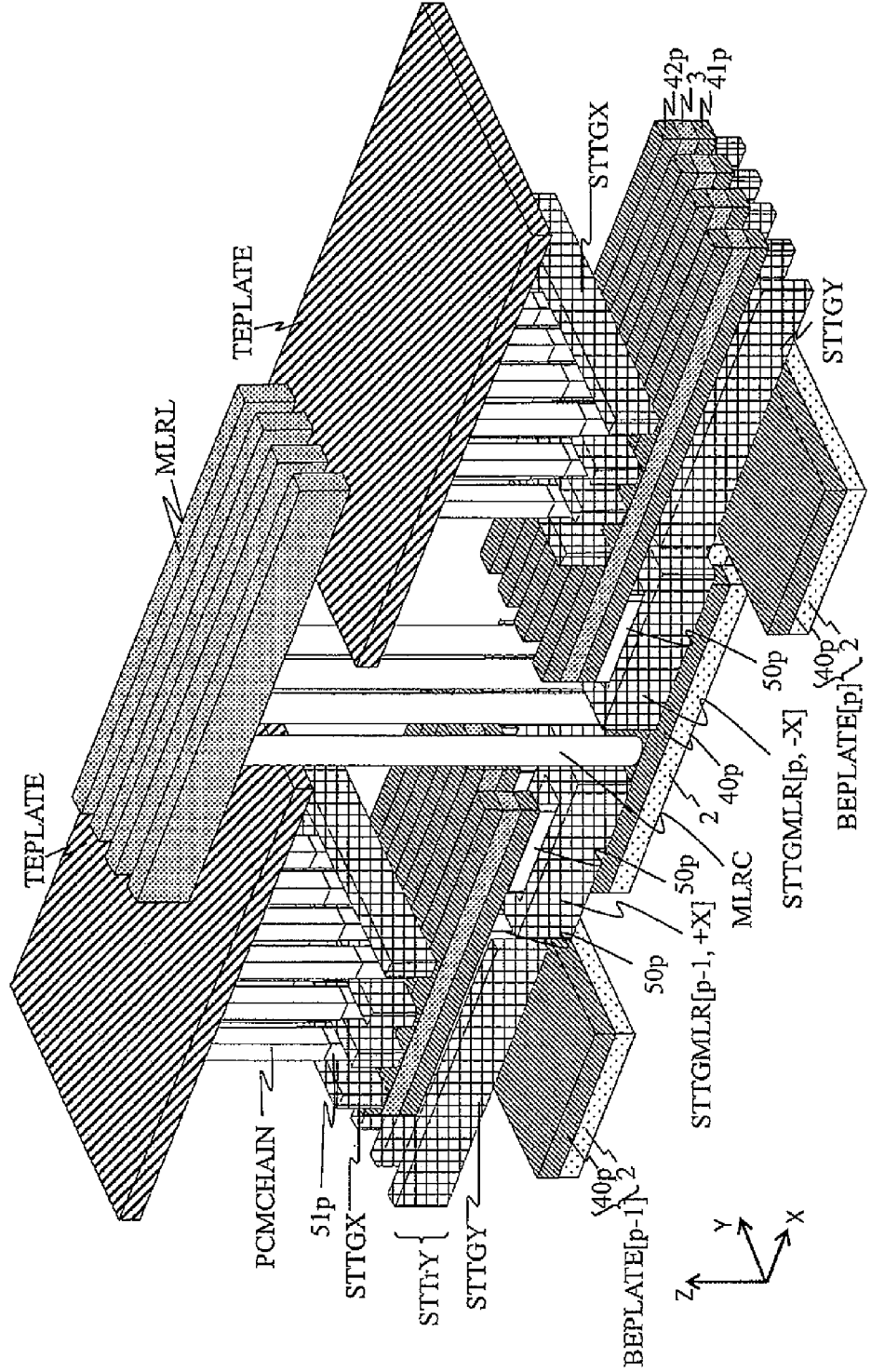
FIG. 14 is a partial three-dimensional schematic diagram of the semiconductor storage device according to the second embodiment of the present invention.

FIG. 14 illustrates the case in which a contact MLRC extending from MLRL is formed on the lamination electrode including 40p and 2, at a boundary portion of the X direction of the two transistors STTrMLR[p−1, +X] and STTrMLR[p, −X], using a method different from the method of cutting MLR short, similar to FIGS. 12 and 13. MLRL and MLR on BEPLATE[p−1] are connected in a one-to-one relation via STTrMLR[p−1, +X] and MLRL and MLR on BEPLATE[p] are connected in a one-to-one relation via STTrMLR[p, −X]. Similar to the case of FIG. 12, in FIG. 14, the lamination electrodes including 40p and 2 below the two transistors STTrMLR[p−1, +X] and STTrMLR[p, −X] are separated and formed at the same pitch as MLR in the Y direction and are respectively connected to MLRs at both sides of the X direction via STTrMLR[p−1, +X] and STTrMLR[p, −X]. When a cell on BEPLATE[p] is selected and the read operation is executed, STTrMLR[p−1, +X] is turned off, STTrMLR[p, −X] is turned on, feeding from MLRL to MLR on BEPLATE[p] is performed, and a current flowing to the memory cell is determined by Sense amp. connected to MLRL. Meanwhile, when the reset operation is executed, STTrMLR[p−1, +X] and STTrMLR[p, −X] are turned off, MLR is separated short for each BEPLATE, and charged/discharged C(MLR-MLR) is reduced. A structure of performing feeding from MLRL using STTrMLR[p−1, +X] and STTrMLR[p, −X], illustrated in FIG. 14, can be repetitively formed in the X direction. Because MLR can be separated more short by increasing the number of connection places using STTrMLR, C(MLR-MLR) charged/discharged at the time of the reset operation can be reduced. At the time of the collective set operation, a part or all of STTrMLRs are turned on, MLRs are connected in the X direction, STTrY is turned on, BEPLATEs are electrically connected, and a large current for the collective set is flown through a plurality of BEPLATEs. As a result, a voltage drop by the parasitic resistance RBEPLATE of BEPLATE can be suppressed, similar to the first embodiment.

Here, an important difference of the method of FIGS. 12 and 13 and the method of FIG. 14 will be described. In the methods of FIGS. 12 and 13, one-to-one connection using the two STTrMLRs and the lamination structures (40p/2) is necessary, whenever MLR is cut at a boundary of the X direction of BEPLATE. This is because, when the connection portion is omitted even in one place, connection of MLRs is cut and read of the side of a far end is disabled when viewed from Sense amp. Meanwhile, in the method of FIG. 14, because feeding is performed from MLRL to the lamination structure (40p/2) via MLRC, MLR on BEPLATE may be connected to MLRL via STTrMLR at either an end of the −X direction of BEPLATE or an end of the +X direction thereof. For example, at a boundary of BEPLATE [p−1] and BEPLATE [p], the connection illustrated in FIG. 14 may be formed and at a boundary of BEPLATE [p−2] and BEPLATE [p−1], MLR may be simply cut and terminated. That is, a method in which a structure where feeding is performed from MLRL to the lamination structure (40p/2) via MLRC and MLRL is connected to MLR via STTrMLR, for every other boundary portion of the X direction of BEPLATE, and a structure where MLR is simply terminated can be alternately repeated is enabled. Also, a method in which feeding is performed from MLRL to the lamination structure (40p/2) via MLRC from only the end of the −X side of BEPLATE (or only the end of the +X side) to all MLRs on each BEPLATE and MLRL is connected to MLR via STTrMLR is enabled.

Figure 15:
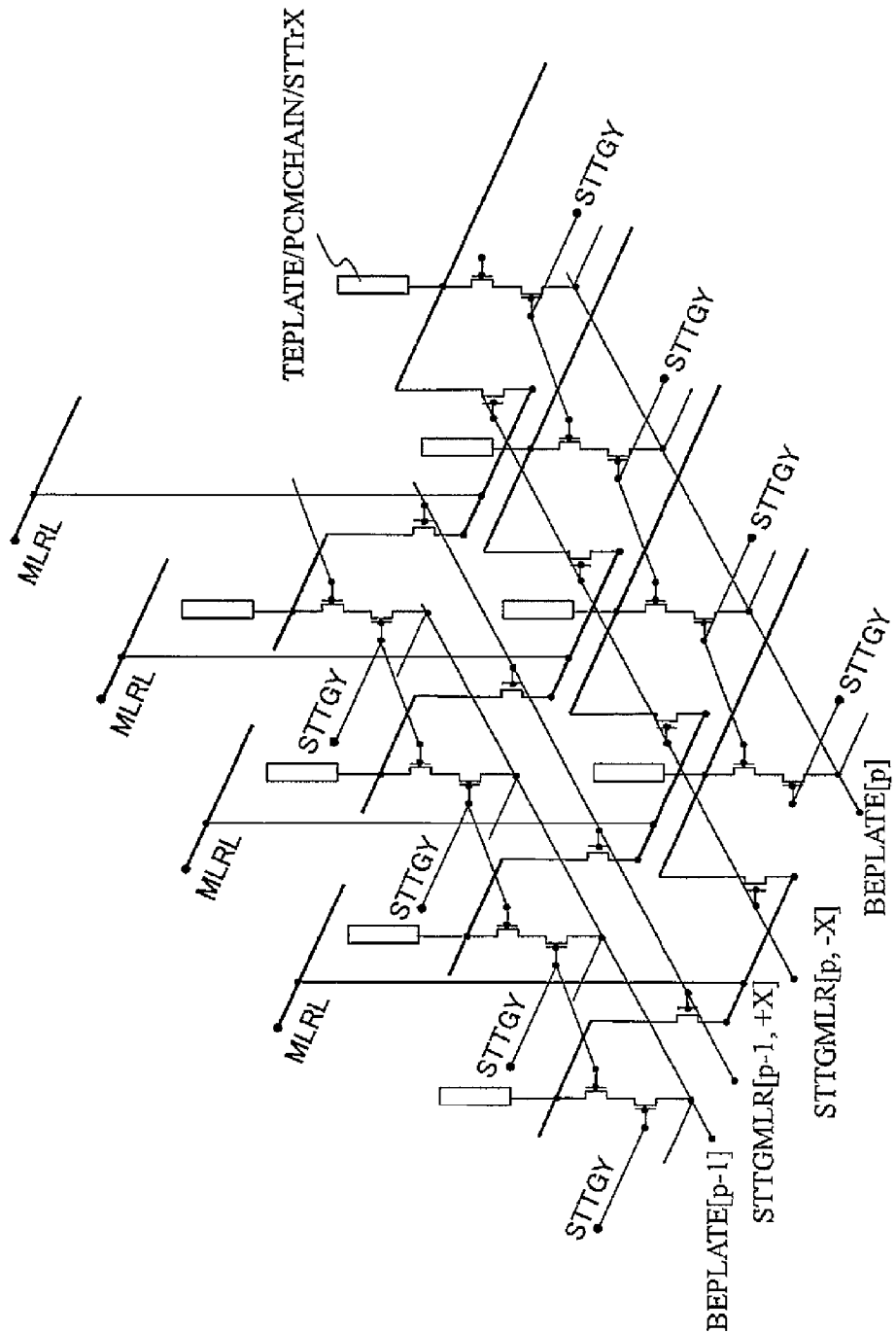
FIG. 15 is an equivalent circuit diagram of the semiconductor storage device according to the second embodiment of the present invention.

As such, in the case in which MLRL and MLR are connected at only the end of the single side of BEPLATE, at the time of the collective set operation, a part or all of STTrMLRs are turned on, MLR and MLRL are connected, and STTrY is turned on, so that BEPLATEs can be electrically connected via MLRL. Even in this case, because a large current for the collective set is flown through the plurality of BEPLATEs, a voltage drop by the parasitic resistance RBEPLATE of BEPLATE can be suppressed, similar to the first embodiment. FIG. 15 illustrates structures of MLR, MLRL, and STTrMLR of FIG. 14 by an equivalent circuit. FIG. 15 illustrates the case in which MLRLs and MLRs on BEPLATE[p] are connected in a one-to-one relation via STTrMLR[p, −X] and MLRLs and MLRs on BEPLATE[p−1] are connected in a one-to-one relation via STTrMLR(p−1, +X).

<Method of Connecting Read Bit Lines to Write Bit Lines and Memory Cells Via Transistors>

A different method of suppressing C(MLR-MLR) charged/discharged at the time of the reset operation and the set operation will be described. In FIG. 11, the reason why 0 V is supplied to MLR of the place where VRESET is not supplied from BEPLATE, that is, MLR to which the selection chain SPCMCHAIN is not connected is that MLR is electrically connected to TEPLATE via the channel semiconductor layer 8p and the phase change material 7. If MLR to which SPCMCHAIN is not connected can be electrically insulated from TEPLATE, C(MLR-MLR) is rarely charged/discharged at the time of the reset operation and energy consumption can be suppressed. That is, performance of the reset operation per consumption power can be improved. This is applicable to the set operation.

Figure 16:
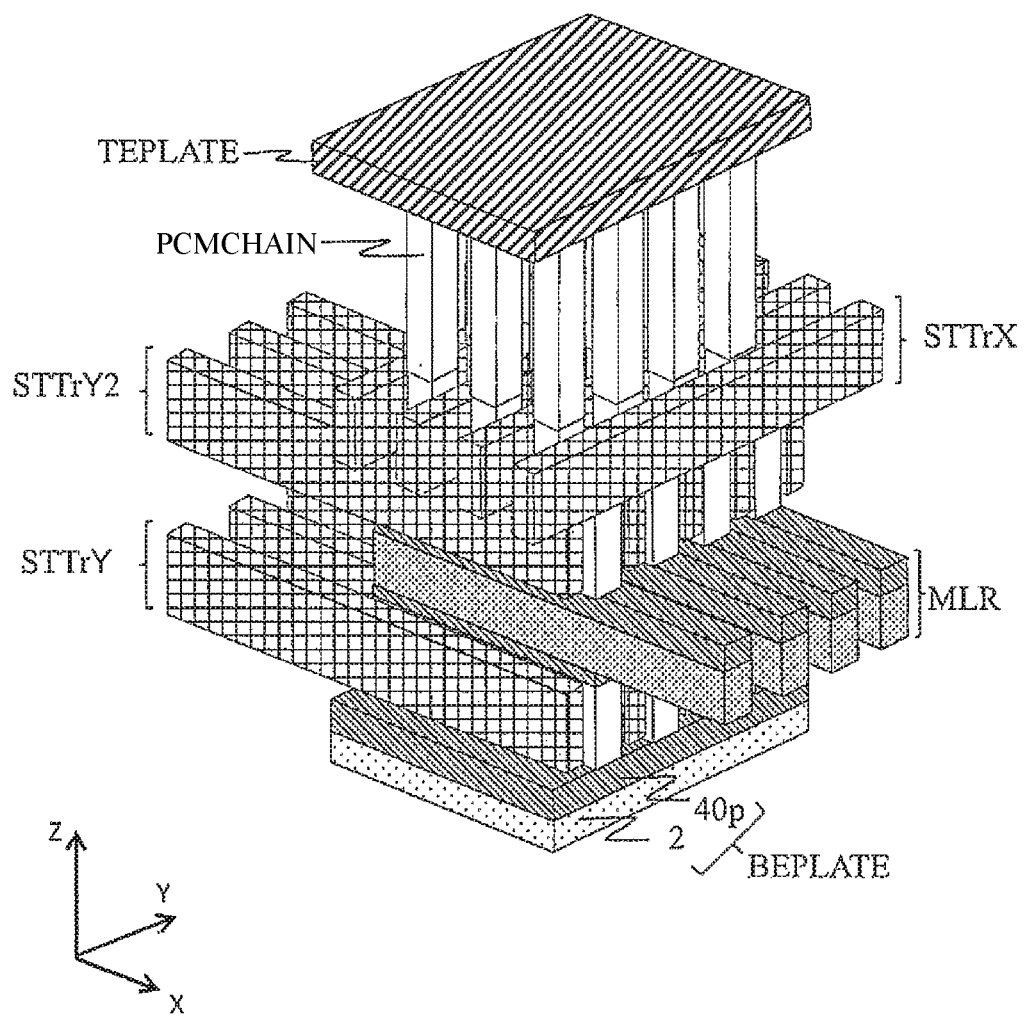
FIG. 16 is a partial three-dimensional schematic diagram of the semiconductor storage device according to the second embodiment of the present invention.

A device structure to realize the above is illustrated in FIG. 16. A transistor STTrY2 having the same structure as the structure of the Y selection transistor STTrY connecting MLR and BEPLATE below MLR is provided on MLR and MLR is connected to STTrX via STTrY2 and is connected to PCMCHAIN via STTrX. As illustrated in a cross-sectional view of FIG. 17, ON/OFF of STTrY and STTrY2 of places where the Y coordinates are the same are operated commonly. As a result, because both STTrY and STTrY2 are turned on, channel semiconductor layers 50p and 252p are in a conductive state in MLR to which SPCMCHAIN is connected at the time of the reset operation. A current can be flown from BEPLATE to a selection cell SMC of SPCM-CHAIN via STTrY, MLR, STTrY2, and STTrX.

Meanwhile, because STTrY is turned off, a current does not flow through the channel semiconductor layer 50p and MLR to which SPCMCHAIN is not connected is insulated from BEPLATE. Also, because STTrY2 is turned off, the current is not flown to the channel semiconductor layer 252p and MLR is insulated from TEPLATE. That is, MLR to which SPCMCHAIN is not connected enters a floating state. For this reason, because a charge charged/discharged in C(MLR-MLR) at the time of the reset operation can be reduced, consumption energy by the charge/discharge can be suppressed. Likewise, because a charge charged/discharged in C(MLR-MLR) at the time of the set operation can be reduced, consumption energy by the charge/discharge can be suppressed.

Figure 18:
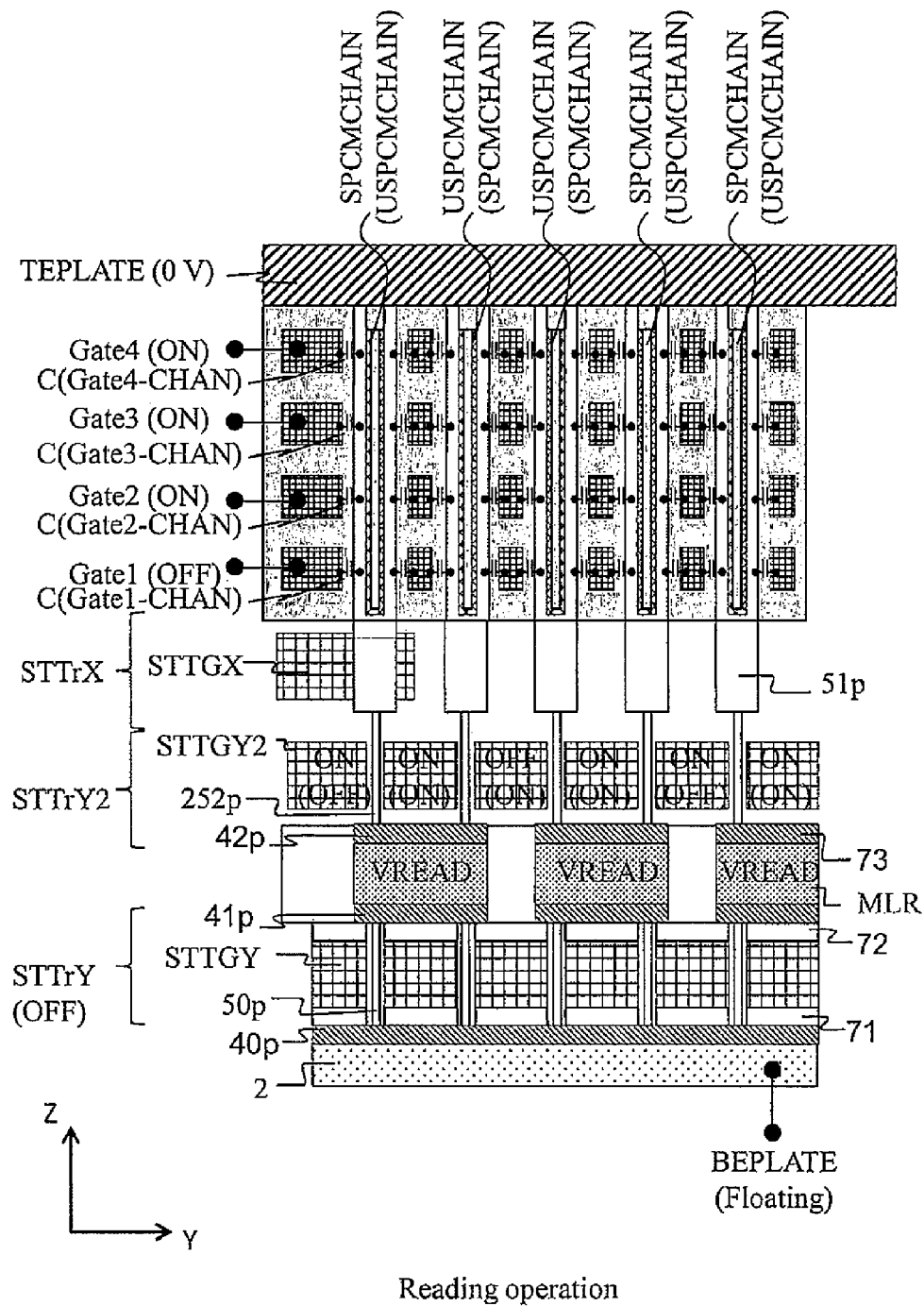
FIG. 18 is a partial cross-sectional view of the semiconductor storage device according to the second embodiment of the present invention and illustrates a voltage condition of a read condition.

At the time of the read operation, all of STTrYs are turned off to insulate MLR and BEPLATE and all of STTrY2 are turned on to connect MLR and STTrX. In this way, a parallel read operation using all MLRs is enabled. In the case of using STTrY2, the number of PCMCHAINs connected to each MLR via STTrX does not need to be one in the Y direction and a resistance can be decreased by increasing a width of MLR. For example, a cross-sectional view from a Y-Z plane when MLRs are formed at a width of two cells in the Y direction is illustrated in FIG. 18. At the time of the reset operation and the set operation, STTrY and STTrY2 may be turned on/off by synchronizing gates of the same Y coordinates with each other. If selection of the Y direction at the time of the read operation is controlled as follows using STTrY2, a parallel operation can be executed by selecting only one of two PCMCHAINs connected to each MLR via STTrY2 on MLR.

As illustrated in FIG. 18, an on voltage is applied to gates in which both sides of the Y direction are interposed by the channel semiconductor layers 252p connected to the same MLR on MLR with a gate insulating film therebetween, among gates of STTrY2. An on voltage and an off voltage are applied for every other gate with respect to gates in which both sides of the Y direction are interposed by the channel semiconductor layers 252p connected to adjacent MLRs with a gate insulating film therebetween. In this way, in the two channel semiconductor layers 252p connected to the same MLR and arranged in the Y direction, the channel semiconductor layer in which an on voltage is applied to the gate of the side of a boundary between adjacent MLRs enters an on state and the channel semiconductor layer in which an off voltage is applied enters an off state. Therefore, only one can be selected. When selection and unselection of PCM-CHAINs connected to the same MLR on MLR are changed, an on voltage and an off voltage applied for every other gate with respect to the gates in which both sides of the Y direction are interposed by the channel semiconductor layers 252p connected to adjacent MLRs with the gate insulating film therebetween may be changed. As such, even though MLR is formed over a plurality of cells in the Y direction, STTrY enabling selection of the Y direction is formed on MLR. Therefore, a trouble does not occur in a selection operation.

<Method of Feeding Individual Portions of the Divided Write Bit Lines Via Transistors>

Next, a method of reducing capacitances around BEPLATE, that is, a capacitance C(BEPLATE-SUB) between BEPLATE and the semiconductor substrate, a capacitance C(BEPLATE-STTGYL) between BEPLATE and STTGYL, and a capacitance C(BEPLATE-STTGY) between BEPLATE and STTGY illustrated in FIG. 2(b) will be described.

Reduction of the parasitic capacitance can be realized by decreasing the length of an extension direction of BEPLATE. However, because a power source circuit (Power Source) needs to be arranged whenever BEPLATE is cut in the Y direction, there is a problem in that a chip area, that is, a cost increases. As a method for resolving the problem, a method of dividing BEPLATE in the Y direction as well as dividing BEPLATE in the X direction as illustrated in FIG. 2(a), and feeding BEPLATE using a wiring line PWL provided on BEPLATE and having a low resistance and a small parasitic capacitance is considered. Because the resistance of PWL can be decreased using a copper wiring line and PWL can be formed on an upper layer separated from a gate around the semiconductor substrate 1 and PCMCHAIN, the parasitic capacitance can be decreased.

Figure 19:
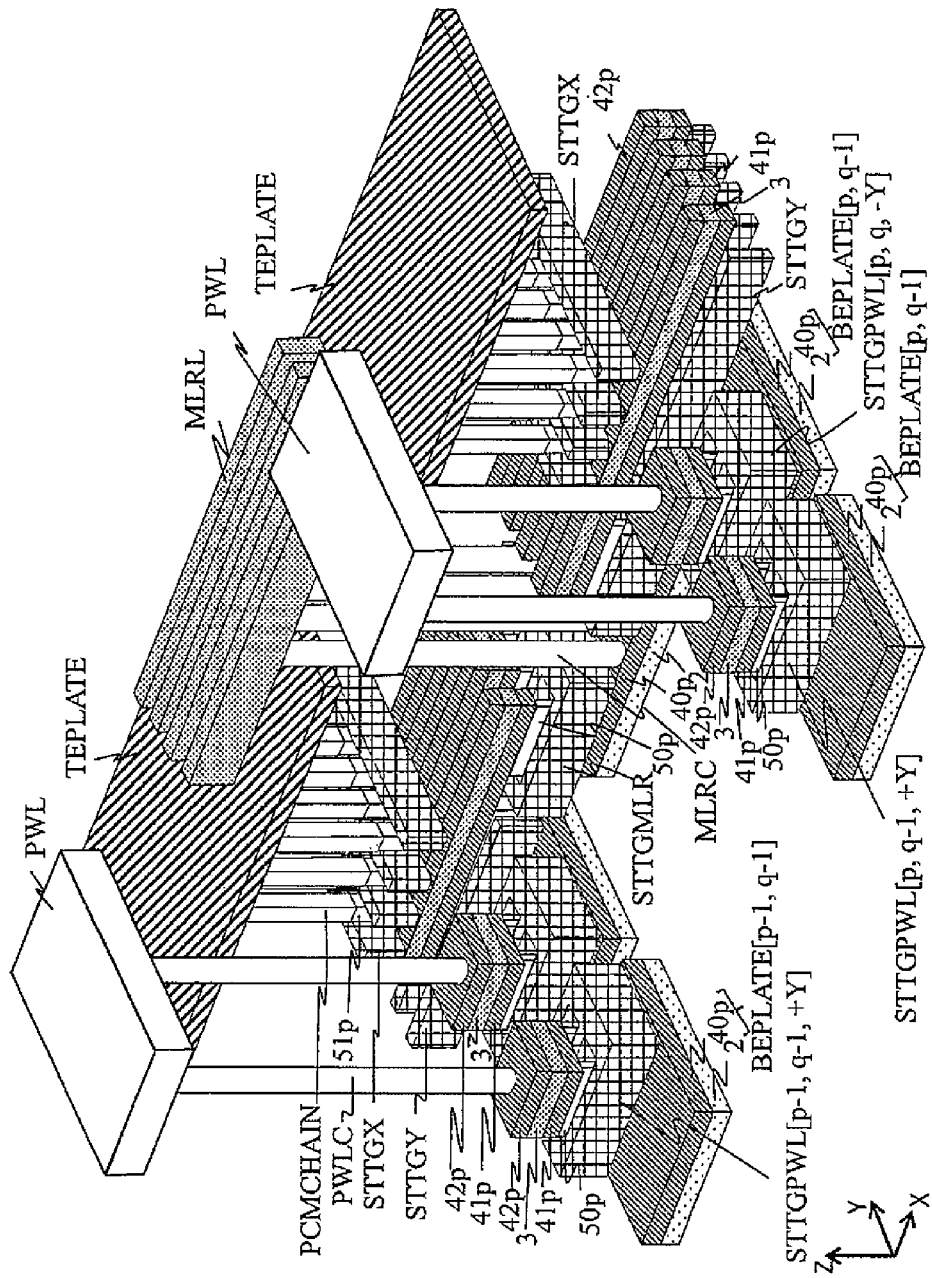
FIG. 19 is a partial three-dimensional schematic diagram of the semiconductor storage device according to the second embodiment of the present invention.

PWL and BEPLATE are connected via a transistor STTrPWL formed on BEPLATE, as illustrated in FIG. 19. PWL and BEPLATE can be directly connected without using the transistor such as STTrPWL. However, PWL and BEPLATE are connected via STTrPWL, only STTrPWL on BEPLATE selected at the time of the reset operation and the set operation is turned on, and the other STTrPWLs are turned off, so that feeding can be performed from PWL to only BEPLATE to which SELARRAY is connected. Because fed BEPLATE can be divided in the Y direction in addition to the X direction, an area is small and all of C(BEPLATE-SUB), C(BEPLATE-STTGYL), and C(BEPLATE-STTGY) can be reduced as compared with the case of FIG. 2(a).

At the time of the collective set operation, in addition to BEPLATE including a selection cell SMC, BEPLATE not including a plurality of selection cells adjacent to each other in the X direction is fed from PWL via STTrPWL, STTrY on fed BEPLATE and STTrMLR between BEPLATEs are turned on, BEPLATEs are electrically connected, the large current for the collective set is flown through a plurality of BEPLATEs arranged in the X direction. As a result, the voltage drop by the parasitic capacitance RBEPLATE of BEPLATE can be suppressed, similar to the first embodiment.

FIG. 19 will be described in detail. For connection of the X direction of the read bit line, a structure using the same method as the method of FIG. 14 is illustrated. That is, the structure in which MLRL and MLR on BEPLATE [p, q] are connected in a one-to-one relation via STTrMLR[p, q, −X] and MLRL and MLR on BEPLATE[p−1, q] are connected in a one-to-one relation via STTrMLR[p−1, q, +X] is illustrated. In FIG. 19, in addition to the above structure, BEPLATE is separated in the Y direction and each separated BEPLATE is fed from PWL via STTrPWL and PWLC. The transistor STTrPWL uses 50p as a channel semiconductor layer, uses one of a source and a drain as 40p, and uses the other as 41p, similar to the Y selection transistor STTrY. Electrodes 3 and 42p are formed on 41p. PWC reaching a lamination structure including 42p, 3, and 41p is formed and is connected to PWL. Individual STTrPWLs can be collected partially and can be commonly controlled. However, independent ON/OFF control can be executed on STTrPWLs. In addition, STTrPWLs illustrated in FIG. 19 can be formed on both the +Y side and the −Y side of each BEPLATE and can be fed from PWL. Or, STTrPWL can be formed on the single side and can be fed from PWL.

Figure 20:
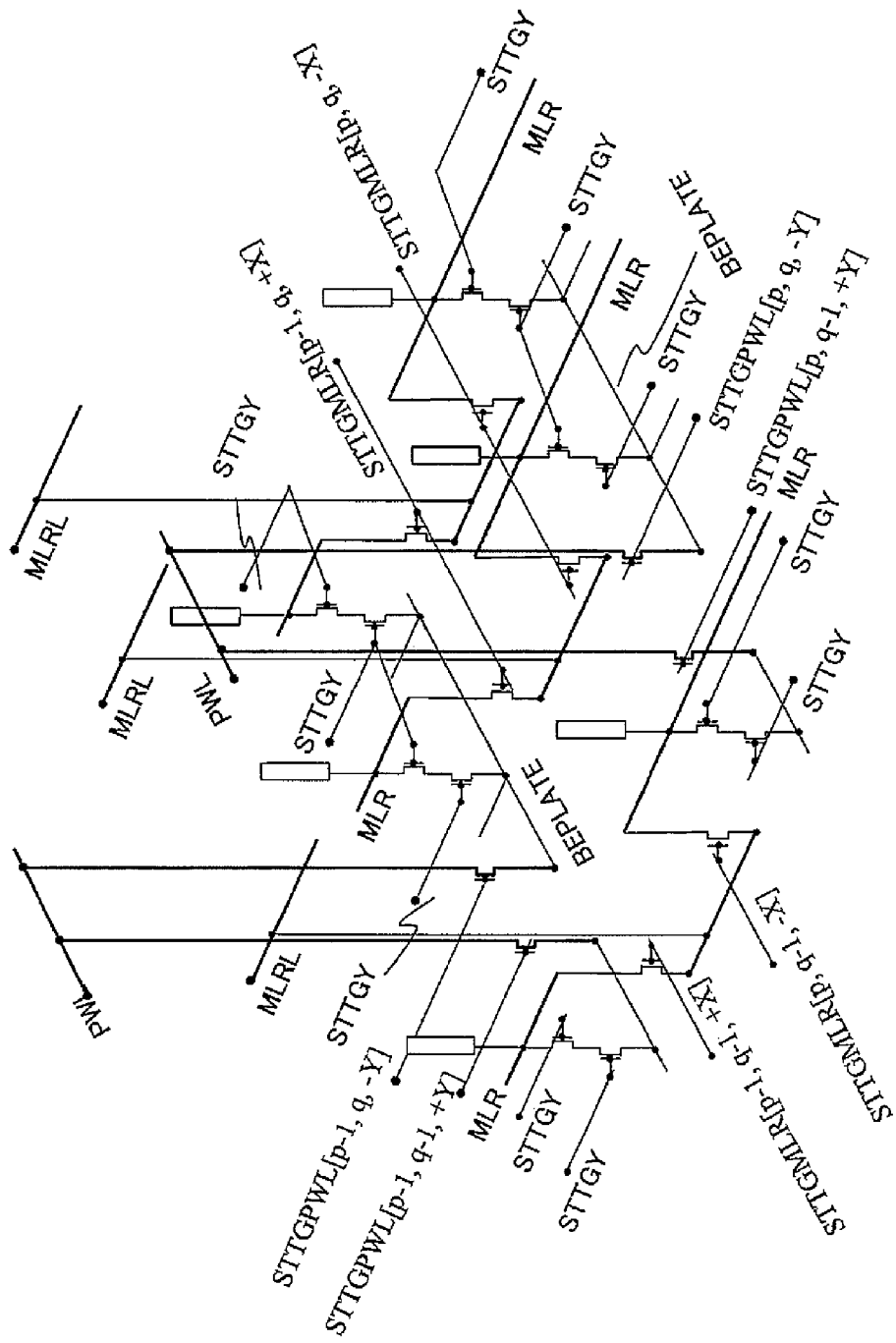
FIG. 20 is an equivalent circuit diagram of the semiconductor storage device according to the second embodiment of the present invention.

FIG. 20 illustrates structures of MLR, MLRL, STTrMLR, BEPLATE, PWL, and STTrPWL of FIG. 19 by an equivalent circuit. The case in which MLRL and MLR on BEPLATE [p] are connected in a one-to-one relation via STTrMLR[p, −X] and MLRL and MLR on BEPLATE[p−1] are connected in a one-to-one relation via STTrMLR[p−1, +X] is illustrated. In addition, the case in which feeding is performed from PWL to BEPLATE via STTrPWL is illustrated.

Figure 21:
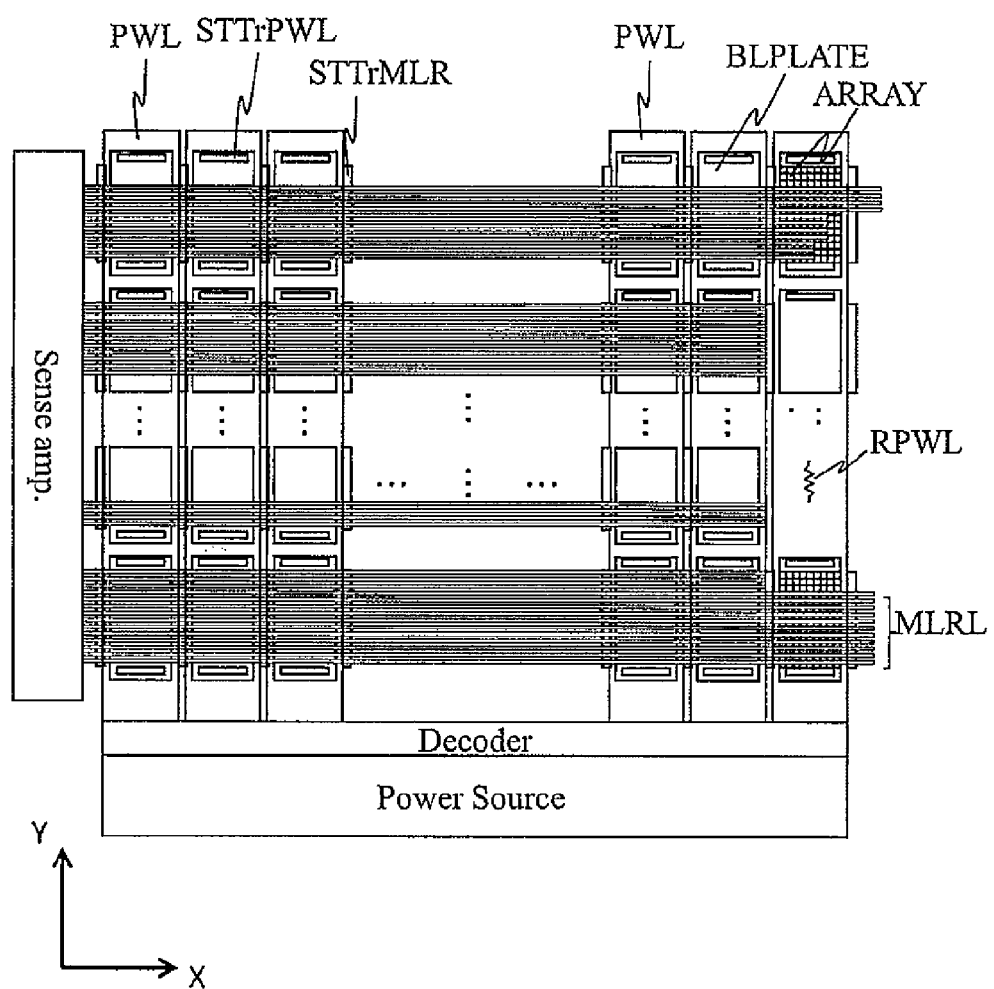
FIG. 21 is a partial plan view of the semiconductor storage device according to the second embodiment of the present invention.

FIG. 21 is a partial plan view of the semiconductor storage device of FIGS. 19 and 20. The lower electrode pattern BEPLATE is separated in the Y direction in addition to the X direction, as described above. Feeding is performed from PWL in which the parasitic resistance RPWL is small via STTrPWL at the end of the Y direction of each BEPLATE. The read bit line MLR extends in the X direction and is connected to MLRL via STTrMLR at the end of BEPLATE. MLRL extends in the X direction and is connected to Sense amp. to perform read.

<Method of Arranging Selection Transistors on Both Sides of Memory Chain>

Figure 17:
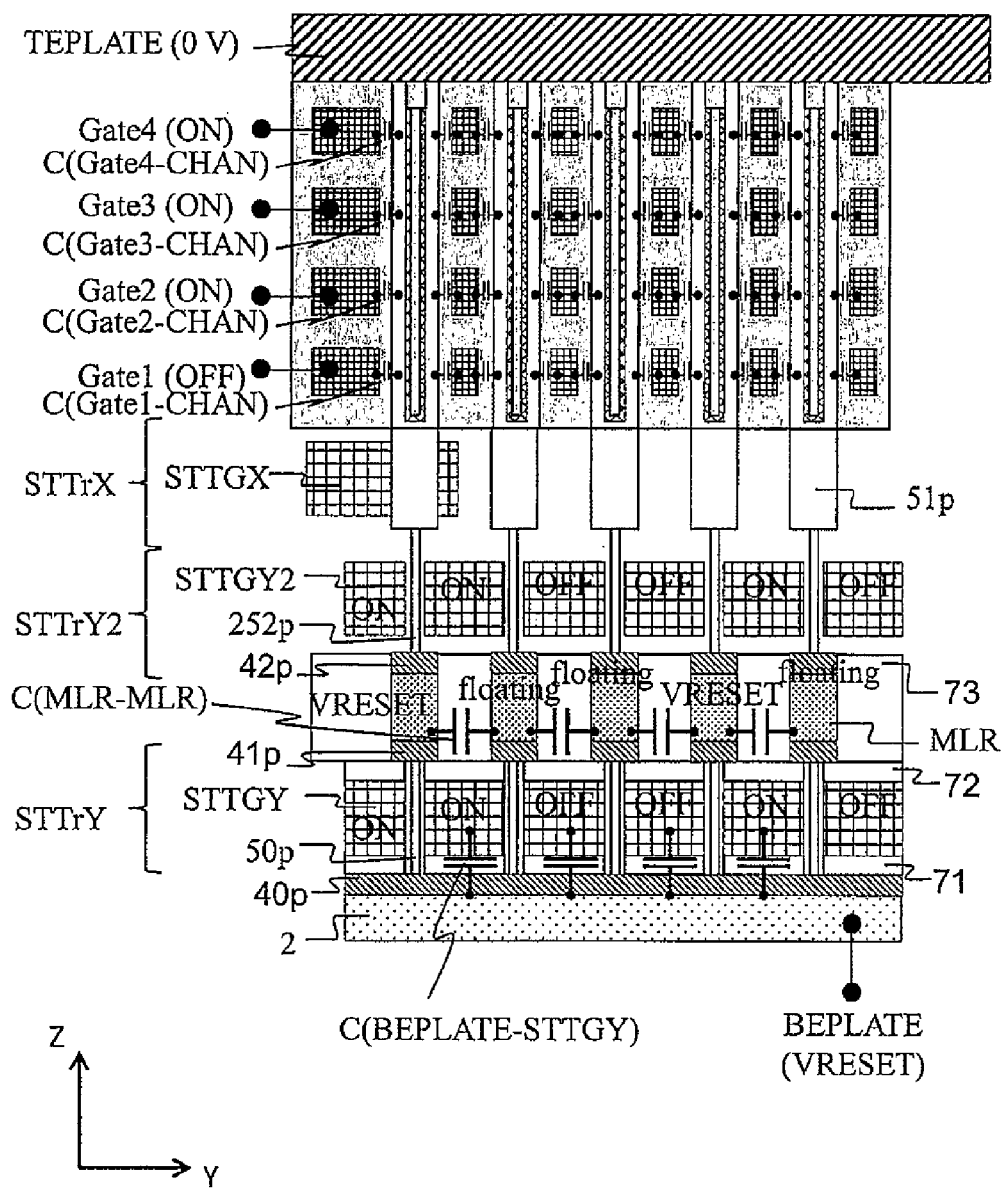
FIG. 17 is a partial cross-sectional view of the semiconductor storage device according to the second embodiment of the present invention and a diagram illustrating a capacitance between electrodes.
Figure 22:
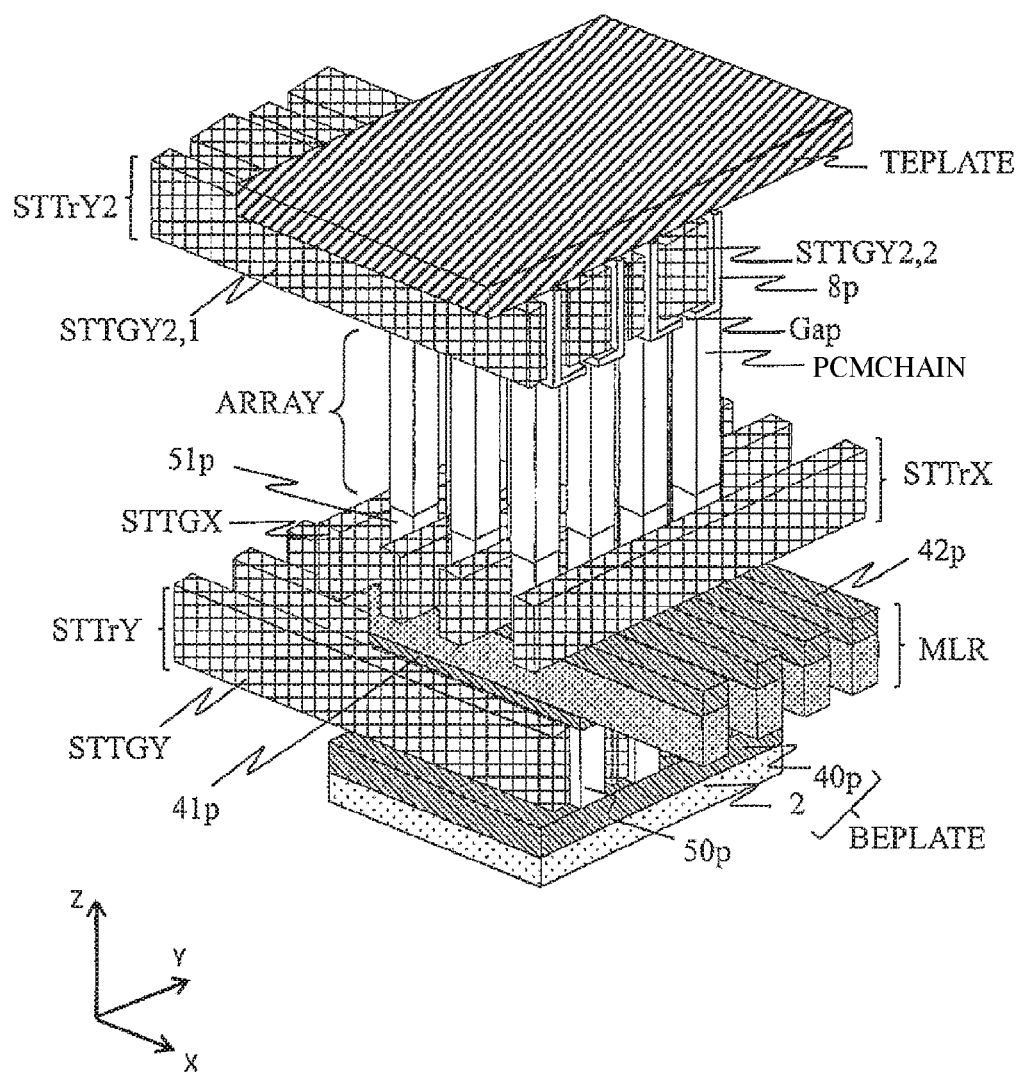
FIG. 22 is a partial three-dimensional schematic diagram of the semiconductor storage device according to the second embodiment of the present invention.
Figure 23:
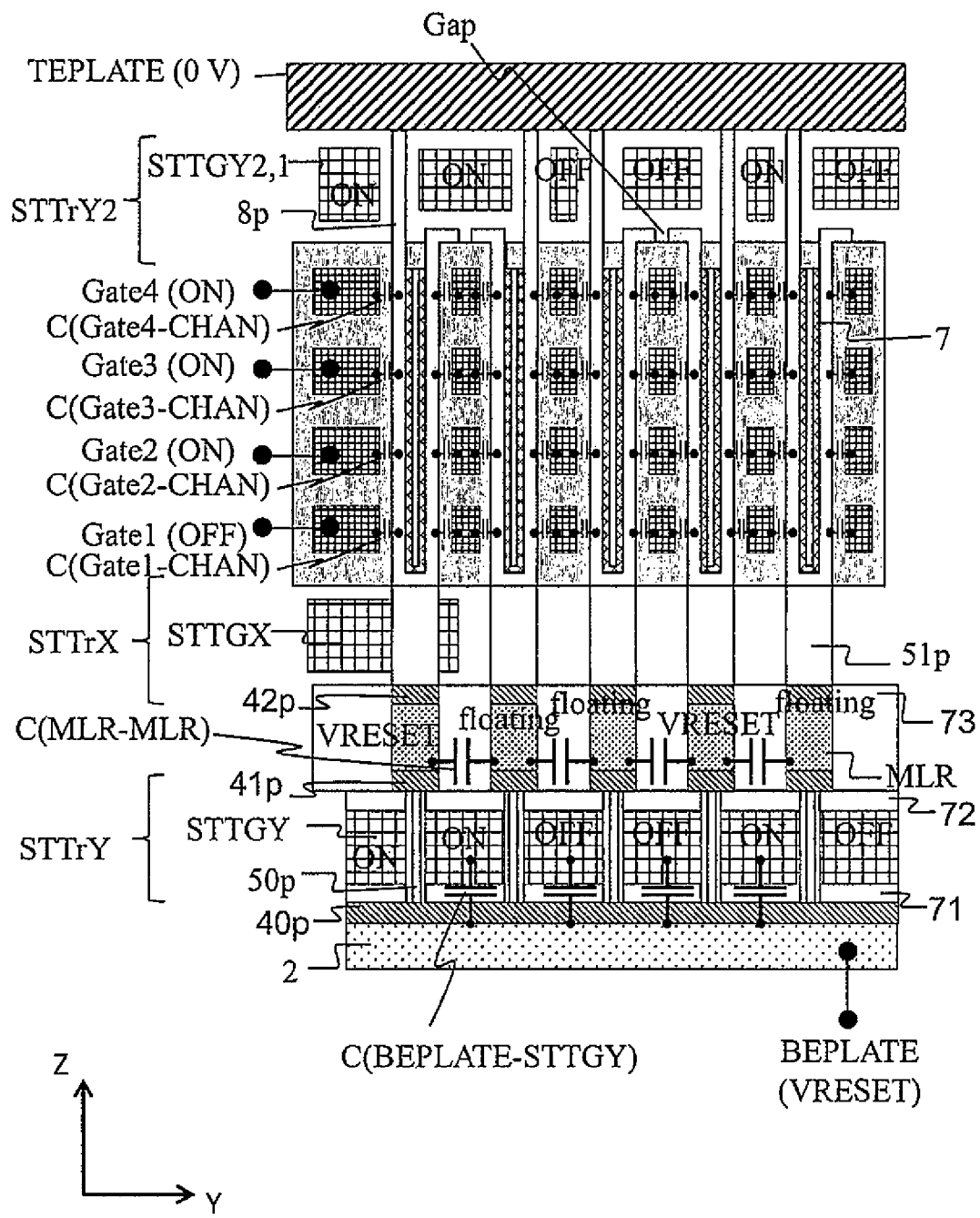
FIG. 23 is a partial cross-sectional view of the semiconductor storage device according to the second embodiment of the present invention and a diagram illustrating a capacitance between electrodes.

In FIGS. 16 and 17, STTrY2 is formed on a boundary of MLR and STTrX in addition to STTrY between MLR and BEPLATE and the charge/discharge of C(MLR-MLR) at the time of the reset operation is suppressed. However, as illustrated in FIG. 22, STTrY2 can be formed on an upper end of PCMCHAIN. The structure of FIG. 22 is different from the structure of FIG. 3 in that STTrY2 is formed on the upper end of PCMCHAIN. FIG. 23 is a cross-sectional view from the Y-Z plane of ARRAY of FIG. 22.

A transistor STTrY2 having the same structure as the structure of the Y selection transistor STTrY connecting MLR and BEPLATE below MLR is provided on PCMCHAIN. As illustrated in the cross-sectional view of FIG. 23, ON/OFF of STTrY and STTrY2 of places where the Y coordinates are the same are operated commonly. As a result, because all STTrY, STTrX, and STTrY2 are turned on, MLR to which SPCMCHAIN is connected at the time of the reset operation can flow a current along a path reaching from BEPLATE to a selection cell SMC of SPCMCHAIN, STTrY2, and TEPLATE via STTrY, MLR, and STTrX and can operate SMC.

Meanwhile, because STTrY is turned off, MLR to which SPCMCHAIN is not connected is insulated from BEPLATE. Also, because STTrY2 is turned off, MLR is insulated from TEPLATE. That is, MLR to which SPCMCHAIN is not connected and PCMCHAIN connected to MLR enter a floating state. For this reason, it is possible to reduce a charge charged/discharged in C (MLR-MLR) at the time of the reset operation and it is possible to suppress C(Gate1-CHAN), C(Gate2-CHAN), C(Gate3-CHAN), and C(Gate4-CHAN) from being charged/discharged from TEPLATE, when a voltage is applied to Gate1 to Gate4 to perform selection of the Z direction of the memory cell.

Technology for forming STTrY2 on PCMCHAIN is also disclosed in PTL 4. However, in the related art, it is difficult to form STTrY2 on an upper end of PCMCHAIN at the same high-density pitch as the Y selection transistor STTrY according to the second embodiment in which gates are arranged on both sides of a channel and the pitch is reduced. If STTrY2 in which the pitch is widened is formed on the upper end of PCMCHAIN, PCMCHAIN needs to be formed at the same pitch. For this reason, a storage capacity decreases and a bit cost increases.

Meanwhile, if STTrY2 of the same pitch as STTrY illustrated in FIG. 22 is manufactured on PCMCHAIN using the related art, STTrY2 is manufactured after PCMCHAIN using the phase change material is manufactured, so that the phase change material cannot endure a thermal load of a manufacturing process of STTrY2 using polysilicon.

A new selection transistor formation method to resolve the above problem will be described using FIGS. 24 to 29.

Figure 24:
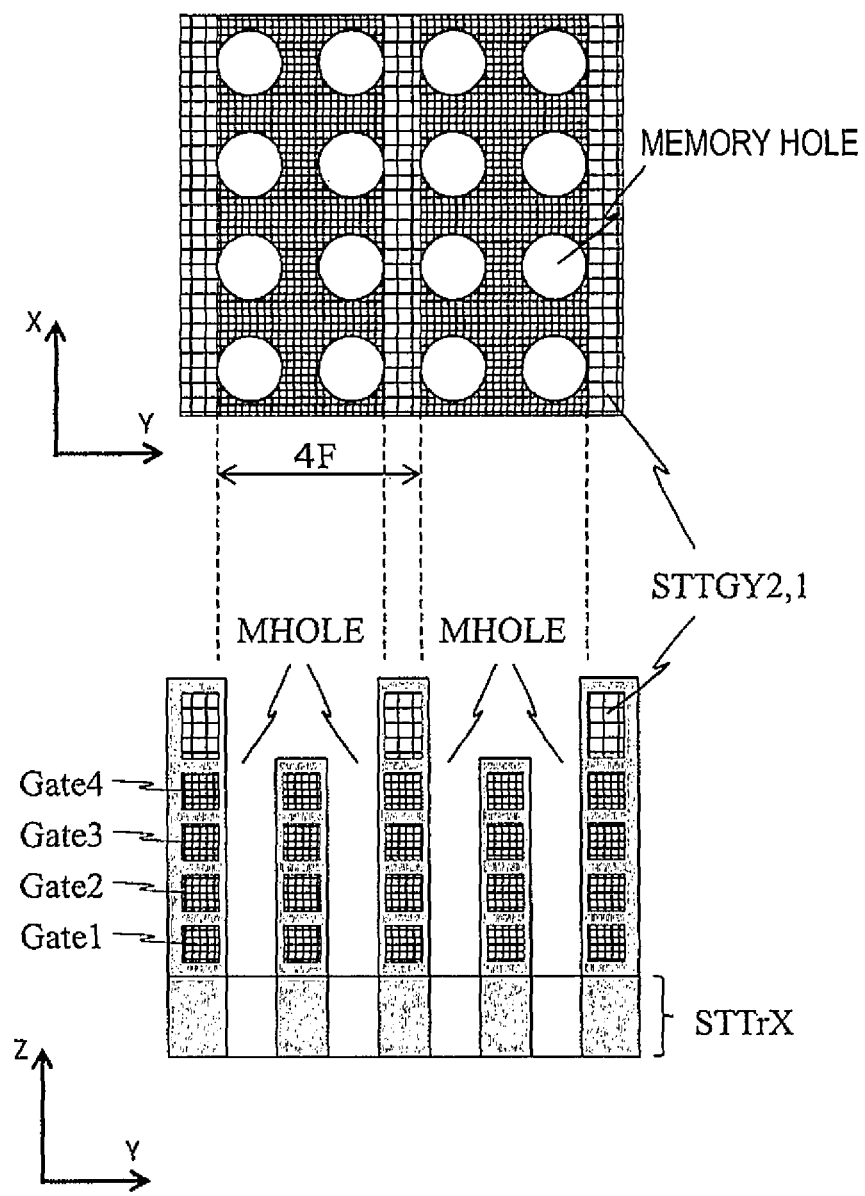
FIG. 24 is a partial plan view and a partial cross-sectional view illustrating a method of manufacturing the semiconductor storage device according to the second embodiment of the present invention.

First, a lamination gate becoming a memory cell gate of PCMCHAIN is formed on the semiconductor substrate formed to the X selection transistor STTrX and a conductive layer becoming a first gate STTGY2,1 of the selection transistor STTrY2 is formed thereon. Then, a step of performing patterning of STTGY2, 1 and processing of a memory hole MHOLE and forming a gate insulating film is illustrated in FIG. 24. A plan view viewed from the X-Y plane and a cross-sectional view viewed from the Y-Z plane are illustrated.

Figure 25:
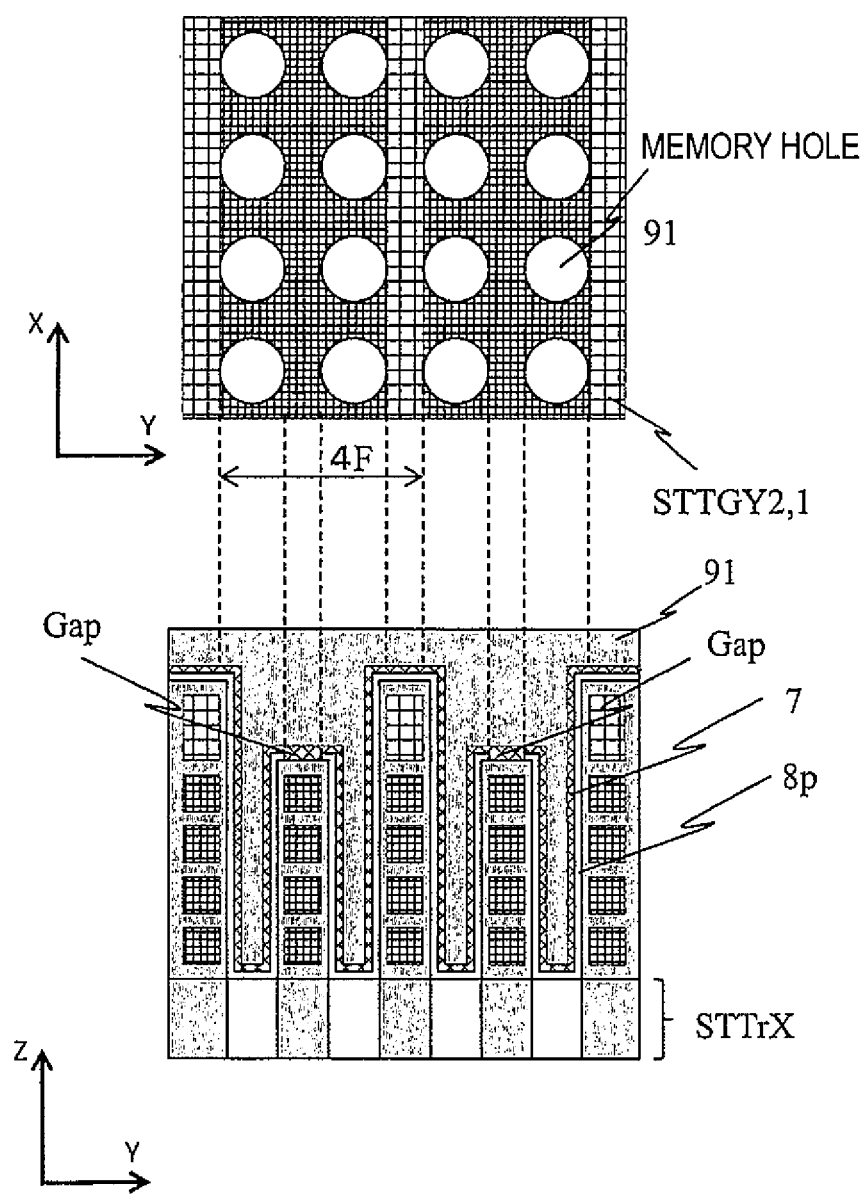
FIG. 25 is a partial plan view and a partial cross-sectional view illustrating a method of manufacturing the semiconductor storage device according to the second embodiment of the present invention.
Figure 26:
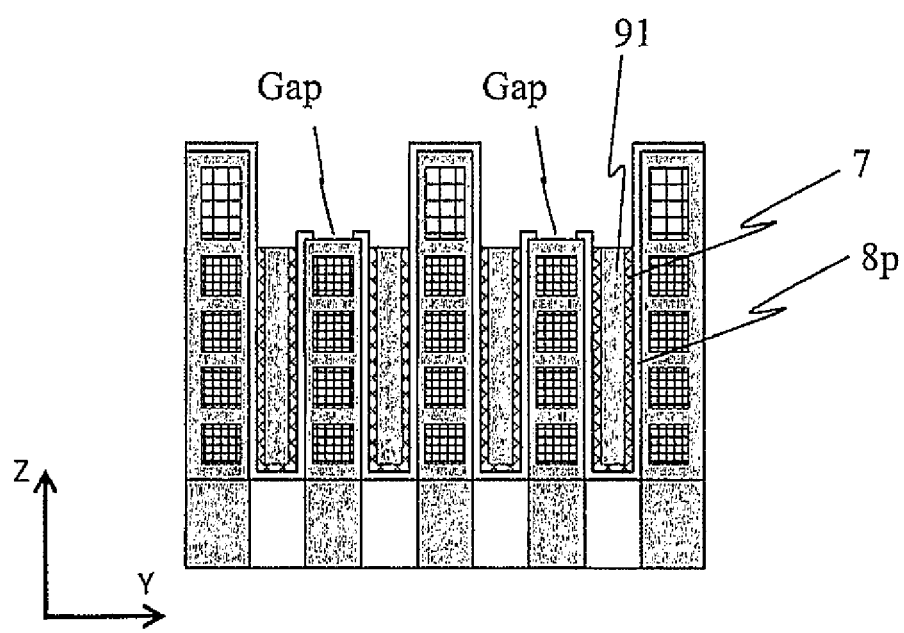
FIG. 26 is a partial cross-sectional view illustrating a method of manufacturing the semiconductor storage device according to the second embodiment of the present invention.
Figure 27:
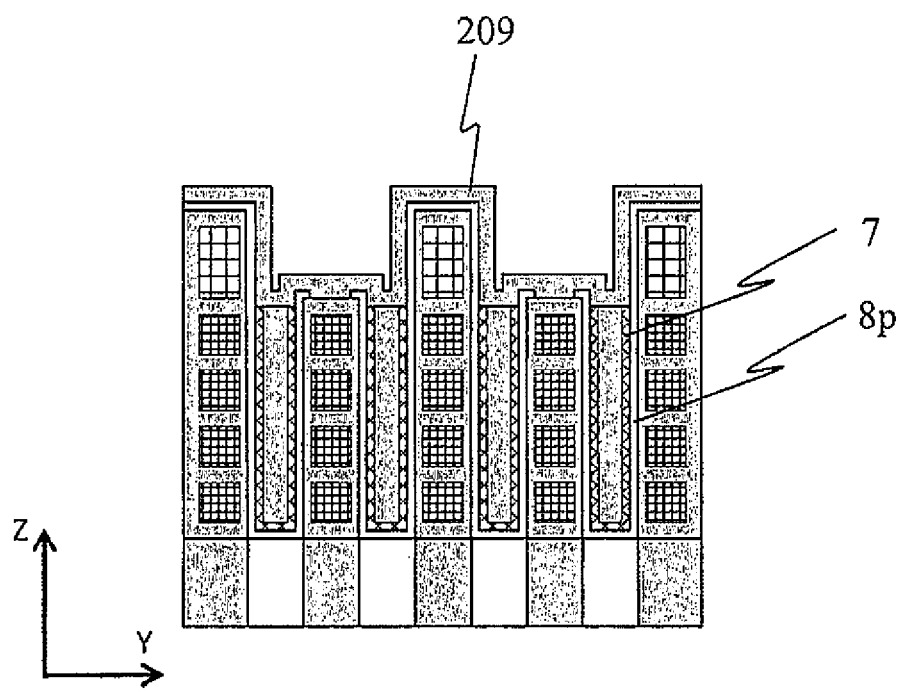
FIG. 27 is a partial cross-sectional view illustrating a method of manufacturing the semiconductor storage device according to the second embodiment of the present invention.
Figure 28:
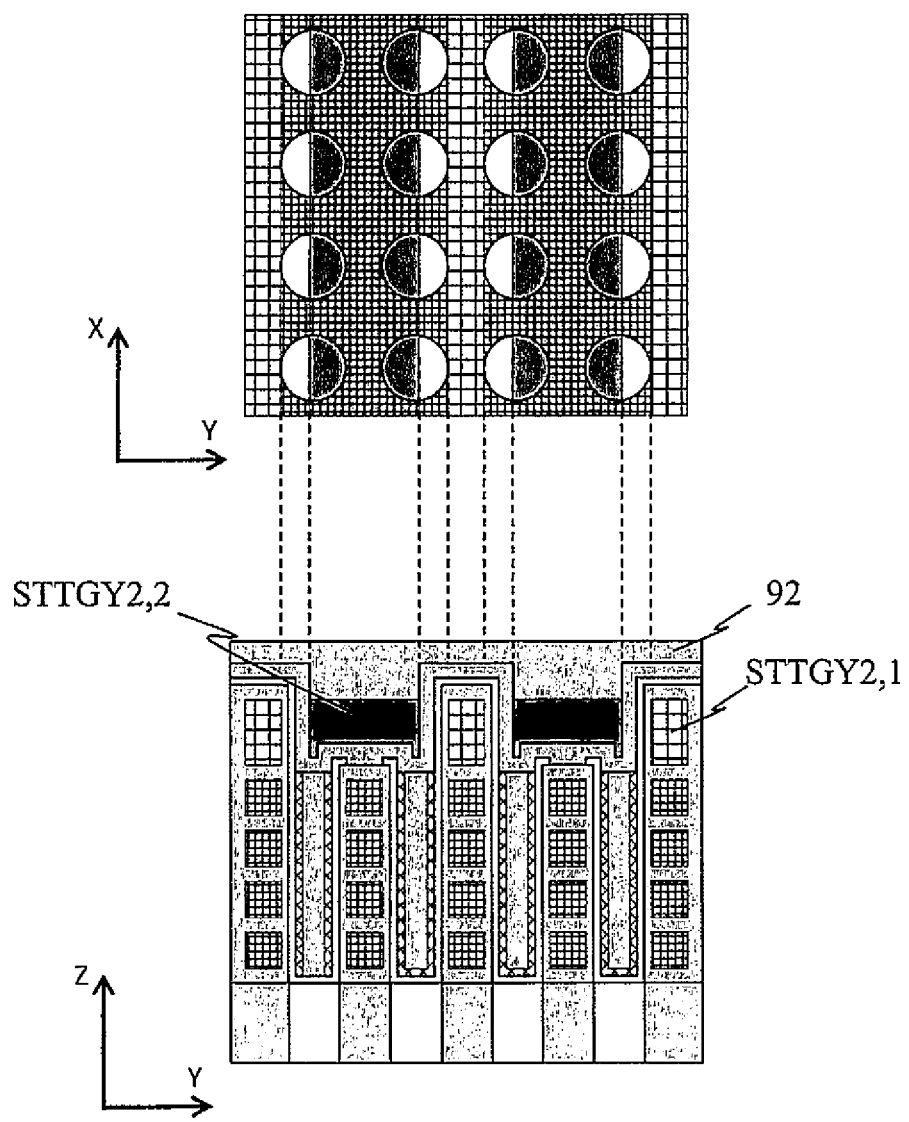
FIG. 28 is a partial plan view and a partial cross-sectional view illustrating a method of manufacturing the semiconductor storage device according to the second embodiment of the present invention.
Figure 29:
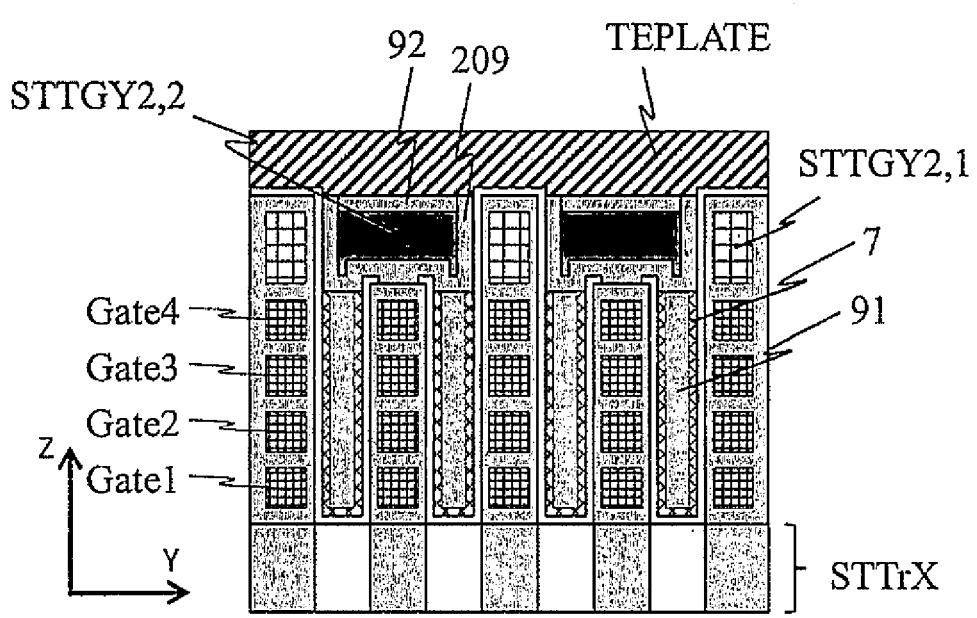
FIG. 29 is a partial cross-sectional view illustrating a method of manufacturing the semiconductor storage device according to the second embodiment of the present invention.

Next, after a channel semiconductor layer 8$p$ is formed, a separation unit Gap is formed in the channel semiconductor layer 8$p$. The separation unit Gap is formed to extend in the X direction and completely separates the channel semiconductor layer 8$p$ in the Y direction in the ARRAY unit. Next, after a phase change material film 7 is formed, MHOLE is buried with an insulating film 91 (FIG. 25). Next, the separation unit Gap of the channel semiconductor layer 8$p$ is exposed by removing upper portions of the insulating film 91 and the phase change material 7 by etch-back, for example (FIG. 26). Next, a second gate insulating film 209 is formed (FIG. 27). Next, after a material becoming a second gate STTGY2,2 of the selection transistor STTrY2, for example, titanium nitride is formed, a top surface is removed, the titanium nitride is separated in the Y direction, and an insulating film 92 is formed (FIG. 28). After a top surface of the insulating film 92 is removed and a top surface of the channel semiconductor layer 8$p$ is exposed, a plate-like electrode TEPLATE is formed to contact 8. As such, the channel semiconductor layer 8$p$ is used commonly by a channel of a cell transistor of the memory cell and a channel of STTrY2, so that the channel semiconductor layer 8$p$ can be formed before the film of the phase change material is formed. In addition, both sides of the X direction of the channel semiconductor layer 8$p$ of STTrY2 can face two gates STTGY2,1 and STTGY2,2 with the gate insulating film therebetween and the selection transistor of the same pitch as STTrY can be formed.

Figure 30:
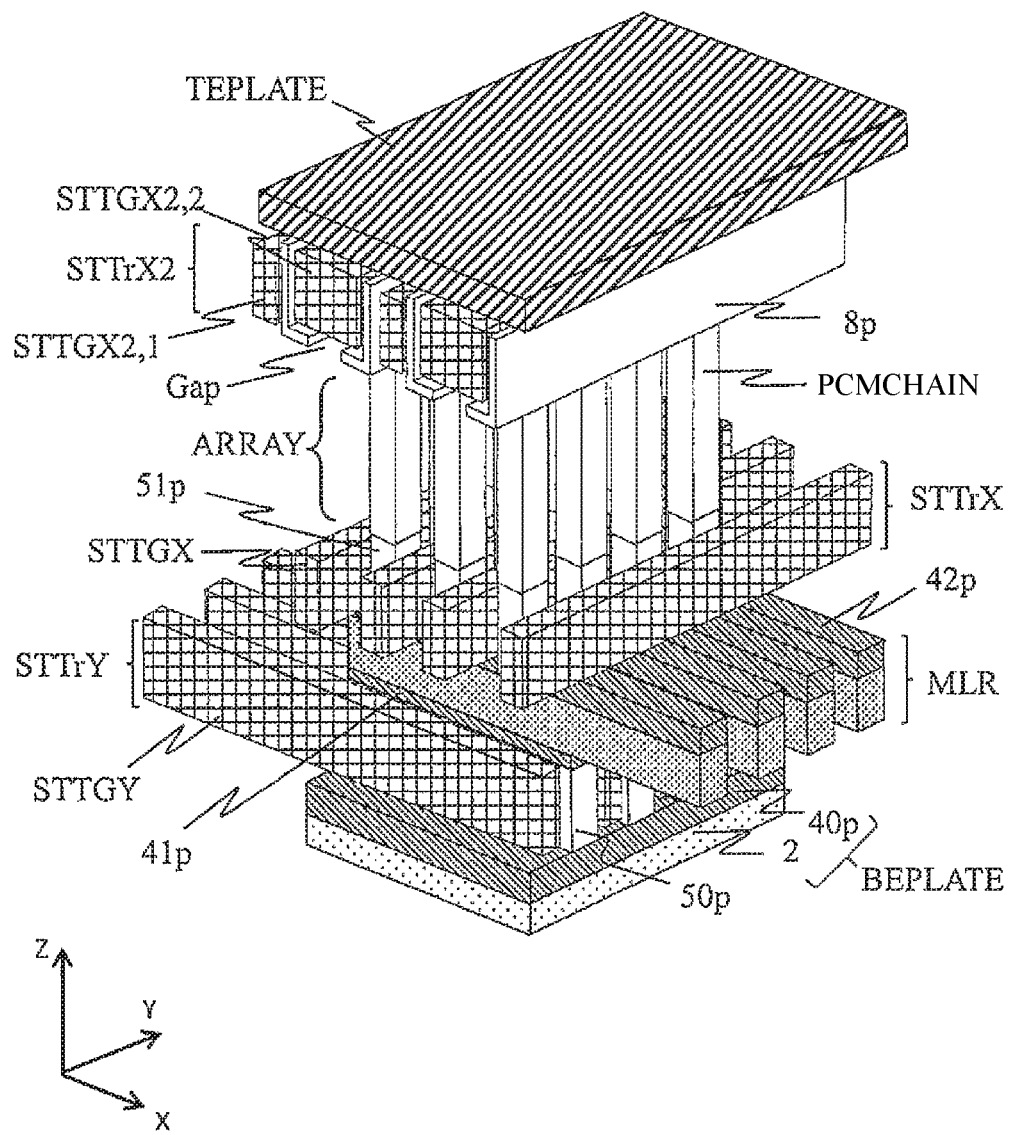
FIG. 30 is a partial three-dimensional schematic diagram of the semiconductor storage device according to the second embodiment of the present invention.
Figure 31:
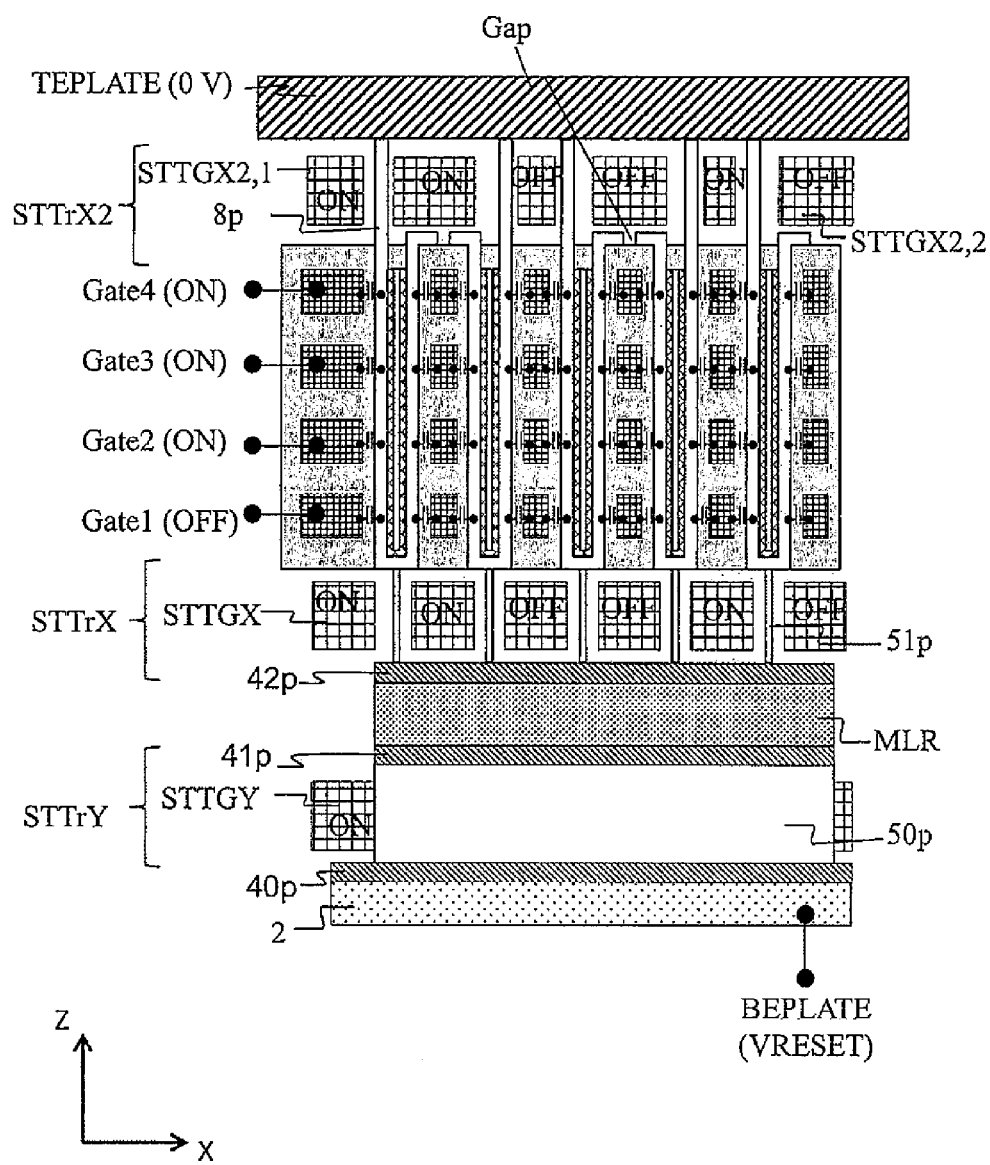
FIG. 31 is a partial cross-sectional view of the semiconductor storage device according to the second embodiment of the present invention and a diagram illustrating a capacitance between electrodes.

In FIGS. 21 and 22, the Y selection transistor STTrY2 in which the gate extends in the X direction is formed on the upper end of PCMCHAIN and ON/OFF of STTrY and STTrY2 of places where the Y coordinates are the same are operated commonly, so that the charge/discharge of C (MLR-MLR), C(Gate1-CHAN), C(Gate2-CHAN), C(Gate3-CHAN), and C(Gate4-CHAN) at the time of the reset operation and the set operation is suppressed. However, the selection transistor on PCMCHAIN can be used as the X selection transistor in which the gate extends in the Y direction, as illustrated in FIG. 30. FIG. 30 is different from FIG. 3 in that STTrX2 is formed on the upper end of PCMCHAIN. FIG. 31 is a cross-sectional view from the Y-Z plane of ARRAY of FIG. 30. As illustrated in FIG. 31, ON/OFF of STTrX and STTrX2 of places where the X coordinates are the same are operated commonly. As a result, because all STTrY, STTrX, and STTrX2 are turned on, MLR to which SPCMCHAIN is connected at the time of the reset operation can flow a current along a path reaching from BEPLATE to a selection cell SMC of SPCMCHAIN, STTrX2, and TEPLATE via STTrY, MLR, and STTrX and can operate SMC. Meanwhile, in a chain in which the X coordinates are not selected, because TEPLATE and PCMCHAIN are insulated by STTrX2, 0 V can be suppressed from being supplied from TEPLATE. As a result, the charge/discharge of C(Gate1-CHAN), C(Gate2-CHAN), C(Gate3-CHAN), and C(Gate4-CHAN) can be suppressed. A manufacturing method of STTrX2 is the same as the manufacturing method of STTrY2 described in FIGS. 24 to 29.

As described above, in the semiconductor storage device according to the second embodiment, consumption of energy by the charge/discharge of the parasitic capacitance at the time of the reset operation and the set operation can be suppressed. Therefore, performances of the reset operation and the set operation can be improved.

Third Embodiment

In the first and second embodiments, the performance of the memory cell having the structure in which the transistor and the phase change memory are connected in parallel is improved by reduction of the resistance of the electrode wiring line and suppression of the charge/discharge of the parasitic capacitance. However, the same method is applicable to other types of memory cells and is effective.

Figure 32:
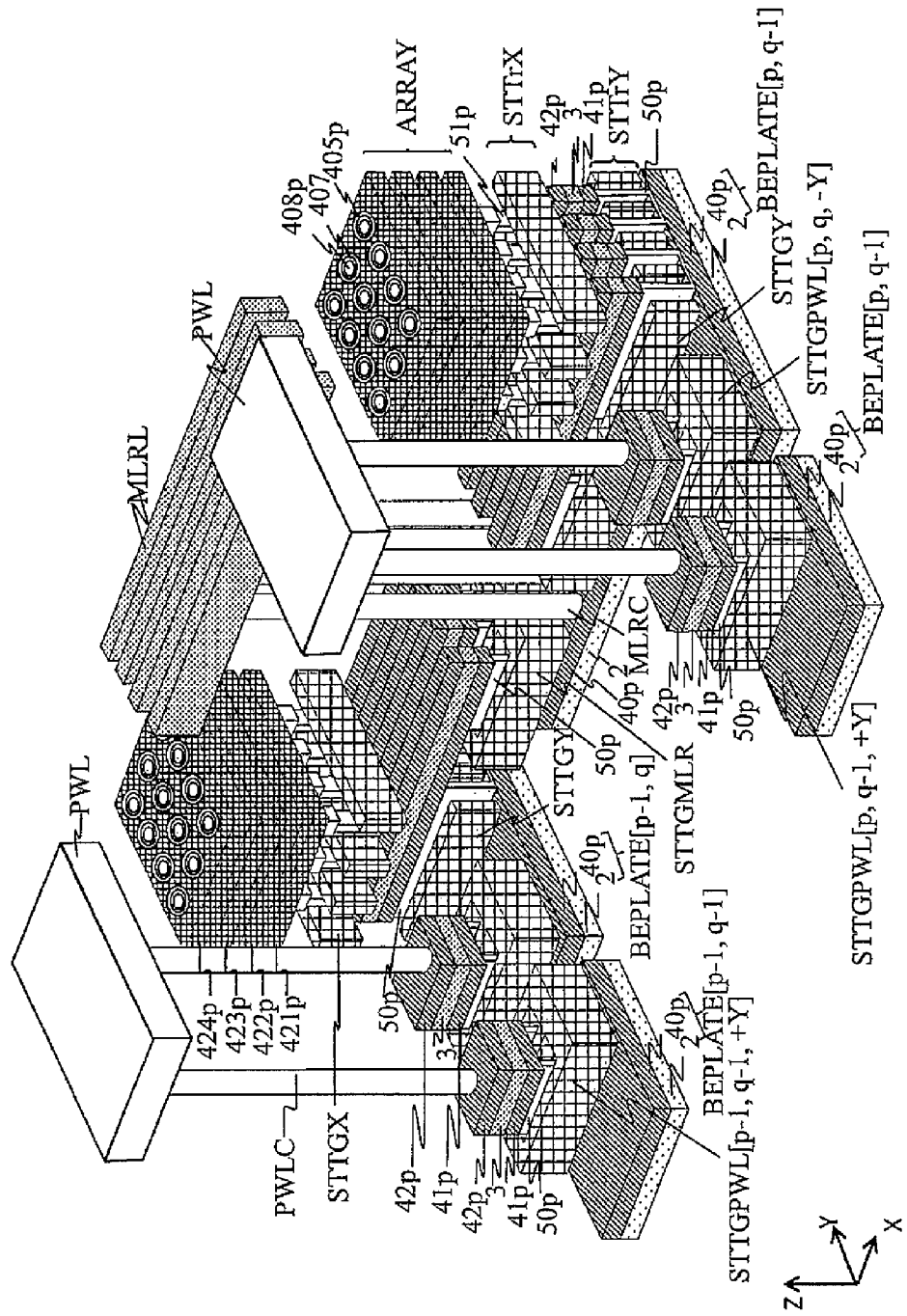
FIG. 32 is a partial three-dimensional schematic diagram of a semiconductor storage device according to a third embodiment of the present invention.

In a third embodiment, the same method is applied to an intersection-type memory of a 1D-1R type (D: Diode and R: Resistor) in which a memory cell has a diode and a resistance change memory connected in series. FIG. 32 is a partial three-dimensional schematic diagram of a semiconductor storage device according to the third embodiment. A structure other than a portion of ARRAY is the same as the structure of FIG. 19. BEPLATE is separated in X and Y directions. PWL and BEPLATE are connected via a transistor STTrPWL formed on BEPLATE. PWL and BEPLATE are connected via STTrPWL, only STTrPWL on BEPLATE selected at the time of a reset operation and a set operation is turned on, and the other STTrPWLs are turned off, so that only BEPLATE to which selection ARRAY is connected is fed from PWL. Because fed BEPLATE can be divided in the Y direction in addition to the X direction, an area is small and all C(BEPLATE-SUB), C(BEPLATE-STTGYL), and C(BEPLATE-STTGY) can be reduced.

At the time of a collective set operation, a plurality of BEPLATEs adjacent in the X direction are fed from PWL via STTrPWL, STTrY on fed BEPLATE and STTrMLR between BEPLATEs are turned on, BEPLATEs are electrically connected, and a large current for the collective set is flown through the plurality of BEPLATEs arranged in the X direction, so that a voltage drop by the parasitic capacitance RBEPLATE of BEPLATE can be suppressed, similar to the case of the first embodiment or the case of the second embodiment illustrated in FIG. 19.

The case in which MLRL and MLR on BEPLATE[p, q] are connected in a one-to-one relation via STTrMLR[p, q, −X] and MLRL and MLR on BEPLATE[p−1, q] are connected in a one-to-one relation via STTrMLR[p−1, q, +X] is illustrated. BEPLATE is separated in the Y direction and each separated BEPLATE is fed from PWL via STTrPWL and PWLC. The transistor STTrPWL uses 50$p$ as a channel semiconductor layer, uses one of a source and a drain as 40$p$, and uses the other as 41$p$, similar to the Y selection transistor STTrY. Electrodes 3 and 42$p$ are formed on 41$p$. PWC reaching a lamination structure including 42$p$, 3, and 41$p$ is formed and is connected to PWL. Individual STTrPWLs can be collected partially and can be commonly controlled. However, independent ON/OFF control can be executed on STTrPWLs. In addition, STTrPWLs illustrated in FIG. 32 can be formed on both the +Y side and the −Y side of each BEPLATE and can be fed from PWL. Or, STTrPWL can be formed on the single side and can be fed from PWL.

Because structures of MLR, MLRL, STTrMLR, BEPLATE, PWL, and STTrPWL of FIG. 32 are the same as the structures of FIG. 19, an equivalent circuit is also the same as the equivalent circuit of FIG. 20 described above.

The case in which MLRL and MLR on BEPLATE[p] are connected in a one-to-one relation via STTrMLR[p, −X] and MLRL and MLR on BEPLATE[p−1] are connected in a one-to-one relation via STTrMLR[p−1, +X] is illustrated. In addition, the case in which feeding is performed from PWL to BEPLATE via STTrPWL is illustrated.

Figure 33:
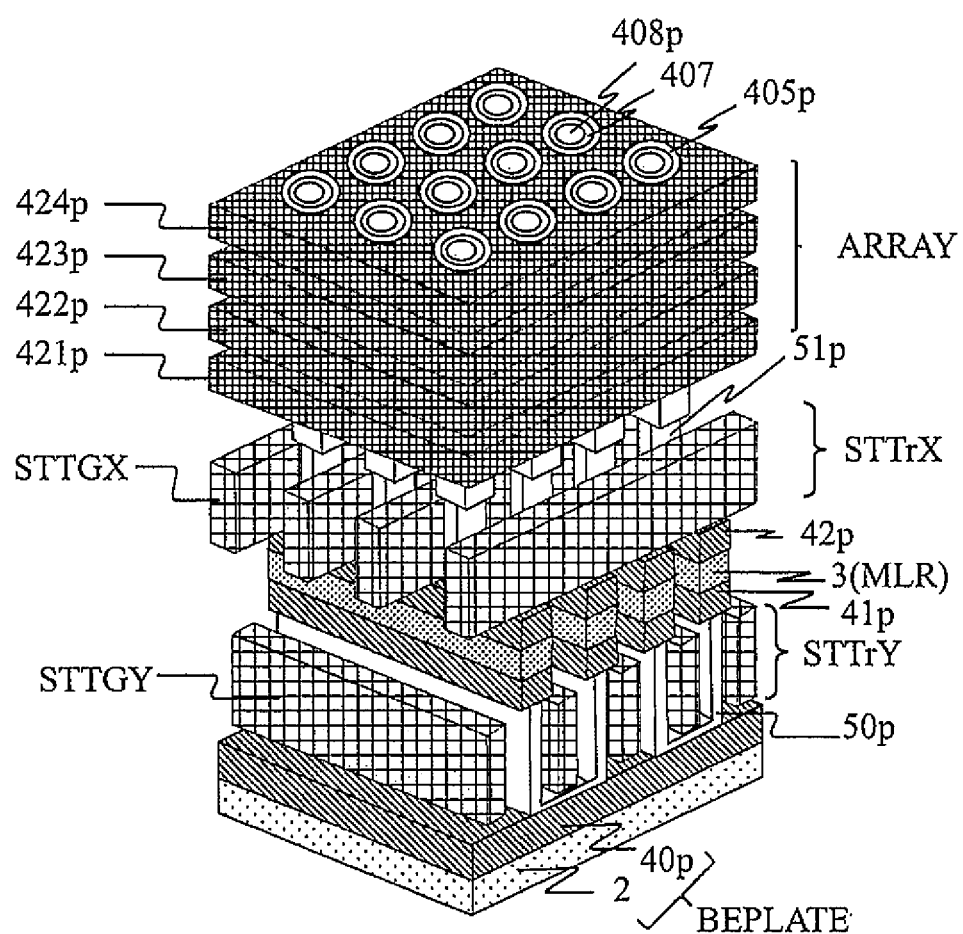
FIG. 33 is a partial three-dimensional schematic diagram of a memory array according to the third embodiment of the present invention.

FIG. 33 is a three-dimensional schematic diagram of ARRAY of a semiconductor storage device according to the third embodiment. A read bit line MLR is formed on a plate-like electrode BEPLATE including a metal film 2 and an N-type semiconductor layer 40$p$ with a selection transistor STTrY using a channel semiconductor layer as 50$p$ and using STTGY as a gate therebetween. MLR is connected to the channel semiconductor layer 50$p$ via an N-type semiconductor layer 41$p$. An X selection transistor STTrX using a channel semiconductor layer as 51$p$ and using a gate as STTGX is formed on MLR. MLR and 51$p$ are connected via an N-type semiconductor layer 42$p$. ARRAY is connected to an upper end of STTrX.

Figure 34A:
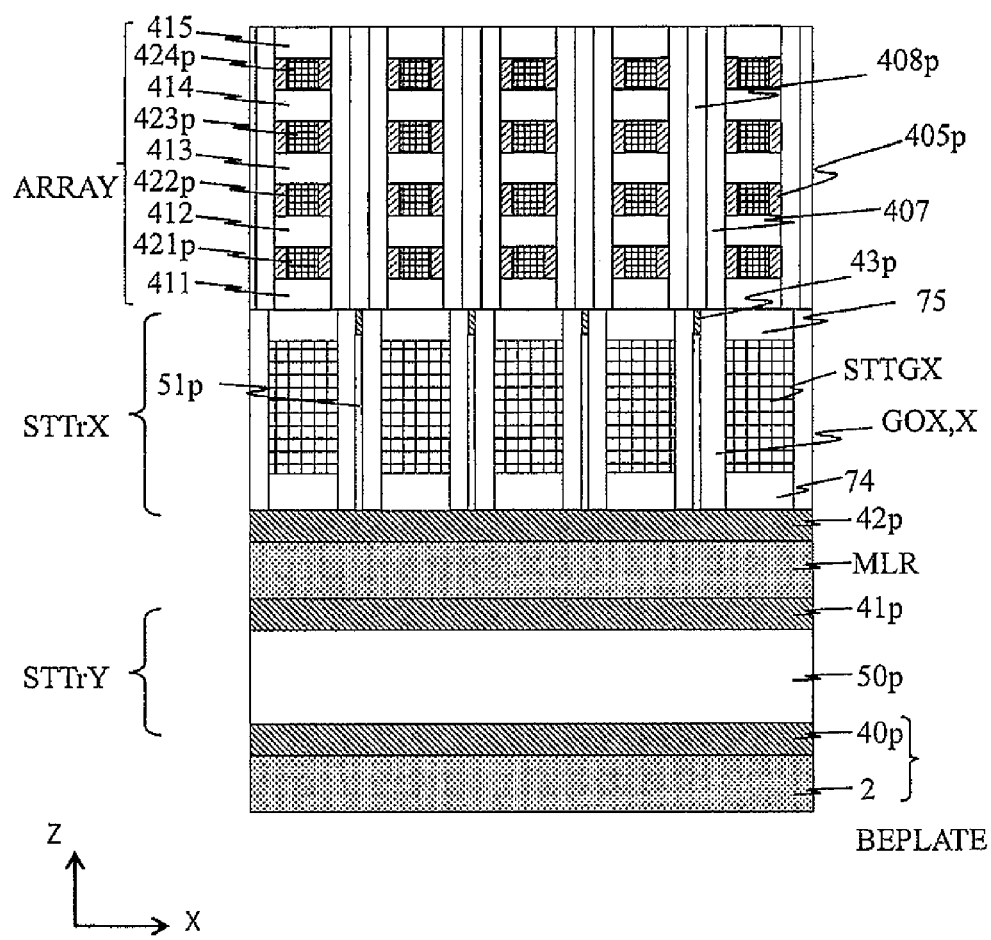
FIG. 34($a$) is a partial cross-sectional view of the memory array according to the third embodiment of the present invention.
Figure 34B:
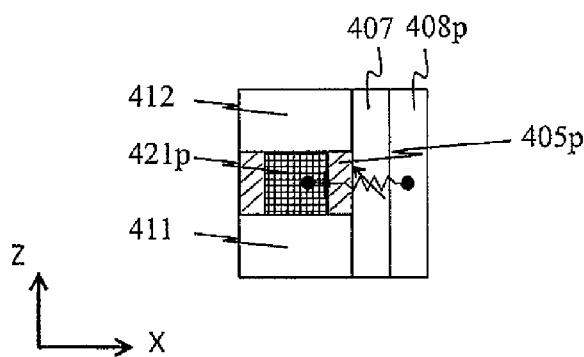

FIGS. 34($a$) and 34($b$) illustrate cross-sectional views from an X-Z plane of FIG. 33. As illustrated in FIGS. 34($a$) and 34($b$), ARRAY includes a laminate obtained by alternately laminating insulating films 411 to 415 and N-type semiconductor layers 421$p$ to 424$p$ and a conductive film layer 408$p$, a resistance change material layer 407, and a P-type semiconductor layer 405$p$ formed in a hole formed in the laminate and reaching from a top surface to an N-type semiconductor layer 43$p$ formed on the channel semiconductor layer 41$p$ of the X selection transistor. As illustrated in FIG. 34 ($b$), because the N-type semiconductor layers 421$p$ to 424$p$ and P-type semiconductor layers 405$p$ formed on sidewalls thereof form a diode, the N-type semiconductor layers 421$p$ to 424$p$ and the P-type semiconductor layers 405$p$ form a memory cell of the 1D-1R type, together with the resistance change material layer 407. In the resistance change material layer 407, a so-called non-polar type resistance change material capable of executing the set operation and the reset operation with a current of the same polarity is used.

Figure 35:
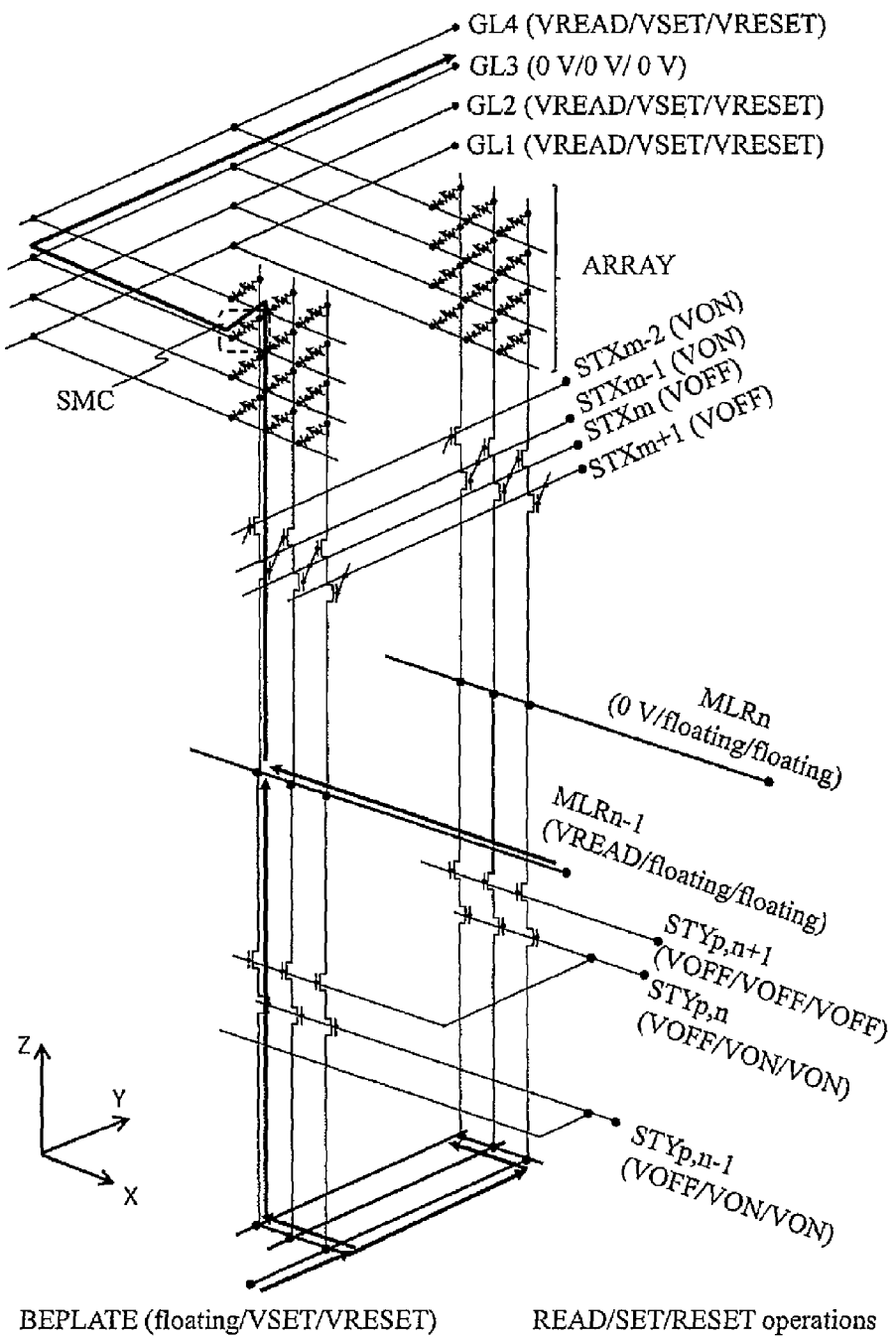
FIG. 35 is an equivalent circuit diagram illustrating read/set/reset operations of a memory cell array according to the third embodiment of the present invention.

Attention is paid to ARRAY on one BEPLATE and read/set/reset operations using one memory cell as a selection cell SMC are illustrated in FIG. 35. In the read operation, STTrX connecting the conductive layer 408$p$ to which SMC is connected to MLR is turned on and the other STTrXs are turned off. A positive voltage VREAD is applied to MLR connected to SMC via the conductive layer 408$p$ and STTrX and 0 V is applied to the other MLRs. In addition, 0 V is applied to an N-type semiconductor layer 423$p$ (GL3 in FIG. 35) to which SMC is connected and VREAD is applied to the other N-type semiconductor layers 421$p$ (GL1), 422$p$ (GL2), and 424$p$ (GL4). By setting these voltage conditions, because a potential difference between VREAD applied to MLR and 0 V applied to GL3 is applied to the selection cell in a forward bias direction of the diode, a current according to a resistance value of the resistance change material layer flows. Meanwhile, in the other unselection memory cell unit, 0 V or a voltage of a backward bias direction of the diode is applied between the side of an N-type silicon layer and the side of the conductive layer 408$p$ in the memory cell. Therefore, a current can be flown selectively by only the selection cell SMC and the current flows from MLR to which the selection cell is connected to GL3. A current value is detected by Sense amp. connected to MLR, so that the read operation is enabled.

In the set/reset operations, all MLRs are separated from Sense amp. and enter a floating state, STTrX connecting the conductive layer 408$p$ to which SMC is connected and MLR is turned on, and the other STTrXs are turned off. In addition, a Y selection transistor STTrY to which MLR connected to a selection cell SMC via the conductive layer 408$p$ and STTrX is connected is turned on and the other STTrYs are turned off. A positive voltage (VSET/VRESET) is applied to BEPLATE and 0 V is applied to the other MLRs. In addition, 0 V is applied to the N-type semiconductor layer 423$p$ (GL3 in FIG. 35) to which SMC is connected and the positive voltage (VSET/VRESET) is applied to the other N-type semiconductor layers 421$p$ (GL1), 422$p$ (GL2), and 424$p$ (GL4). By setting these voltage conditions, because a potential difference between the positive voltage (VSET/VRESET) applied to BEPLATE and 0 V applied to GL3 is applied to SMC in the forward bias direction of the diode, a current according to a resistance value of the resistance change material layer flows. Meanwhile, in the other unselection memory cell unit, 0 V or the voltage of the backward bias direction of the diode is applied between the side of the N-type silicon layer and the side of the conductive layer 408$p$ in the memory cell. Therefore, a current flows from BEPLATE to the N-type semiconductor layer using only SMC. The set/reset operations can be executed using the current.

As described above, the memory cell can be selected and the read/set/reset operations can be executed, by the semiconductor storage device according to the third embodiment. In ARRAY of FIG. 35, a plurality of cells can be simultaneously selected and can be operated. In the read operation, VREAD is applied to a plurality of MLRs and a current is detected by Sense amp. connected to each MLR, so that a current flowing from each MLR to a memory cell formed between the conductive film layer 408$p$ and the N-type semiconductor layer (GL3) connected via selection STTrX can be detected independently. For the set/reset operations, the Y selection transistors STTrYs are turned on in a plurality of places, so that the set operation can be simultaneously executed on the plurality of memory cells or the reset operation can be simultaneously executed on the plurality of memory cells. The read operation in which an operation current is small can be executed in parallel by flowing the current using MLR separated in the Y direction, the set/reset operations in which the operation current is large can be executed by flowing the current using BEPLATE of a low resistance, and energy consumption due to a voltage drop by a parasitic resistance of an electrode can be suppressed.

A structure of a portion other than ARRAY set equally to the structure of the first embodiment illustrated in FIG. 19 is illustrated in the three-dimensional schematic diagram of FIG. 32. Other structures described in the first and second embodiments, that is, the structures of FIGS. 1, 9, 10, 12, and 14 are applicable to the semiconductor storage device according to the third embodiment. However, STTrY2 of FIGS. 16 and 22 and STTrX2 of FIG. 30 used to suppress the charge/discharge from TEPLATE in the second embodiment are not effective in the semiconductor storage device according to the third embodiment that does not include TEPLATE.

Figure 36:
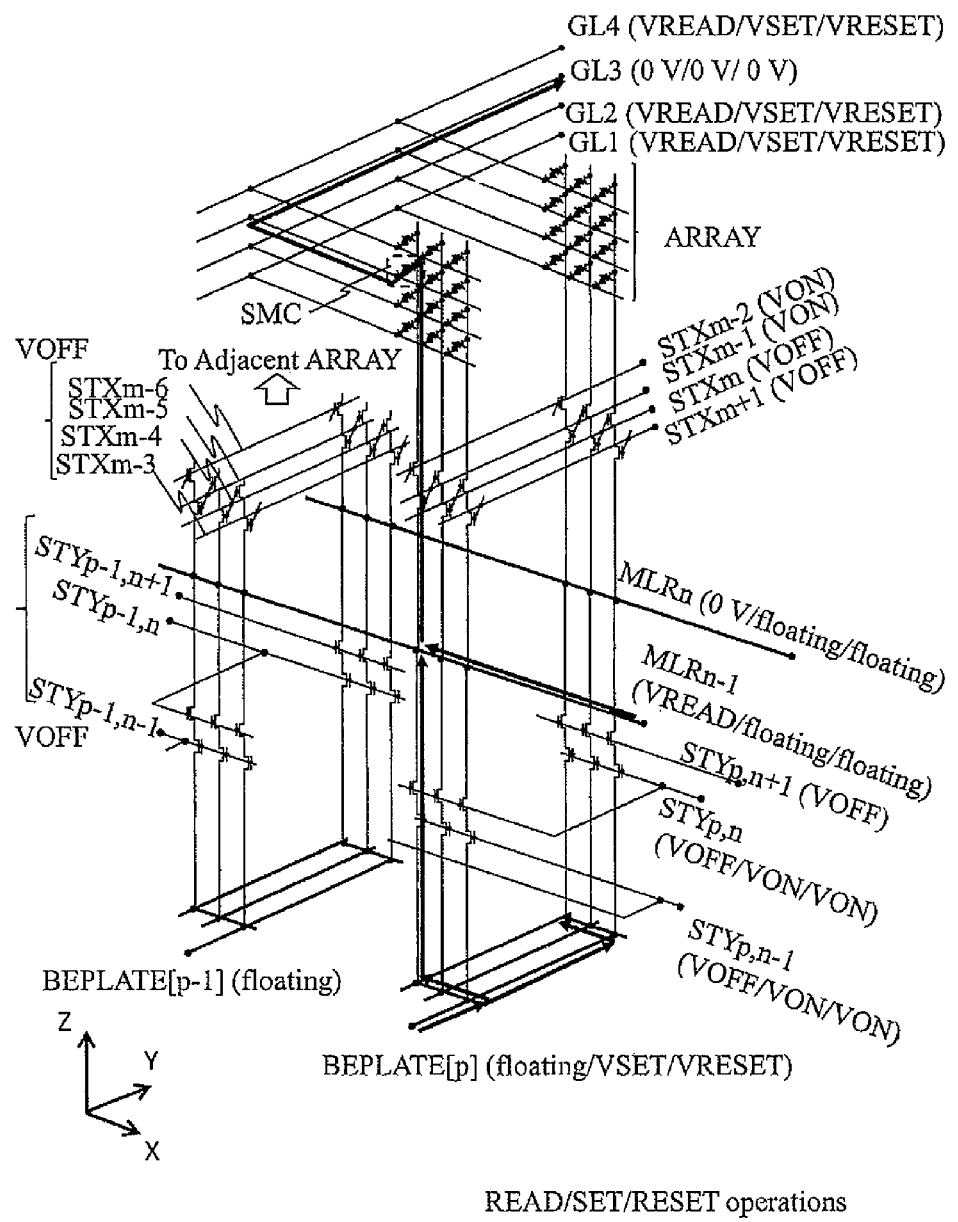
FIG. 36 is an equivalent circuit diagram illustrating the read/set/reset operations of the memory cell array according to the third embodiment of the present invention.

The read/set/reset operations when the structures of BEPLATE, STTrY, MLR, and STTrX of FIG. 1 are used in the semiconductor storage device according to the third embodiment are illustrated in FIG. 36. MLR is connected to adjacent BEPLATE[p−1, q] via STTrY and is connected to adjacent ARRAY via STTrX. An operation on BEPLATE[p, q] including a selection cell is the same as the operation of FIG. 35. However, STTrY and STTrX are turned off on BEPLATE[p−1, q], such that a current does not flow to unselection BEPLATE[p−1, q] and ARRAY thereon, and BEPLATE[p−1, q] enters a floating state.

When a collective erasure operation is executed by the semiconductor storage device according to the third embodiment, a large current needs to be flown, similar to the cases of the first and second embodiments. This will be described using FIG. 37. In the collective erasure operation, either the set operation or the reset operation can be allocated. To suppress the voltage drop in BEPLATE by the large current for the collective erasure, similar to the first embodiment, the same erasure voltage VERASE as BEPLATE[p] is applied to adjacent BEPLATE[p−1] in addition to BEPLATE[p] including selection ARRAY. STTrY on BEPLATE[p−1] is turned on, BEPLATE[p−1] and BEPLATE[p] are electrically connected via MLR, and a collective erasure current is supplied to SMC via a plurality of BEPLATEs, so that the voltage drop in BEPLATE can be suppressed. STTrX on BEPLATE[p−1] is turned off, so that a current does not flow to unselection ARRAY.

As described above, similar to the first embodiment, in the semiconductor storage device according to the third embodiment, the voltage drop by the electrode wiring line at the time of the reset operation in which the current is large is suppressed by using the plate-like electrode wiring line and the plate-like electrodes are connected via the transistors to suppress the voltage drop by the large current at the time of the collective set operation. As a result, performances of the reset operation and the set operation can be improved. Similar to the second embodiment, because consumption of energy by the charge/discharge of the parasitic capacitance at the time of the reset operation and the set operation can be suppressed, there is an effect in improving the performances of the reset operation and the set operation.

REFERENCE SIGNS LIST 1 semiconductor substrate
2, 3, 102 metal film layer
7 phase change material layer
8p, 50p, 51p, 52p, 252p channel semiconductor layer
9 gate insulating film
11, 12, 13, 14, 15 insulating film layer
21p, 22p, 23p, 24p gate polysilicon layer
25p, 40p, 41p, 42p, 140p, 141p N-type semiconductor layer
71, 72, 73, 74, 75 insulating film layer
91, 92 insulating film layer
209 gate insulating film
421p, 422p, 423p, 424p N-type semiconductor layer
411, 412, 413, 414, 415 insulating film layer
405p P-type semiconductor layer
407 resistance change material layer
408p conductive film layer
ARRAY memory array
BELC contact connecting BEPLATE and peripheral circuit
BEPLATE plate-like lower electrode
BEPLATE[p−1], BEPLATE[p] plate-like lower electrode
BEPLATE[p−1, q−1], BEPLATE[p, q−1], BEPLATE[p−1, q], BEPLATE[p, q] plate-like lower electrode
C(BEPLATE-SUB) capacitance between BEPLATE and semiconductor substrate
C(BEPLATE-STTGYL) capacitance between BEPLATE and STTGYL
C(BEPLATE-STTGY) capacitance between BEPLATE and STTGY
C(MLR-MLR) capacitance between adjacent MLRs
C(Gate1-CHAN) capacitance between Gate1 and channel semiconductor layer
C(Gate2-CHAN) capacitance between Gate2 and channel semiconductor layer
C(Gate3-CHAN) capacitance between Gate3 and channel semiconductor layer
C(Gate4-CHAN) capacitance between Gate4 and channel semiconductor layer
Decoder decoder
F minimum processing dimension
Gap separation unit
GATE1, GATE2, GATE3, GATE4 gate electrode of transistor
GL1, GL2, GL3, GL4 terminal to feed lamination electrode
GOX gate insulating film
GOX,X gate insulating film
ILD interlayer insulating film
MHOLE memory hole
MLR, MLRn−1, MLRn, MLRn+1 wiring line for read operation
MLRC contact to feed MLR
MLRL wring line to feed MLR
PCMCHAIN phase change memory chain
Power Source power source circuit
RBEPLATE resistance of lower electrode BEPLATE
REGION1 region
RPWL resistance of PWL
SELARRAY selection array
Sense amp sense amplifier
SMC selection memory cell
SPCMCHAIN selection phase change chain
STTGCON gate of transistor to connect BEPLATEs
STTGMLR gate of transistor to select read bit line
STTGMLRp−1(+X), STTGMLRp(−X) gate of transistor to select read bit line
STTGPWL gate of transistor to select BEPLATE connected to PWL
STTGX, STTGX2 gate of selection transistor to perform selection of X direction
STTGY, STTGY2 gate of selection transistor to perform selection of Y direction
STTGX2,1, STTGX2,2 gate of selection transistor to perform selection of X direction
STTGY2,1, STTGY2,2 gate of selection transistor to perform selection of Y direction
STTGXC contact for STTGX
STTGYC contact for STTGY
STTGXL wiring line for feeding for STTGX
STTGYL wiring line for feeding for STTGY
STTGXLC contact for STTGX
STTGYLC contact for STTGY
STTrCON transistor to connect BEPLATEs
STTrMLR transistor to select read bit line
STTrMLRp−1(+X), STTrMLRp(−X) transistor to select read bit line
STTrPWL transistor to select BEPLATE connected to PWL
STTrX, STTrX2 selection transistor to perform selection of X direction
STTrY, STTrY2 selection transistor to perform selection of Y direction
STXm−6, STXm−5, STXm−4, STXm−3, STXm−2, STXm−1, STXm, STXm+1 selection transistor gate
STYp−1,n−2, STYp−1,n−1, STYp−1,n, STYp−1,n+1 selection transistor gate
STYp,n−2, STYp,n−1, STYp,n, STYp,n+1 selection transistor gate
TELC contact to connect TEPLATE and peripheral circuit
TEPLATE plate-like upper electrode
UNSELARRAY unselection array USMC unselection memory cell
USPCMCHAIN unselection phase change chain
VREAD read voltage
VSET set voltage
VRESET reset voltage
VON on gate voltage of transistor
VOFF off gate voltage of transistor
VHON half-on gate voltage of transistor
X, Y, Z direction

The invention claimed is:

1. A semiconductor storage device that is formed on a substrate such that a current is applied to a recording material formed between a plurality of first electrodes to change a resistance value of the recording material and to store information, and such that currents of different magnitudes are applied in a high resistance change operation and a low resistance change operation,
   wherein the plurality of first electrodes correspond to a plurality of memory cells that are electrically connected to a plurality of second electrodes, each of the second electrodes being connected to a feeding terminal of a power source circuit, and the second electrodes being connected with each other via electrode connection transistors, and
   wherein the plurality of second electrodes are connected to each other through one or more transistors.

2. The semiconductor storage device according to claim 1, wherein
   at the time of the resistance change operation in which the operation is executed with a first predetermined current in the resistance change operations, the electrode connection transistors are turned off, a voltage is applied from the feeding terminal to a part of the plurality of second electrodes connected via the electrode connection transistors, a current is applied to the memory cells via the second electrodes, and the resistance change operation is executed, and
   at the time of the resistance change operation in which a second predetermined current is necessary in the resistance change operations, the electrode connection transistors are turned on, the plurality of second electrodes are electrically connected by the electrode connection transistors, a voltage is applied from the feeding terminal to each of the second electrodes connected via the electrode connection transistors, a current is applied to the memory cells connected to at least some of the second electrodes of the plurality of second electrodes connected via the electrode connection transistors, and the resistance change operation is executed.

3. The semiconductor storage device according to claim 2, wherein
   The resistance change operation in which the second predetermined current is necessary in the resistance change operations is the first resistance change operation by a collective operation of the plurality of memory cells or the second resistance change operation by the collective operation of the plurality of memory cells.

4. The semiconductor storage device according to claim 1, wherein
   the semiconductor storage device includes first electrode wiring lines which are connected to the memory cells, arranged in a first direction among the plurality of memory cells, via first selection transistors having first selection gates extending in a second direction orthogonal to the first direction, are connected to the second electrodes via second selection transistors having second selection gates extending in the first direction, extend in the first direction on the second electrodes with the second selection transistors therebetween, and are connected to a plurality of feeding terminals arranged in the second direction.

5. The semiconductor storage device according to claim 4, wherein
   the first electrode wiring lines extending in the first direction extend over the plurality of second electrodes arranged in the first direction and separated from each other and the second electrodes are connected via the second selection transistors and the first electrode wiring lines.

6. The semiconductor storage device according to claim 4, wherein
   the first electrode wiring lines extending in the first direction are cut in spaces between the plurality of second electrodes arranged in the first direction and separated from each other and the first electrode wiring lines on the second electrodes adjacent in the first direction are connected via first electrode wiring line selection transistors formed in the spaces between the second electrodes.

7. The semiconductor storage device according to claim 4, wherein
   the first electrode wiring lines extending in the first direction are cut in spaces between the plurality of second electrodes arranged in the first direction and separated from each other and are connected to second electrode wiring lines via first electrode wiring line selection transistors formed in the spaces between the second electrodes.

8. The semiconductor storage device according to claim 1, wherein
   each of the memory cells includes a cell transistor and a resistance change material connected in parallel and the plurality of memory cells are connected in series, are connected to the second electrodes in one end, and are connected to source electrodes in the other ends.

9. The semiconductor storage device according to claim 1, wherein
   each of the memory cells includes a diode and a resistance change material connected in series and the plurality of memory cells are connected in parallel, are connected to the second electrodes in one end, and are connected to separate electrodes in the other ends.

10. The semiconductor storage device according to claim 1, wherein
    the plurality of second electrodes are connected to the power source via second electrode selection transistors and are connected to power source wiring lines formed on the plurality of memory cells, the power source wiring lines and the second electrodes are electrically connected by turning on the second electrode selection transistors, and the power source wiring lines and the second electrodes are electrically insulated by turning off the large electrode selection transistors.

11. The semiconductor storage device according to claim 10, wherein
    the second electrode selection transistors are formed on the second electrodes.

12. The semiconductor storage device according to claim 10, wherein
    each of the memory cells includes a cell transistor and a resistance change material connected in parallel and the plurality of memory cells are connected in series, are connected to the second electrodes in one end, and are connected to source electrodes in the other ends.

13. The semiconductor storage device according to claim 10, wherein each of the memory cells includes a diode and a resistance change material connected in series and the plurality of memory cells are connected in parallel, are connected to the second electrodes in one end, and are connected to separate electrodes in the other ends.

14. A semiconductor storage device that is formed on a substrate such that a current is applied to a recording material formed between a plurality of first electrodes to change a resistance value of the recording material and to store information, wherein the plurality of first electrodes correspond to a plurality of memory cells that have a plurality of first electrode wiring lines connected to the memory cells arranged in a first direction among the plurality of memory cells via first selection transistors having first selection gates extending in a second direction orthogonal to the first direction, and third selection transistors having third selection gates extending in the first direction and second electrodes connected to the plurality of first electrode wiring lines via second selection transistors having the second selection gates extending in the first direction, and wherein the plurality of second electrodes are connected to each other through one or more transistors.

15. A semiconductor storage device that is formed on a substrate such that a current is applied to a recording material formed between a plurality of first electrodes to change a resistance value of the recording material and to store information, and such that currents of different magnitudes are applied in a high resistance change operation and a low resistance change operation, wherein the plurality of first electrodes correspond to a plurality of memory cells that are electrically connected to form second electrodes, each of the memory cells includes a cell transistor and a resistance change material connected in parallel and the plurality of memory cells are connected in series in a direction vertical to the substrate, are connected to the second electrodes directly or via lower portion selection transistors in a lower end, and are connected to source electrodes directly or via upper portion selection transistors in an upper end, and channel semiconductor layers of the upper portion selection transistors are formed on the same layers as channel semiconductor layers of the cell transistors and the channel semiconductor layers of the upper portion selection transistors extend over the plurality of memory cells in an extension direction of gates of the upper portion selection transistors, and wherein the plurality of second electrodes are connected to each other through one or more transistors.

* * * * *